(12) United States Patent
Aoki et al.

(10) Patent No.: US 9,848,149 B2
(45) Date of Patent: Dec. 19, 2017

(54) METHOD FOR DRIVING PHOTOSENSOR, METHOD FOR DRIVING SEMICONDUCTOR DEVICE, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Takeshi Aoki, Atsugi (JP); Hikaru Tamura, Zama (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 117 days.

(21) Appl. No.: 14/712,270

(22) Filed: May 14, 2015

(65) Prior Publication Data

US 2015/0249800 A1 Sep. 3, 2015

Related U.S. Application Data

(63) Continuation of application No. 13/296,481, filed on Nov. 15, 2011, now Pat. No. 9,103,724.

(30) Foreign Application Priority Data

Nov. 30, 2010 (JP) .................. 2010-267422
May 13, 2011 (JP) .................. 2011-108164

(51) Int. Cl.
*H01L 27/00* (2006.01)
*H04N 5/374* (2011.01)
(Continued)

(52) U.S. Cl.
CPC .............. *H04N 5/3741* (2013.01); *G01J 1/44* (2013.01); *H01L 27/14612* (2013.01); *H01L 27/14643* (2013.01); *H01L 31/02019* (2013.01)

(58) Field of Classification Search
CPC .................. H01L 27/14612; H04N 5/3741
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1608023 A 12/2005
EP 1737044 A 12/2006
(Continued)

OTHER PUBLICATIONS

Taiwanese Office Action (Application No. 100142350) Dated Mar. 2, 2016.
(Continued)

*Primary Examiner* — Thanh Luu
(74) *Attorney, Agent, or Firm* — Eric J. Robinson; Robinson Intellectual Property Law Office, P.C.

(57) ABSTRACT

This invention has for purpose to provide a photosensor that is small in size and can obtain high-contrast image data and to provide a semiconductor device including the photosensor. In the photosensor including a light-receiving element, a transistor serving as a switching element, and a charge retention node electrically connected to the light-receiving element through the transistor, the reduction in charge held in the charge retention node is suppressed by extending the fall time of the input waveform of a driving pulse supplied to the transistor to turn off the transistor.

17 Claims, 32 Drawing Sheets

(51) Int. Cl.
*G01J 1/44* (2006.01)
*H01L 27/146* (2006.01)
*H01L 31/02* (2006.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,747,638 B2 | 6/2004 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,473,977 B2 | 1/2009 | Kitano et al. |
| 7,501,293 B2 | 3/2009 | Ito et al. |
| 7,525,523 B2 | 4/2009 | Yamazaki et al. |
| 7,554,074 B2 | 6/2009 | Mheen et al. |
| 7,663,165 B2 | 2/2010 | Mouli |
| 7,674,650 B2 | 3/2010 | Akimoto et al. |
| 7,732,819 B2 | 6/2010 | Akimoto et al. |
| 7,791,118 B2 | 9/2010 | Kitano et al. |
| 7,821,093 B2 | 10/2010 | Kitano et al. |
| 7,851,798 B2 | 12/2010 | Ladd |
| 7,872,674 B2 | 1/2011 | Futamura |
| 7,928,487 B2 | 4/2011 | Kitano et al. |
| 7,935,563 B2 | 5/2011 | Kitano et al. |
| 8,017,984 B2 | 9/2011 | Kitano et al. |
| 8,021,908 B2 | 9/2011 | Ladd |
| 8,278,131 B2 | 10/2012 | Ladd |
| 8,378,391 B2 | 2/2013 | Koyama et al. |
| 8,570,412 B2 | 10/2013 | Yanagita et al. |
| 8,598,640 B2 | 12/2013 | Kitano et al. |
| 8,916,869 B2 | 12/2014 | Koyama et al. |
| 9,247,172 B2 | 1/2016 | Yanagita et al. |
| 2001/0046027 A1 | 11/2001 | Tai et al. |
| 2002/0054390 A1* | 5/2002 | Koizumi .................. H04N 1/40 358/513 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0042707 A1 | 3/2004 | Imai et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0186504 A1 | 8/2006 | Bae et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0295769 A1 | 12/2009 | Yamazaki et al. |
| 2009/0322922 A1 | 12/2009 | Saito et al. |
| 2010/0059296 A9 | 3/2010 | Abileah et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134735 A1 | 6/2010 | Nakamura et al. |
| 2010/0182282 A1 | 7/2010 | Kurokawa et al. |
| 2011/0108836 A1 | 5/2011 | Koyama et al. |
| 2011/0114943 A1 | 5/2011 | Yamazaki et al. |
| 2011/0204371 A1 | 8/2011 | Kozuma et al. |
| 2011/0221723 A1 | 9/2011 | Kurokawa et al. |
| 2015/0048366 A1 | 2/2015 | Koyama et al. |

FOREIGN PATENT DOCUMENTS

| | | |
|---|---|---|
| EP | 2141908 A | 1/2010 |
| EP | 2180514 A | 4/2010 |
| EP | 2226847 A | 9/2010 |
| EP | 2393117 A | 12/2011 |
| EP | 2595191 A | 5/2013 |
| JP | 60-198861 A | 10/1985 |
| JP | 61-148693 A | 7/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |

(56) References Cited

FOREIGN PATENT DOCUMENTS

| JP | 2000-044236 A | 2/2000 |
|---|---|---|
| JP | 2000-150900 A | 5/2000 |
| JP | 2000-232348 A | 8/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-237596 A | 9/2006 |
| JP | 2007-052291 A | 3/2007 |
| JP | 2008-104186 A | 5/2008 |
| JP | 2009-105381 A | 5/2009 |
| JP | 2009-141717 A | 6/2009 |
| JP | 2009-535819 | 10/2009 |
| JP | 2010-011426 A | 1/2010 |
| JP | 2010-153834 A | 7/2010 |
| JP | 2011-119711 A | 6/2011 |
| TW | I241711 | 10/2005 |
| TW | 200644622 | 12/2006 |
| TW | 200802837 | 1/2008 |
| TW | 201030951 | 8/2010 |
| WO | WO-2004/114391 | 12/2004 |
| WO | WO-2006/119333 | 11/2006 |
| WO | WO-2008/027392 | 3/2008 |
| WO | WO-2011/055626 | 5/2011 |

OTHER PUBLICATIONS

International Search Report (Application No. PCT/JP2011/077107) Dated Jan. 24, 2012.

Written Opinion (Application No. PCT/JP2011/077107) Dated Jan. 24, 2012.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., Thin-Film Transistor Fabricated in Single-Crystalline Transparent Oxide Semiconductor, Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H at al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H at al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or AL; B: Mg, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

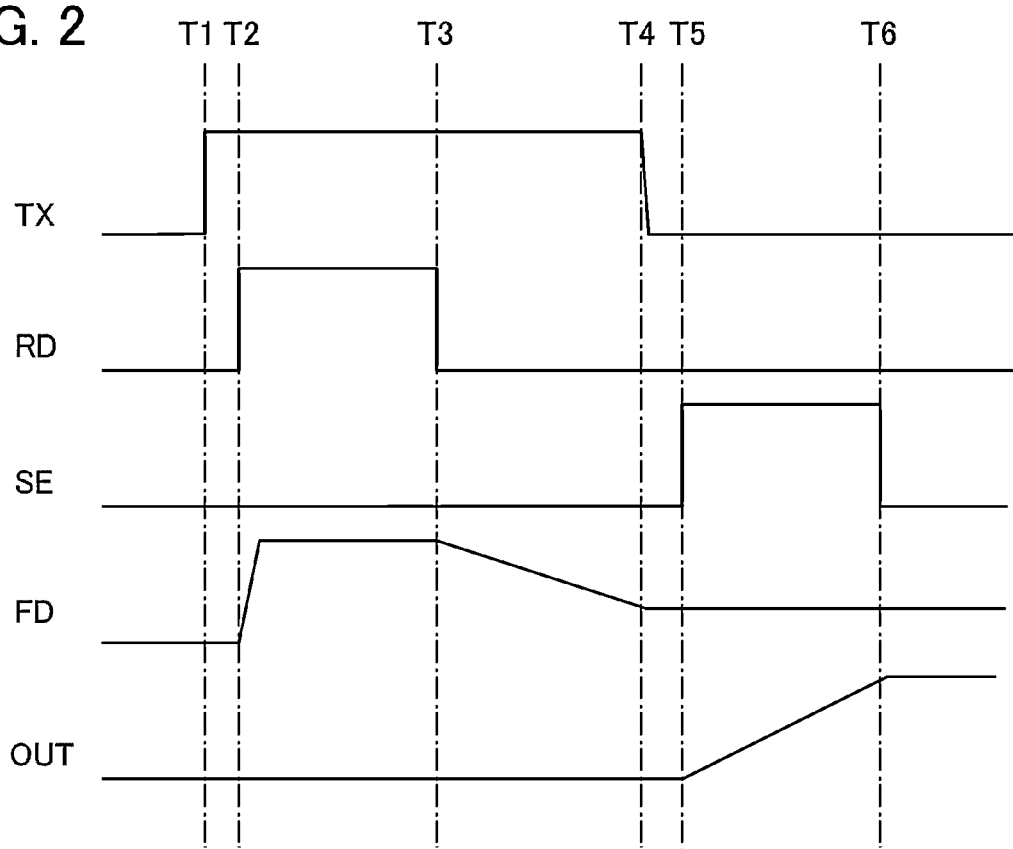

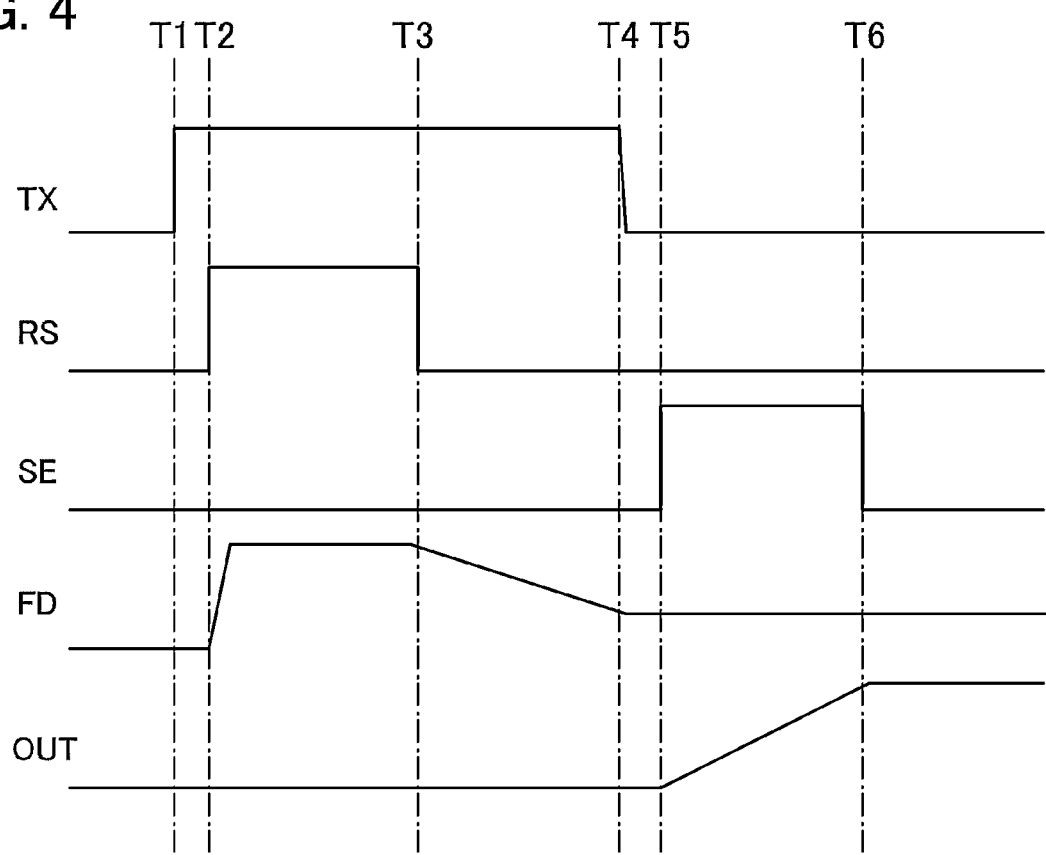

FIG. 17A    FIG. 17B
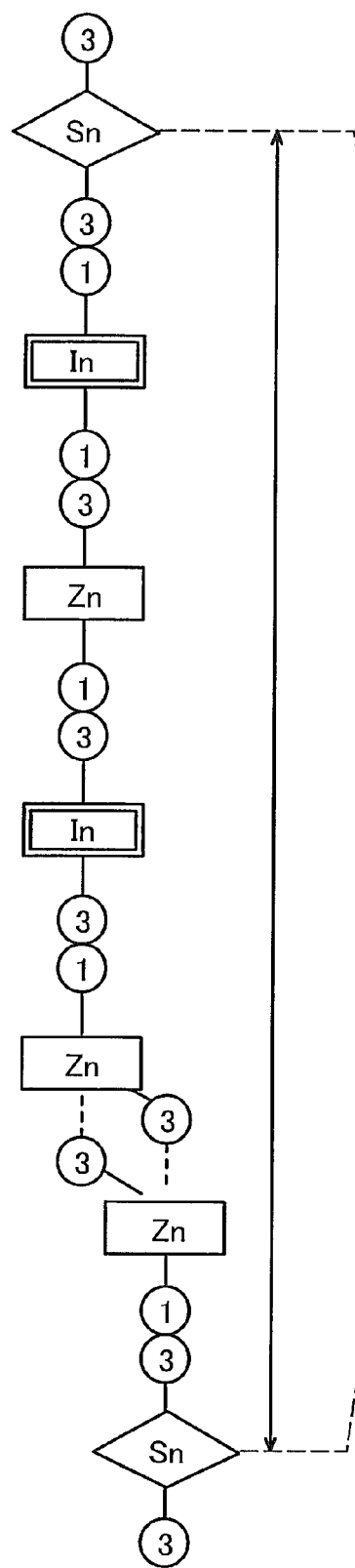
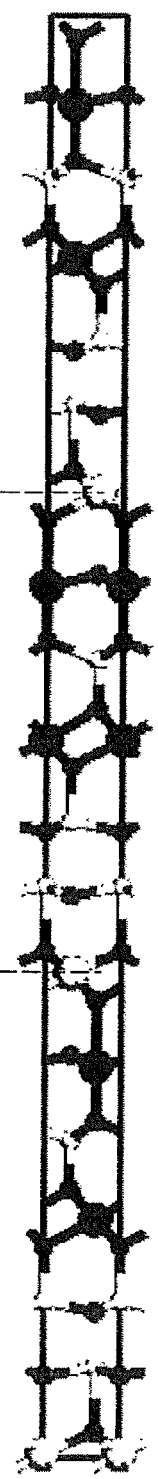
FIG. 17C
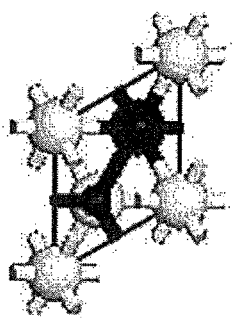
● In
☾ Sn
☽ Zn
● O

- In
- Ga
- Zn
- O

METHOD FOR DRIVING PHOTOSENSOR, METHOD FOR DRIVING SEMICONDUCTOR DEVICE, SEMICONDUCTOR DEVICE, AND ELECTRONIC DEVICE

TECHNICAL FIELD

The present invention relates to a method for driving a photosensor. Further, the present invention relates to a semiconductor device and a method for driving the semiconductor device.

BACKGROUND ART

Digital cameras and mobile phones that include solid-state imaging elements and thus have an imaging function have high added value. The reduction in size and power consumption as well as the increase in definition has been required for solid-state imaging elements in recent years. Photosensors are used as solid-state imaging elements.

A photosensor using an amplification function of a MOS transistor, called a complementary metal oxide semiconductor (CMOS) sensor, can be fabricated through a general CMOS process. Thus, fabrication costs of a solid-state imaging device including a CMOS sensor in each pixel can be low, and a semiconductor display device including a CMOS sensor and a display element formed over one substrate can be provided. Further, the drive voltage of a CMOS sensor is lower than that of a charge coupled device (CCD) sensor, so that power consumption of the solid-state imaging device can be kept low.

Patent Document 1 discloses an imaging device including a CMOS sensor.

REFERENCE

Patent Document 1: Japanese Published Patent Application No. 2009-141717

DISCLOSURE OF INVENTION

Development of a photosensor that is small in size and can obtain high-contrast image data with less noise than output signals has been desired.

In view of the foregoing problem, an object of one embodiment of the present invention is to provide a method for driving a photosensor that is small in size and can obtain high-contrast image data. Another object of one embodiment of the present invention is to provide a semiconductor device that includes the photosensor, is small in size, and can obtain high-contrast image data.

A photosensor includes at least a light-receiving element, a transistor which is a switching element, and a charge retention node that is electrically connected to the light-receiving element through the transistor. The light-receiving element generates a current corresponding to the amount of received light. The transistor controls switching between accumulation and retention of charge in the charge retention node. The charge retention node holds charge that varies in accordance with the amount of light received by the light-receiving element.

An example of the operation of a photosensor will be described with reference to FIGS. 1A and 1B. FIG. 1A illustrates an example of the circuit configuration of a photosensor 100.

A photodiode 101 which is a light-receiving element generates a current corresponding to the amount of light entering the i-layer. A charge retention node FD holds charge that varies depending on the amount of light received by the photodiode 101. A transistor 102 which is an amplifier element converts a voltage of the charge retention node FD into a current between a wiring OUT and a wiring VR in accordance with the potential of the charge retention node FD. A transistor 103 which is a switching element controls accumulation of charge in the charge retention node FD by the photodiode 101. A transistor 105 controls an output of the photosensor 100.

Note that FIG. 1A shows the case where the photodiode 101 is a PIN junction photodiode. There is no limitation on the photodiode used in one embodiment of the present invention, and a PN junction photodiode or the like can be used.

In FIG. 1A, a wiring TX is a signal line for controlling the transistor 103. A wiring SE is a signal line for controlling the transistor 105. A wiring RD is a signal line for controlling initialization of the potential of the charge retention node FD. The wiring OUT is an output wiring for outputting a signal corresponding to charge accumulation in the photodiode 101. The wiring VR is a power supply wiring.

Specifically, in the photosensor 100, a first terminal of the transistor 103 is connected to the cathode of the photodiode 101, and a second terminal of the transistor 103 is connected to a gate electrode of the transistor 102. A first terminal of the transistor 102 is connected to the wiring VR supplied with a high-level power supply potential VDD. A second terminal of the transistor 102 is connected to a first terminal of the transistor 105. A second terminal of the transistor 105 is connected to the wiring OUT. A gate electrode of the transistor 105 is connected to the wiring SE, and the wiring SE is supplied with the potential of a signal for controlling the switching of the transistor 105.

The "source electrode" and "drain electrode" of a transistor interchange with each other depending on the polarity of the transistor or the levels of potentials applied to the electrodes. In general, in an n-channel transistor, an electrode supplied with a lower potential is called a source electrode, and an electrode supplied with a higher potential is called a drain electrode. Further, in a p-channel transistor, an electrode supplied with a lower potential is called a drain electrode, and an electrode supplied with a higher potential is called a source electrode. In this specification, one of a source electrode and a drain electrode is referred to as a first terminal and the other is referred to as a second terminal to describe a connection relation between a photodiode and a transistor included in a photosensor.

In FIG. 1A, a node where the second terminal of the transistor 103 and the gate electrode of the transistor 102 are connected to each other is represented as the charge retention node FD. The potential of the output signal is determined by the amount of charge accumulated in the charge retention node FD. In order to hold charge in the charge retention node FD more reliably, a storage capacitor may be connected to the charge retention node FD.

Note that the configuration of a photosensor to which one embodiment of the present invention can be applied is not limited to the above configuration.

FIG. 1B illustrates an example of a timing chart of a variety of potentials applied to the wirings in the photosensor 100 illustrated in FIG. 1A.

Note that in the timing chart in FIG. 1B, for easy understanding of the operation of the photosensor 100, it is assumed that the wiring TX, the wiring SE, and the wiring RD are supplied with a high-level potential and a low-level potential. Specifically, it is assumed that the wiring TX is supplied with a high-level potential HTX and a low-level potential LTX; the wiring SE, a high-level potential HSE and a low-level potential LSE; and the wiring RD, a high-level potential HRD and a low-level potential LRD.

First, at a time T1, the potential of the wiring TX is switched from the potential LTX to the potential HTX. When the potential of the wiring TX changes to the potential HTX, the transistor 103 is turned on. Note that at the time T1, the wiring SE is supplied with the potential LSE, and the wiring RD is supplied with the potential LRD.

Next, at a time T2, the potential of the wiring RD is switched from the potential LRD to the potential HRD. At the time T2, the potential of the wiring TX is kept at the potential HTX, and the potential of the wiring SE is kept at the potential LSE. Accordingly, the potential HRD of the wiring RD is supplied to the charge retention node FD, so that the amount of charge held in the charge retention node FD is reset and charge for setting the charge retention node FD to an initial state is held.

Then, at a time T3, the potential of the wiring RD is switched from the potential HRD to the potential LRD. The potential of the charge retention node FD is kept at the potential HRD until shortly before the time T3. Thus, when the potential of the wiring RD changes to the potential LRD, a reverse bias voltage is applied to the photodiode 101. Then, when light enters the photodiode 101 while a reverse bias voltage is applied to the photodiode 101, a current flows from the cathode toward the anode of the photodiode 101. The value of the current varies according to the intensity of light. In other words, as the intensity of light entering the photodiode 101 is higher, the value of the current is higher and the amount of charge leaking from the charge retention node FD is larger. On the other hand, as the intensity of light entering the photodiode 101 is lower, the value of the current is lower and the amount of charge leaking from the charge retention node FD is smaller. Consequently, the higher the intensity of light becomes, the larger the amount of change in the potential of the charge retention node FD becomes; the lower the intensity of light becomes, the smaller the amount of change becomes.

Then, at a time T4, when the potential of the wiring TX is switched from the potential HTX to the potential LTX, the transistor 103 is turned off. Accordingly, the movement of charge from the charge retention node FD to the photodiode 101 is stopped, so that the potential of the charge retention node FD is determined.

Next, at a time T5, when the potential of the wiring SE is switched from the potential LSE to the potential HSE, the transistor 105 is turned on. Thus, a signal is output from the wiring VR to the wiring OUT in accordance with the potential of the charge retention node FD.

Next, at a time T6, when the potential of the wiring SE is switched from the potential HSE to the potential LSE, the movement of charge from the wiring VR to the wiring OUT is stopped and the potential of the wiring OUT is determined. The potential of the wiring OUT corresponds to the potential of the output signal of the photosensor 100.

The above-described series of operations can be classified into a reset operation, an accumulation operation, and a read operation. In other words, the operation from the time T2 to the time T3 corresponds to the reset operation; the operation from the time T3 to the time T4, the accumulation operation; and the operation from the time T5 to the time T6, the read operation. Image data can be obtained by performing the reset operation, the accumulation operation, and the read operation.

However, image data obtained through the above series of operations have a problem of low contrast.

In view of the above, the present inventors focused attention on parasitic capacitance generated between the gate and drain and the gate and source of the transistor 103.

When the gate potential of the transistor 103 with parasitic capacitance suddenly changes from a high potential to a low potential, the potential of the charge retention node FD is decreased (clock feedthrough occurs) at the time T4 at which the accumulation operation ends.

Therefore, in FIG. 1B, the potential of the charge retention node FD is decreased from a potential shown by a dotted line to a potential shown by a solid line, and the potential of the wiring OUT is decreased from a potential shown by a dotted line to a potential shown by a solid line.

The potential of the charge retention node FD is decreased by clock feedthrough; therefore, the potential of the charge retention node FD is decreased even when the intensity of light entering the photodiode 101 is not high. Consequently, the range of light intensity corresponding to change in the potential of the wiring OUT (the potential of the output signal of the photosensor 100) is narrowed, and the image contrast of obtained image data is lowered.

The foregoing problem is caused by the fact that the potential of the wiring TX suddenly changes from the potential HTX to the potential LTX at the time T4 among the series of operations. For that reason, the fall of the pulse signal of the wiring TX needs to be made gentle, thereby suppressing change in the potential of the charge retention node FD (clock feedthrough) due to parasitic capacitance of the transistor 103. Thus, high-contrast image data can be obtained. However, if the fall of the pulse signal of the wiring TX is too gentle, clock feedthrough occurs.

In view of the above, one embodiment of the present invention is a method for driving a photosensor including a light-receiving element, a transistor serving as a switching element, and a charge retention node electrically connected to the light-receiving element through the transistor. The reduction in charge held in the charge retention node is suppressed by extending the fall time of the input waveform of a driving pulse that is supplied to the transistor to turn off the transistor.

In the method for driving a photosensor according to one embodiment of the present invention, a channel formation region of the transistor, which is a switching element, preferably contains an oxide semiconductor. The transistor in which an oxide semiconductor is used for the channel formation region has an extremely low off-state current and high withstand voltage. Therefore, the use of the transistor as a switching element can prevent leakage of charge accumulated during a charge retention period.

One embodiment of the present invention is a method for driving a semiconductor device that includes a photosensor including a light-receiving element, a transistor serving as a switching element, and a charge retention node electrically connected to the light-receiving element through the transistor; and a capacitor electrically connected to a signal line configured to control the transistor. The reduction in charge held in the charge retention node is suppressed by extending, by the capacitor, the fall time of the input waveform of a driving pulse supplied to the transistor to turn off the transistor.

In the method for driving a semiconductor device according to one embodiment of the present invention, a channel formation region of the transistor, which is a switching element, preferably contains an oxide semiconductor.

Another embodiment of the present invention is a semiconductor device that includes a photosensor including a light-receiving element, a transistor, and a charge retention node electrically connected to the light-receiving element through the transistor; and a capacitor electrically connected to a signal line configured to control the transistor. The reduction in charge held in the charge retention node is suppressed by extending, by the capacitor, the fall time of the input waveform of a driving pulse supplied to the transistor to turn off the transistor.

In the semiconductor device according to one embodiment of the present invention, a channel formation region of the transistor preferably contains an oxide semiconductor. In the semiconductor device, the transistor functions as a switching element. The transistor in which an oxide semiconductor is used for the channel formation region has an extremely low off-state current and high withstand voltage. Therefore, the use of the transistor as a switching element can prevent leakage of charge accumulated during a charge retention period.

One embodiment of the present invention is an electronic device including the semiconductor device.

Note that in this specification, the term "connection" means electrical connection and corresponds to a state in which current, voltage, or a potential can be supplied or transmitted. Therefore, a state of connection means not only a state of direct connection but also a state of indirect connection through a circuit element such as a wiring, a resistor, a diode, or a transistor, in which current, voltage, or a potential can be supplied or transmitted.

In addition, even when different components are connected to each other in a circuit diagram, there is actually a case where one conductive film has functions of a plurality of components, such as a case where part of a wiring serves as an electrode. The term "connection" in this specification also includes in its category such a case where one conductive film has functions of a plurality of components.

According to one embodiment of the present invention, it is possible to provide a method for driving a photosensor that is small in size and can obtain high-contrast image data. Moreover, according to one embodiment of the present invention, it is possible to provide a semiconductor device that includes the photosensor, is small in size, and can obtain high-contrast image data.

BRIEF DESCRIPTION OF DRAWINGS

In the accompanying drawings:

FIG. 2 is a timing chart of a photosensor;

FIG. 4 is a timing chart of a photosensor;

FIGS. 17A to 17C illustrate a crystal structure of an oxide material;

BEST MODE FOR CARRYING OUT THE INVENTION

Embodiments of the present invention will be hereinafter described in detail with reference to the accompanying drawings. Note that the present invention is not limited to the following description and it is easily understood by those skilled in the art that the mode and details can be variously changed without departing from the spirit and scope of the present invention. Therefore, the present invention should not be construed as being limited to the description of the embodiments below.

Embodiment 1

Figure 1A:
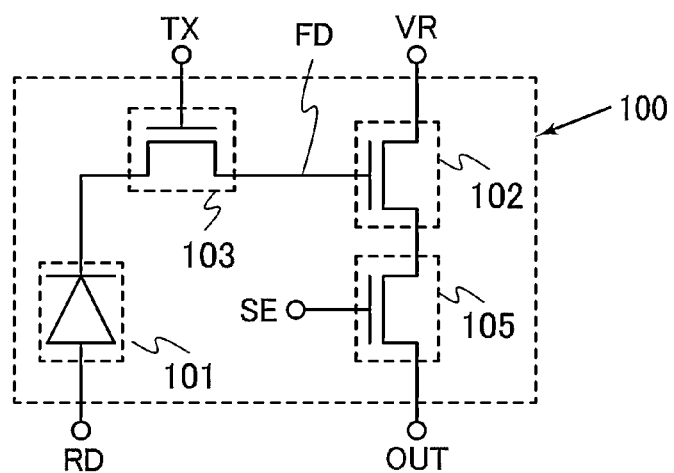
FIGS. 1A and 1B are an example of a circuit diagram and a timing chart of a photosensor.
Figure 3A:
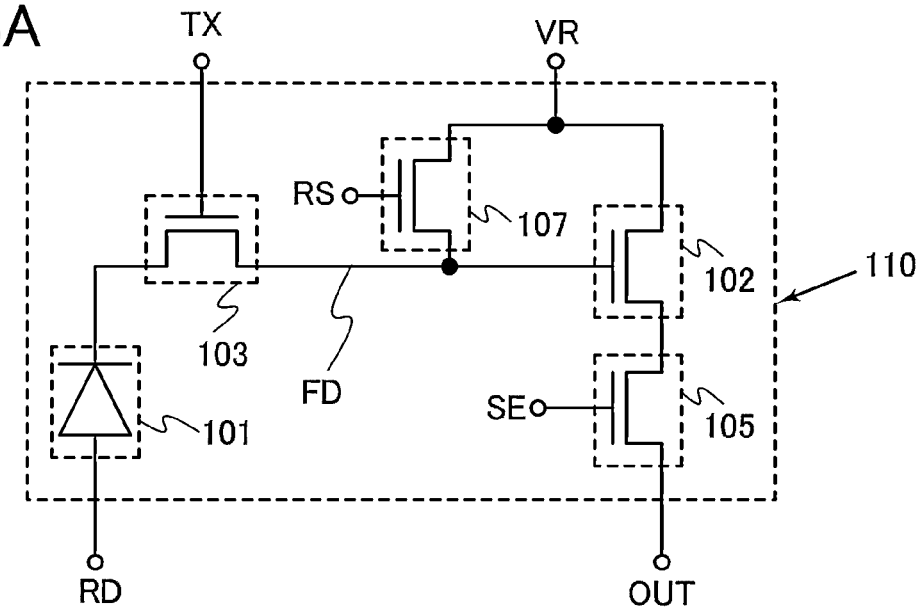
FIGS. 3A and 3B are each an example of a circuit diagram of a photosensor.
Figure 3B:
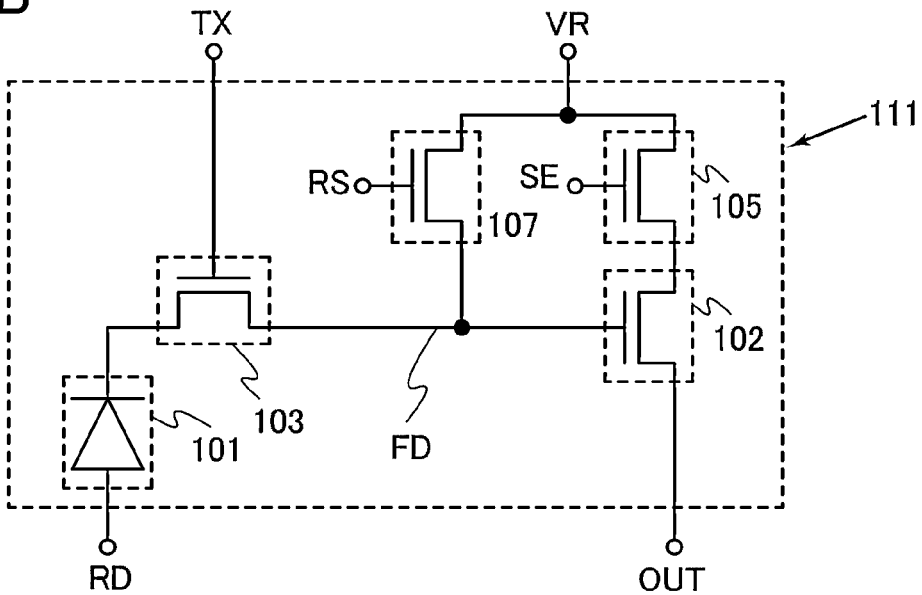

In this embodiment, a method for driving a photosensor according to one embodiment of the present invention will be described. FIG. 1A and FIGS. 3A and 3B illustrate circuit configurations of photosensors used in this embodiment. FIG. 2 and FIG. 4 illustrate examples of timing charts of various potentials applied to the photosensors illustrated in FIG. 1A and FIGS. 3A and 3B.

A photosensor to which the method for driving a photosensor according to one embodiment of the present invention can be applied includes at least a light-receiving element, a transistor which is a switching element, and a charge retention node that is electrically connected to the light-receiving element through the transistor. The light-receiving element generates a current corresponding to the amount of received light. The transistor controls switching between accumulation and retention of charge in the charge retention node. The charge retention node holds charge that varies in accordance with the amount of light received by the light-receiving element.

An example of a photosensor to which the method for driving a photosensor according to one embodiment of the present invention can be applied is the photosensor 100 illustrated in FIG. 1A. The configuration and the driving method of the photosensor 100 are as described above, and the timing chart in FIG. 2 can be applied.

Note that in the timing chart in FIG. 2, for easy understanding of the operation of the photosensor 100, it is assumed that the wiring TX, the wiring SE, and the wiring RD are supplied with a high-level potential and a low-level potential. Specifically, it is assumed that the wiring TX is supplied with the high-level potential HTX and the low-level potential LTX; the wiring SE, the high-level potential HSE and the low-level potential LSE; and the wiring RD, the high-level potential HRD and the low-level potential LRD.

When the gate potential of the transistor 103 with parasitic capacitance suddenly changes from a high potential to a low potential in the photosensor 100, clock feedthrough occurs. Specifically, the potential of the charge retention node FD is decreased at the time T4 at which the accumulation operation ends.

Figure 1B:
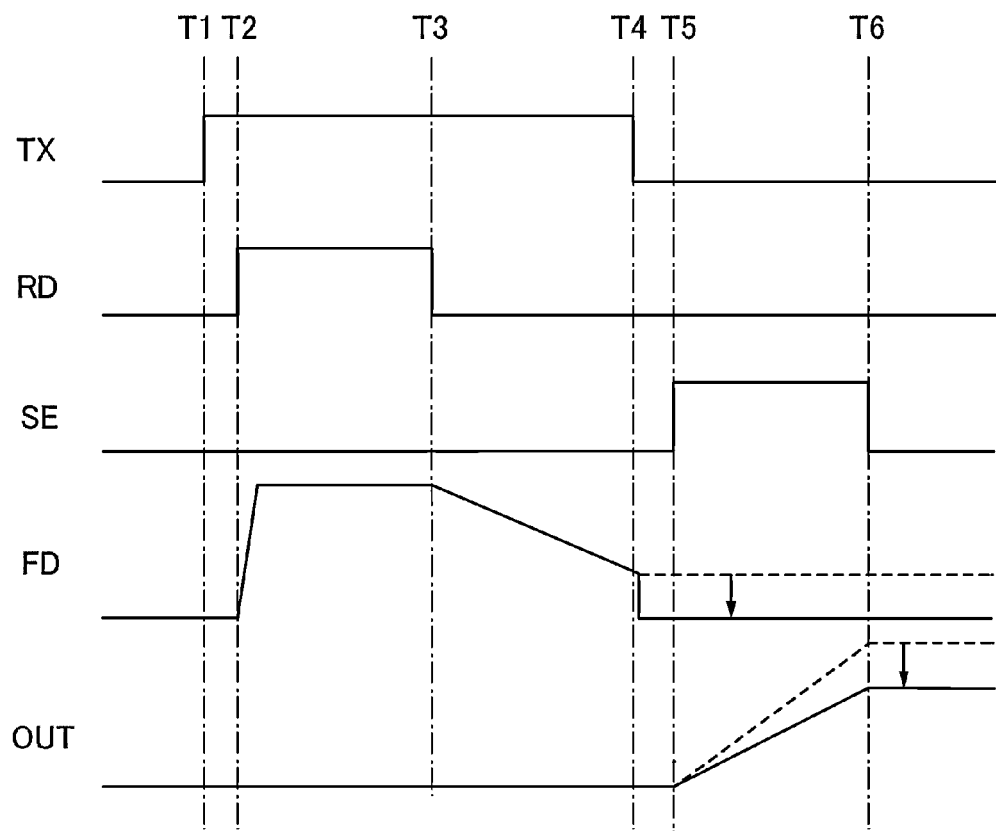

The timing chart in such a case is shown in FIG. 1B. In FIG. 1B, the potential of the charge retention node FD is decreased from the potential shown by the dotted line to the potential shown by the solid line, and the potential of the wiring OUT is decreased from the potential shown by the dotted line to the potential shown by the solid line. In such a manner, the image contrast of obtained image data is lowered when clock feedthrough occurs.

One of methods for suppressing clock feedthrough is increasing capacitance by an increase in size of the transistor 102. With this method, the size of the photosensor itself is also increased, which means the reduction in size of the photosensor is difficult to achieve and thus it is not preferable to employ this method.

In view of the above, in the method for driving a photosensor according to one embodiment of the present invention, the fall of the pulse signal of the wiring TX at the time T4 in the timing chart is made gentle as illustrated in FIG. 2. The fall of the pulse signal can be made gentler than conventional one by extending the fall time of the input waveform of the wiring TX. Thus, change in the potential of the charge retention node FD (clock feedthrough) due to parasitic capacitance of the transistor 103 can be suppressed. Consequently, high-contrast image data can be obtained. Moreover, the reduction in size of the photosensor can be achieved.

However, if the fall of the pulse signal of the wiring TX is too gentle, clock feedthrough occurs. The maximum length of the fall time varies depending on the configuration of the circuit and the like; therefore, the fall time can be determined as appropriate in consideration of such features. For example, the fall time of the input waveform of a driving pulse supplied to the transistor 103, which is described later in Example 1, is set longer than 0 seconds and shorter than 200 nanoseconds.

In addition, by providing a capacitor electrically connected to the wiring TX in a semiconductor device including the photosensor in this embodiment, the fall time of the input waveform of a driving pulse supplied to the transistor 103 can be extended and the reduction in charge held in the charge retention node FD can be suppressed. For example, the capacitor may have a capacitance of several microfarads (g). The upper limit of the capacitance varies depending on the configuration of the circuit and the like; therefore, the capacitance is determined as appropriate in consideration of such features.

Note that FIG. 1A illustrates the configuration of the photosensor that includes only one transistor 103 functioning as a switching element; however, the present invention is not limited to this configuration. Although the configuration in which one transistor functions as one switching element is described in one embodiment of the present invention, a plurality of transistors may function as one switching element. In the case where a plurality of transistors function as one switching element, the plurality of transistors may be connected to each other in parallel, in series, or in combination of parallel connection and series connection.

In this specification, the state where transistors are connected to each other in series means, for example, a state where only one of a first terminal and a second terminal of a first transistor is connected to only one of a first terminal and a second terminal of a second transistor. Further, the state in which transistors are connected to each other in parallel means a state in which the first terminal of the first transistor is connected to the first terminal of the second transistor and the second terminal of the first transistor is connected to the second terminal of the second transistor.

Note that in FIG. 1A, the transistor 103 has a gate electrode on one side of the active layer. In the case where the transistor 103 has a pair of gate electrodes with the active layer therebetween, a signal for controlling switching is supplied to one of the gate electrodes, and the other of the gate electrodes may be in a floating state (i.e., electrically insulated) or supplied with a potential. In the latter case, potentials with the same level may be applied to the pair of electrodes, or a fixed potential such as a ground potential may be applied only to the other of the gate electrodes. By controlling the level of a potential supplied to the other of the gate electrodes, the threshold voltage of the transistor 103 can be controlled.

There is no limitation on a semiconductor material used for the active layer in the transistor included in the photosensor of this embodiment. Examples of semiconductor materials are amorphous, microcrystalline, polycrystalline, or single crystal silicon semiconductors, germanium semiconductors, compound semiconductors, and oxide semiconductors.

In particular, a channel formation region of the transistor 103, which functions as a switching element, preferably contains a semiconductor that has a wider band gap than a silicon semiconductor and has a lower intrinsic carrier density than silicon. For example, a compound semiconductor such as silicon carbide (SiC) or gallium nitride (GaN) or an oxide semiconductor of metal oxide such as zinc oxide (ZnO) can be used. Among the above, an oxide semiconductor has an advantage of high mass productivity because the oxide semiconductor can be formed by sputtering or a wet process (e.g., printing). In addition, the deposition temperature of the oxide semiconductor is as low as 300° C. to 500° C. (the glass transition temperature or lower, approximately 700° C. at the maximum), whereas the process temperature of silicon carbide and that of gallium nitride are approximately 1500° C. and approximately 1100° C., respectively. Therefore, the oxide semiconductor can be formed over a glass substrate which is inexpensively available. Further, a larger substrate can be used. Consequently, among the wide band gap semiconductors, the oxide semiconductor particularly has an advantage of high mass productivity. Further, in the case where an oxide semiconductor with high crystallinity is to be obtained in order to improve the performance (e.g., field-effect mobility) of a transistor, the oxide semiconductor with crystallinity can be easily obtained by heat treatment at 250° C. to 800° C.

When the channel formation region contains such a semiconductor material having the above characteristics, the transistor 103 can have an extremely low off-state current and high withstand voltage. Further, the use of the transistor 103 as a switching element can prevent leakage of charge accumulated during a charge retention period.

Unless otherwise specified, in the case of an n-channel transistor, an off-state current in this specification is a current that flows between a source electrode and a drain electrode when the potential of the drain electrode is higher than that of the source electrode and that of a gate electrode while the voltage between the gate electrode and the source electrode is less than or equal to zero. Further, in the case of a p-channel transistor, an off-state current in this specification is a current that flows between a source electrode and a drain electrode when the potential of the drain electrode is lower than that of the source electrode or that of a gate electrode while the potential between the gate electrode and the source is greater than or equal to zero.

In one embodiment of the present invention, the photosensor can be driven with a rolling shutter. Moreover, the photosensor can also be driven with a global shutter.

In a solid-state imaging device to which the method for driving a photosensor according to one embodiment of the present invention is applied, an image can be captured using external light and also by using light from a backlight instead of external light as in a contact area sensor, for example. In the case of using a backlight in one embodiment of the present invention, color image data may be obtained by field sequential driving (FS operation) of the backlight. By the FS operation, color image data can be obtained by additive color mixing using plural pieces of image data corresponding to a plurality of colors.

Another example of a photosensor to which the method for driving a photosensor according to one embodiment of the present invention can be applied is a photosensor 110 illustrated in FIG. 3A. Like the photosensor 100, the photosensor 110 includes the photodiode 101 which is a light-receiving element, the transistor 102 which is an amplifier element, the transistor 103 which is a switching element, and the transistor 105 that controls an output of the photosensor. The photosensor 110 also includes a transistor 107 that has a function of resetting the amount of charge accumulated in the charge retention node FD.

Specifically, in the photosensor 110, a first terminal of the transistor 103 is connected to the cathode of the photodiode 101, and a second terminal of the transistor 103 is connected to a gate electrode of the transistor 102 and a first terminal of the transistor 107. A first terminal of the transistor 102 and a second terminal of the transistor 107 are connected to the wiring VR supplied with the high-level power supply potential VDD. A gate electrode of the transistor 107 is connected to a wiring RS, and the wiring RS is supplied with a potential of a signal for controlling the switching of the transistor 107. A second terminal of the transistor 102 is connected to a first terminal of the transistor 105. A second terminal of the transistor 105 is connected to the wiring OUT. A gate electrode of the transistor 105 is connected to the wiring SE, and the wiring SE is supplied with the potential of a signal for controlling the switching of the transistor 105.

In FIG. 3A, a node where the second terminal of the transistor 103, the first terminal of the transistor 107, and the gate electrode of the transistor 102 are connected to each other is represented as the charge retention node FD. The potential of the output signal is determined by the amount of charge accumulated in the charge retention node FD. In order to hold charge in the charge retention node FD more reliably, a capacitor may be connected to the charge retention node FD.

Next, an example of the operation of the photosensor 110 in FIG. 3A will be described. FIG. 4 illustrates a timing chart of various potentials supplied to the photosensor 110 in FIG. 3A, as an example.

Note that in the timing chart in FIG. 4, for easy understanding of the operation of the photosensor 110, it is assumed that the wiring TX, the wiring SE, and the wiring RS are supplied with a high-level potential and a low-level potential. Specifically, it is assumed that the wiring TX is supplied with the high-level potential HTX and the low-level potential LTX; the wiring SE, the high-level potential HSE and the low-level potential LSE; and the wiring RS, a high-level potential HRS and a low-level potential LRS. The wiring RD is supplied with a low-level power supply potential VSS.

First, at a time T1, the potential of the wiring TX is switched from the potential LTX to the potential HTX. When the potential of the wiring TX changes to the potential HTX, the transistor 103 is turned on. At the time T1, the wiring SE is supplied with the potential LSE, and the wiring RS is supplied with the potential LRS.

Next, at a time T2, the potential of the wiring RS is switched from the potential LRS to the potential HRS. When the potential of the wiring RS changes to the potential HRS, the transistor 107 is turned on. At the time T2, the potential of the wiring TX is kept at the potential HTX, and the potential of the wiring SE is kept at the potential LSE. Accordingly, the node FD is supplied with the power supply potential VDD, so that the amount of charge held in the node FD is reset. Further, a reverse bias voltage is applied to the photodiode 101.

Then, at a time T3, the potential of the wiring RS is switched from the potential HRS to the potential LRS. The potential of the charge retention node FD remains at the power supply potential VDD until shortly before the time T3. Thus, even after the potential of the wiring RS changes to the potential LRS, a reverse bias voltage continues to be applied to the photodiode 101. Then, when light enters the photodiode 101 in that state, a current flows from the cathode toward the anode of the photodiode 101. The value of the current varies depending on the intensity of light. In other words, as the intensity of light entering the photodiode 101 increases, the value of the current increases and the amount of charge leaking from the charge retention node FD also increases. In contrast, as the intensity of light entering the photodiode 101 decreases, the value of the current decreases and the amount of charge leaking from the charge retention node FD also decreases. Thus, the higher the intensity of light becomes, the larger the amount of change in the potential of the charge retention node FD becomes; the lower the intensity of light becomes, the smaller the amount of change becomes.

Then, at a time T4, when the potential of the wiring TX is switched from the potential HTX to the potential LTX, the transistor 103 is turned off. Accordingly, the movement of charge from the charge retention node FD to the photodiode 101 is stopped, so that the potential of the charge retention node FD is determined.

Here, the fall of the pulse signal at the time when the potential of the wiring TX is switched from the potential HTX to the potential LTX is made gentle in the method for driving a photosensor according to one embodiment of the present invention. The fall of the pulse signal can be made gentler than conventional one by extending the fall time of the input waveform of the wiring TX. Thus, change in the potential of the charge retention node FD (clock feedthrough) due to parasitic capacitance of the transistor 103 can be suppressed. Consequently, high-contrast image data can be obtained.

Next, at a time T5, when the potential of the wiring SE is switched from the potential LSE to the potential HSE, the transistor 105 is turned on. Then, charge is moved from the wiring VR to the wiring OUT in accordance with the potential of the charge retention node FD.

Next, at a time T6, when the potential of the wiring SE is switched from the potential HSE to the potential LSE, the movement of charge from the wiring VR to the wiring OUT is stopped and the potential of the wiring OUT is determined. The potential of the wiring OUT corresponds to the potential of the output signal of the photosensor 110. Moreover, the potential of the output signal contains data of a captured image of an object.

The above series of operations can be classified into a reset operation, an accumulation operation, and a read operation. In other words, the operation from the time T1 to the time T3 corresponds to the reset operation; the operation from the time T3 to the time T4, the accumulation operation; and the operation from the time T5 to the time T6, the read operation. Image data can be obtained by performing the reset operation, the accumulation operation, and the read operation.

Next, the configuration of a photosensor 111, which is different from the photosensors illustrated in FIG. 1A and FIG. 3A, will be described with reference to FIG. 3B.

Like the photosensor 110, the photosensor 111 in FIG. 3B includes the photodiode 101 which is a light-receiving element, the transistor 102 which is an amplifier element, the transistor 103 which is a switching element, the transistor 105 that controls an output of the photosensor, and the transistor 107 that has a function of resetting the amount of charge accumulated in the charge retention node FD.

Specifically, in the photosensor 111, a first terminal of the transistor 103 is connected to the cathode of the photodiode 101, and a second terminal of the transistor 103 is connected to a gate electrode of the transistor 102 and a first terminal of the transistor 107. A first terminal of the transistor 102 is connected to a second terminal of the transistor 105, and the second terminal of the transistor 102 is connected to the wiring OUT. A first terminal of the transistor 105 and a second terminal of the transistor 107 are connected to the wiring VR supplied with the high-level power supply potential VDD. A gate electrode of the transistor 107 is connected to the wiring RS, and the wiring RS is supplied with a potential of a signal for controlling the switching of the transistor 107. A gate electrode of the transistor 105 is connected to the wiring SE, and the wiring SE is supplied with the potential of a signal for controlling the switching of the transistor 105.

In FIG. 3B, a node where the second terminal of the transistor 103, the first terminal of the transistor 107, and the gate electrode of the transistor 102 are connected to each other is represented as the charge retention node FD. The potential of the output signal is determined by the amount of charge accumulated in the charge retention node FD. In order to hold charge in the charge retention node FD more reliably, a capacitor may be connected to the charge retention node FD.

For the operation of the photosensor 111, the timing chart in FIG. 4 can be referred to.

In the method for driving a photosensor according to one embodiment of the present invention, the fall of the pulse signal of the wiring TX at the time T4 in the timing charts in FIG. 2 and FIG. 4 is made gentle. Thus, change in the potential of the charge retention node FD (clock feedthrough) due to parasitic capacitance of the transistor 103 can be suppressed. Consequently, high-contrast image data can be obtained.

As described above, one embodiment of the present invention is a method for driving a photosensor including a light-receiving element, a transistor serving as a switching element, and a charge retention node electrically connected to the light-receiving element through the transistor. The reduction in charge held in the charge retention node is suppressed by extending the fall time of the input waveform of a driving pulse that is supplied to the transistor to turn off the transistor. A photosensor that is small in size and can obtain high-contrast image data can be provided as a result.

This embodiment can be implemented in combination with any of the other embodiments.

Embodiment 2

In this embodiment, an example of a method for fabricating a photosensor to which one embodiment of the present invention can be applied will be described with reference to FIGS. 5A to 5C.

As a semiconductor material for a transistor used in one embodiment of the present invention, an oxide semiconductor, germanium, silicon, silicon germanium, single crystal silicon carbide, or the like may be used. For example, a transistor including silicon can be formed using a single crystal semiconductor substrate such as a silicon wafer, a silicon thin film formed by SOI, a silicon thin film formed by vapor deposition, or the like.

In this embodiment, a transistor including silicon as a semiconductor material and a transistor including an oxide semiconductor as a semiconductor material are used.

An oxide semiconductor used in this embodiment is an i-type (intrinsic) oxide semiconductor or a substantially i-type (intrinsic) oxide semiconductor. The i-type (intrinsic) or substantially i-type oxide semiconductor is obtained in such a manner that hydrogen, which functions as an impurity imparting n-type conductivity, is removed, and the oxide semiconductor is purified so as to contain as few impurities that are not main components of the oxide semiconductor as possible.

Note that the purified oxide semiconductor includes extremely few carriers, and the carrier concentration is lower than $1 \times 10^{14}/cm^3$, preferably lower than $1 \times 10^{12}/cm^3$, further preferably lower than $1 \times 10^{11}/cm^3$. Such few carriers enable a current in the off state (off-state current) to be sufficiently low.

Specifically, in the transistor including the oxide semiconductor layer, the leakage current density (off-state current density) per micrometer of a channel width between the source and the drain in the off state can be 100 zA/μm ($1 \times 10^{-19}$ A/μm) or less, preferably 10 zA/μm ($1 \times 10^{-20}$ A/μm) or less, and further preferably 1 zA/μm ($1 \times 10^{-21}$ A/μm) or less with a source-drain voltage of 3.5 V at ambient temperature (e.g., 25° C.).

In the transistor including a purified oxide semiconductor layer, the temperature dependence of on-state current is hardly observed, and off-state current remains extremely low at high temperature.

Steps for fabricating a photosensor that includes a transistor 705 including silicon as a semiconductor material and a transistor 724 including an oxide semiconductor as a semiconductor material, to which one embodiment of the present invention can be applied, will be described below with reference to FIGS. 5A to 5C.

Figure 5A:
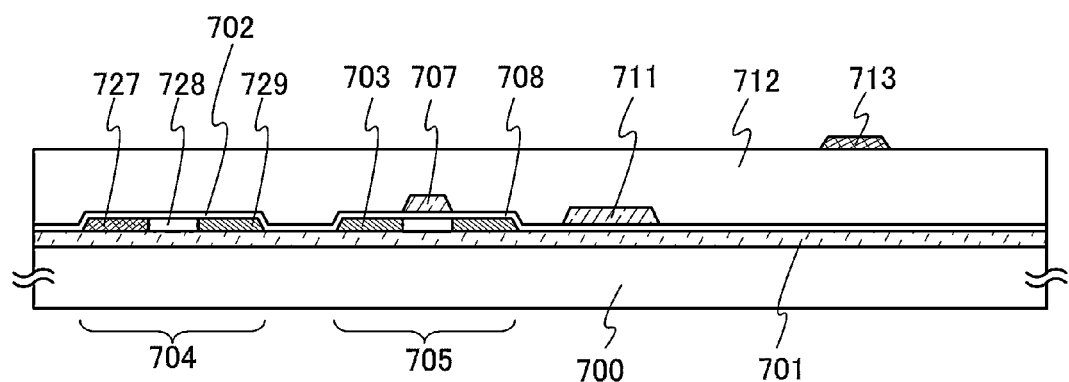
FIGS. 5A to 5C illustrate an example of a method for fabricating a photosensor.

First, as illustrated in FIG. 5A, a photodiode 704 and the n-channel transistor 705 are formed over an insulating surface of a substrate 700 by a known CMOS fabrication method. In this embodiment, the case where the photodiode 704 and the n-channel transistor 705 are formed with a single crystal semiconductor film that is separated from a single crystal semiconductor substrate is given as an example.

A specific example of a method for forming the single crystal semiconductor film will be briefly described. First, an ion beam including ions that are accelerated by an electric field enters the single crystal semiconductor substrate, and a fragile layer which is weakened by local disorder of the crystal structure is formed in a region at a certain depth from the surface of the semiconductor substrate. The depth at which the fragile layer is formed can be adjusted by the acceleration energy of the ion beam and the angle at which the ion beam enters. Then, the semiconductor substrate and the substrate 700 over which an insulating film 701 is formed are attached to each other so that the insulating film 701 is sandwiched therebetween. After the semiconductor substrate and the substrate 700 overlap with each other, a pressure of about 1 N/cm$^2$ to 500 N/cm$^2$, preferably about 11 N/cm$^2$ to 20 N/cm$^2$ is applied to part of the semiconductor substrate and the substrate 700 to attach the substrates. When the pressure is applied, bonding between the semiconductor substrate and the insulating film 701 starts from the portion to which the pressure is applied, which results in bonding of the entire surface where the semiconductor substrate and the insulating film 701 are in close contact with each other. Next, heat treatment is performed, whereby very small voids that exist in the fragile layer are combined, so that the very small voids increase in volume. As a result, the single crystal semiconductor film which is part of the semiconductor substrate is separated from the semiconductor substrate along the fragile layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The photodiode 704 is formed using the island-shaped semiconductor film 702 over the insulating film 701. The n-channel transistor 705 is formed using the island-shaped semiconductor film 703 over the insulating film 701. The photodiode 704 is a lateral junction type photodiode in which a region 727 having p-type conductivity, a region 728 having i-type conductivity, and a region 729 having n-type conductivity are formed in the island-shaped semiconductor film 702. The n-channel transistor 705 includes a gate electrode 707 and also includes an insulating film 708 between the island-shaped semiconductor film 703 and the gate electrode 707.

Note that the region 728 having i-type conductivity refers to a region of the semiconductor film which contains an impurity imparting p-type or n-type conductivity at a concentration of $1\times10^{20}$ cm$^{-3}$ or less and has photoconductivity 100 or more times as high as dark conductivity. The region 728 having i-type conductivity includes, in its category, a region that contains an impurity element belonging to Group 13 or Group 15 of the periodic table. An i-type semiconductor has weak n-type electric conductivity when an impurity element for controlling valence electrons is not added intentionally. Therefore, the region 728 having i-type conductivity includes, in its category, a region to which an impurity element imparting p-type conductivity is added intentionally or unintentionally at the same time as or after the film formation.

Although there is no particular limitation on the substrate 700, the substrate 700 is preferably a substrate that has an insulating surface and has barrier properties with respect to impurities including a hydrogen atom (e.g., water vapor, a hydrogen gas, and a hydrogen ion). If heat treatment is performed in a later step, the substrate 700 needs to have heat resistance at least high enough to withstand the heat treatment.

For example, a glass substrate of barium borosilicate glass, aluminoborosilicate glass, or the like, a quartz substrate, a sapphire substrate, or a ceramic substrate may be used. Alternatively, a metal substrate containing stainless steel or a semiconductor substrate having an insulating film formed on its surface may be used. A flexible substrate formed using a synthetic resin such as plastics generally tends to have a lower upper temperature limit than the above substrates; such a substrate can be used as long as it can withstand processing temperature in the fabrication process. Note that the surface of the substrate 700 may be planarized by polishing such as CMP.

Note that although the case where the photodiode 704 and the n-channel transistor 705 are formed using the single crystal semiconductor film is described as an example in this embodiment, the present invention is not limited to this structure. For example, a polycrystalline or microcrystalline semiconductor film that is formed over the insulating film 701 by vapor deposition may be used. Alternatively, the above semiconductor film may be crystallized with a known technique. Examples of the known technique of crystallization are a laser crystallization method using a laser beam and a crystallization method using a catalytic element. Alternatively, it is possible to use a crystallization method using a catalytic element and a laser crystallization method in combination. In the case of using a heat-resistant substrate such as a quartz substrate, it is possible to combine any of the following crystallization methods: a thermal crystallization method using an electrically heated oven, a lamp annealing crystallization method using infrared light, a crystallization method using a catalytic element, and a high-temperature annealing method at approximately 950° C.

After a conductive film is formed over the insulating film 708, the conductive film is processed into a desired shape by etching or the like, whereby a wiring 711 is formed together with the gate electrode 707.

Next, an insulating film 712 is formed so as to cover the photodiode 704, the n-channel transistor 705, and the wiring 711. Note that although the case where a single-layer insulating film is used as the insulating film 712 is described as an example in this embodiment, the insulating film 712 is not necessarily a single-layer film and may be a stack including two or more insulating films.

The insulating film 712 is formed using a material that can withstand a temperature of heat treatment in a later fabrication step. Specifically, it is preferable to use silicon oxide, silicon nitride, silicon nitride oxide, silicon oxynitride, aluminum nitride, aluminum oxide, or the like for the insulating film 712.

Note that in this specification, oxynitride refers to a material containing a higher quantity of oxygen than that of nitrogen, and nitride oxide refers to a material containing a higher quantity of nitrogen than that of oxygen.

A surface of the insulating film 712 may be planarized by CMP or the like.

Next, a gate electrode 713 is formed over the insulating film 712 (FIG. 5A).

The gate electrode 713 can be formed with a single-layer structure or a stacked structure using a metal material such as molybdenum, titanium, chromium, tantalum, tungsten, neodymium, or scandium; an alloy material that contains any of these metals as a main component; or conductive oxide. Note that aluminum or copper can also be used as the metal material if it can withstand the temperature of heat treatment performed in a later step. Aluminum and copper are preferably used in combination with a refractory metal material so as to avoid problems of heat resistance and corrosion. As the refractory metal material, molybdenum, titanium, chromium, tantalum, tungsten, neodymium, scandium, or the like can be used.

Alternatively, the gate electrode 713 may have a structure in which a copper film is stacked over an alloy film of copper, magnesium, and aluminum. By using the alloy film of copper, magnesium, and aluminum, the adhesion between the gate electrode 713 and the insulating film 712 can be increased.

Next, a gate insulating layer 714 is formed over the gate electrode 713. The gate insulating layer 714 can be formed by plasma CVD, sputtering, or the like. The gate insulating layer 714 can be formed with a single-layer structure or a stacked structure using one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a tantalum oxide film, a gallium oxide film, and the like.

For the oxide semiconductor in this embodiment, an oxide semiconductor that is made to be an i-type semiconductor or a substantially i-type semiconductor (a purified oxide semiconductor) by removing an impurity is used. Such a purified oxide semiconductor is highly sensitive to an interface state and interface charge; therefore, the interface between the oxide semiconductor layer and the gate insulating layer is important. For that reason, the gate insulating layer that is to be in contact with the purified oxide semiconductor needs to have high quality.

For example, high-density plasma-enhanced CVD using microwaves (e.g., a frequency of 2.45 GHz) is preferable because a dense high-quality insulating film having high withstand voltage can be formed. When the purified oxide semiconductor and the high-quality gate insulating film are in close contact with each other, the interface state density can be reduced and favorable interface characteristics can be obtained.

Needless to say, a different film formation method such as sputtering or plasma CVD can be used as long as a high-quality insulating film can be formed as the gate insulating layer 714. Alternatively, it is possible to form an insulating film whose film quality and characteristics of the interface with the oxide semiconductor are improved by heat treatment performed after deposition. In any case, any insulating film can be used as long as it has a reduced interface state density with the oxide semiconductor and can form a favorable interface as well as having a favorable film quality as the gate insulating layer.

Note that the gate insulating layer 714 is in contact with the oxide semiconductor formed later. Hydrogen contained in the oxide semiconductor adversely affects characteristics of the transistor; therefore, it is preferable that the gate insulating layer 714 do not contain hydrogen, a hydroxyl group, and moisture. In order that the gate insulating layer 714 contains as little hydrogen, a hydroxyl group, and moisture as possible, impurities adsorbed on the substrate 700, such as moisture or hydrogen, are preferably eliminated and removed by preheating the substrate 700, over which the gate electrode 713 is formed, in a preheating chamber of a sputtering apparatus as a pretreatment for film formation. The temperature for the preheating is 100° C. to 400° C., preferably 150° C. to 300° C. As an exhaustion unit provided in the preheating chamber, a cryopump is preferably used. Note that this preheating treatment can be omitted.

Next, an oxide semiconductor film having a thickness of 2 nm to 200 nm, preferably 3 nm to 50 nm, further preferably 3 nm to 20 nm is formed over the gate insulating layer 714. The oxide semiconductor film can be formed, for example, by sputtering in a rare gas (e.g., argon) atmosphere, an oxygen atmosphere, or a mixed atmosphere of a rare gas (e.g., argon) and oxygen.

Note that before the oxide semiconductor film is formed by sputtering, dust attached to a surface of the gate insulating layer 714 is preferably removed by reverse sputtering in which an argon gas is introduced and plasma is generated. The reverse sputtering refers to a method in which an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

An oxide semiconductor used for the oxide semiconductor film preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide; tin oxide; zinc oxide; oxides of two metal elements such as In—Zn-based oxide, Sn—Zn-based oxide, Al—Zn-based oxide, Zn—Mg-based oxide, Sn—Mg-based oxide, In—Mg-based oxide, and In—Ga-based oxide; oxides of three metal elements such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and oxides of four metal elements such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than the In, Ga, and Zn.

Alternatively, the oxide semiconductor film can be formed using an oxide semiconductor obtained by adding $SiO_2$ to any of the above metal oxides.

Moreover, the oxide semiconductor film can be formed using an oxide semiconductor represented by the chemical formula $InMO_3(ZnO)_m$ (m>0). Here, M represents one or more metal elements selected from Ga, Al, Mn, and Co.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above compositions. Alternatively, it is possible to use an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above compositions.

Without limitation to the above, an oxide semiconductor with an appropriate composition ratio can be used in accordance with desired semiconductor characteristics (e.g., mobility, threshold voltage, and variation). In order to obtain needed semiconductor characteristics, an oxide semiconductor preferably has appropriate carrier concentration, impurity concentration, defect density, atomic ratio of a metal element to oxygen, interatomic distance, density, or the like.

For example, high mobility is relatively easy to obtain with an In—Sn—Zn-based oxide. Even when an In—Ga—Zn-based oxide is used, the mobility can be increased by a reduction in bulk defect density.

Note that the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2 \leq r^2$, where r is 0.05, for example. The same can be applied to other oxides.

The oxide semiconductor may be single crystal or non-single-crystal. A non-single-crystal oxide semiconductor may be amorphous or polycrystalline. Further, the oxide semiconductor may have an amorphous structure including a portion having crystallinity or a non-amorphous structure.

In an oxide semiconductor in an amorphous state, a flat surface can be obtained with relative ease. When a transistor is formed using the oxide semiconductor in an amorphous state, interface scattering can be reduced, and relatively high mobility can be obtained with relative ease.

In an oxide semiconductor having crystallinity, defects in the bulk can be further reduced. When a surface flatness is improved, mobility higher than that of an oxide semiconductor in an amorphous state can be obtained. In order to improve the surface flatness, the oxide semiconductor is preferably formed on a flat surface. Specifically, it is preferable that the oxide semiconductor be formed on a surface with an average surface roughness ($R_a$) of 1 nm or less, preferably 0.3 nm or less, further preferably 0.1 nm or less.

Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by Formula 1.

$$Ra = \frac{1}{S_0} \int_{y_1}^{y_2} \int_{x_1}^{x_2} |f(x,y) - Z_0| dx\, dy \qquad \text{[Formula 1]}$$

Note that in Formula 1, $S_0$ represents the area of a measurement surface (a rectangular region defined by four points represented by the coordinates $(x_1,y_1)$, $(x_1,y_2)$, $(x_2,y_1)$, and $(x_2,y_2)$), and $Z_0$ represents average height of the measurement surface. Further, $R_a$ can be measured with an atomic force microscope (AFM).

Here, as an oxide semiconductor having crystallinity, an oxide including a crystal with c-axis alignment (also referred to as a c-axis aligned crystal (CAAC)), which has a triangular or hexagonal atomic arrangement when seen from the direction of an a-b plane, a surface, or an interface, will be described. In the crystal, metal atoms are arranged in a layered manner or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

Examples of a crystal structure of the CAAC will be described in detail with reference to FIGS. 16A to 16E, FIGS. 17A to 17C, and FIGS. 18A to 18C. In FIGS. 16A to 16E, FIGS. 17A to 17C, and FIGS. 18A to 18C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 16A to 16E, O surrounded by a circle represents tetracoordinate O and O surrounded by a double circle represents tricoordinate O.

Figure 16A:
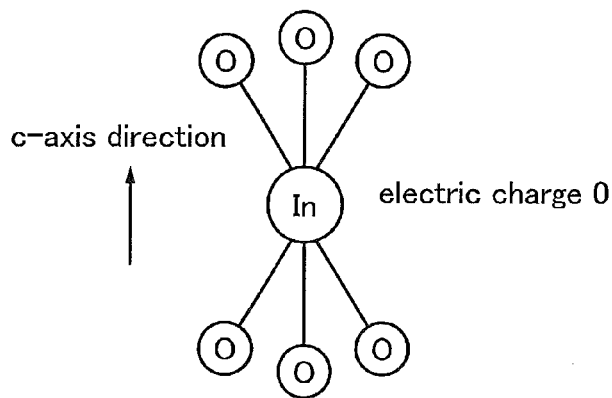
FIGS. 16A to 16E each illustrate a crystal structure of an oxide material.

FIG. 16A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 16A is actually an octahedral structure, but is illustrated as a planar structure for simplicity. Note that three tetracoordinate O atoms exist in each of an upper half and a lower half in FIG. 16A. In the small group illustrated in FIG. 16A, electric charge is 0.

Figure 16D:
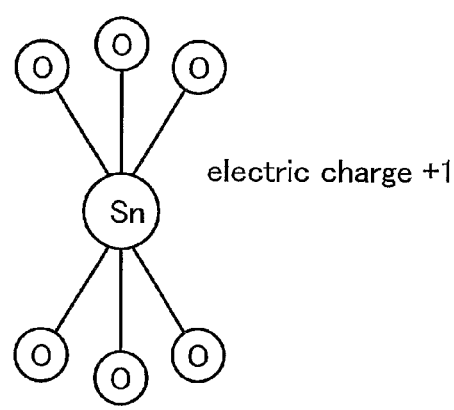
Figure 16B:
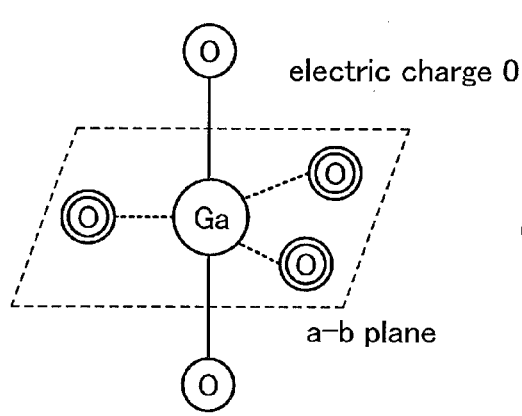

FIG. 16B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 16B. An In atom can also have the structure illustrated in FIG. 16B because an In atom can have five ligands. In the small group illustrated in FIG. 16B, electric charge is 0.

Figure 16E:
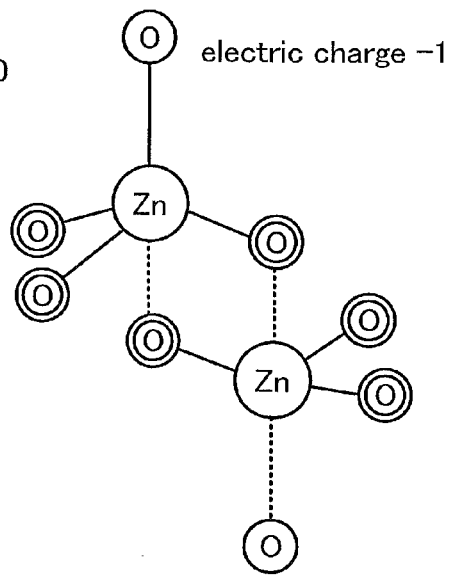
Figure 16C:
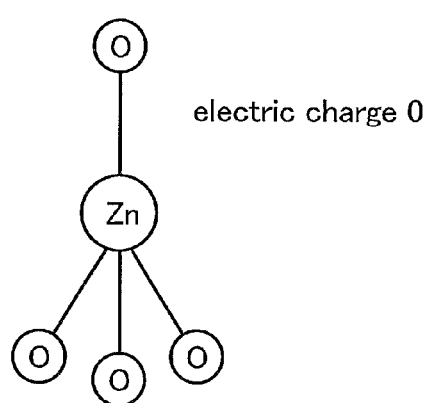

FIG. 16C illustrates a structure including one tetracoordinate Zn atom and four tetracoordinate O atoms proximate to the Zn atom. In FIG. 16C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 16C. In the small group illustrated in FIG. 16C, electric charge is 0.

FIG. 16D illustrates a structure including one hexacoordinate Sn atom and six tetracoordinate O atoms proximate to the Sn atom. In FIG. 16D, three tetracoordinate O atoms exist in each of an upper half and a lower half. In the small group illustrated in FIG. 16D, electric charge is +1.

FIG. 16E illustrates a small group including two Zn atoms. In FIG. 16E, one tetracoordinate O atom exists in each of an upper half and a lower half. In the small group illustrated in FIG. 16E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 16A each have three proximate In atoms in the downward direction, and the three O atoms in the lower half each have three proximate In atoms in the upward direction. The one O atom in the upper half with respect to the pentacoordinate Ga atom in FIG. 16B has one proximate Ga atom in the downward direction, and the one O atom in the lower half has one proximate Ga atom in the upward direction. The one O atom in the upper half with respect to the tetracoordinate Zn atom in FIG. 16C has one proximate Zn atom in the downward direction, and the three O atoms in the lower half each have three proximate Zn atoms in the upward direction. In this manner, the number of the tetracoordinate O atoms proximate to and above the metal atom is equal to the number of the metal atoms proximate to and below each of the tetracoordinate O atoms. Similarly, the number of the tetracoordinate O atoms proximate to and below the metal atom is equal to the number of the metal atoms proximate to and above each of the tetracoordinate O atoms. Since O atoms contributing the bonding between the small groups are the tetracoordinate O atoms, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

FIG. 17A illustrates a model of a medium group included in a layered structure of an In—Sn—Zn—O-based material. FIG. 17B illustrates a large group including three medium groups. FIG. 17C illustrates an atomic arrangement in the case where the layered structure in FIG. 17B is observed from the c-axis direction.

In FIG. 17A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 17A, one tetracoordinate O atom existing in each of an upper half and a lower half with respect to an In atom is denoted by circled 1. FIG. 17A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 17A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 16E can be given. For example, with one small group including two Zn atoms, electric charge of one small group including a Sn atom can be cancelled, so that the total electric charge of the layered structure can be 0.

When the large group illustrated in FIG. 17B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: oxide of four metal elements, such as In—Sn—Ga—Zn-based oxide; oxide of three metal elements, such as In—Ga—Zn-based oxide (also referred to as IGZO), In—Al—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; oxide of two metal elements, such as In—Zn-based oxide, Sn—Zn-based oxide, Al—Zn-based oxide, Zn—Mg-based oxide, Sn—Mg-based oxide, In—Mg-based oxide, and In—Ga-based oxide.

Figure 18A:
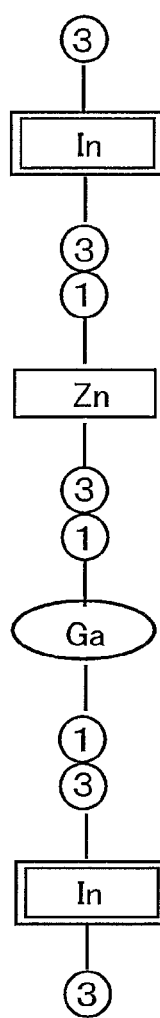
FIGS. 18A to 18C illustrate a crystal structure of an oxide material.

As an example, FIG. 18A illustrates a model of a medium group included in a layered structure of an In—Ga—Zn—O-based material.

In the medium group included in the layered structure of the In—Ga—Zn—O-based material in FIG. 18A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 18B:
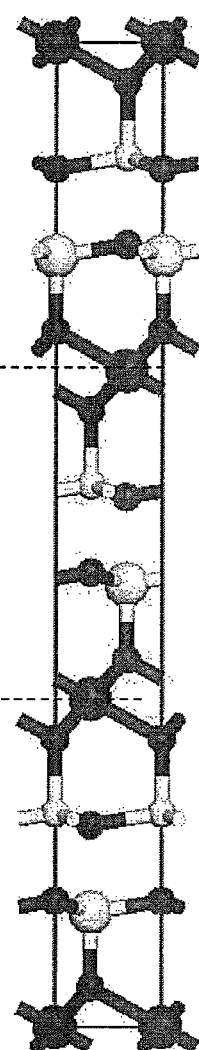
Figure 18C:
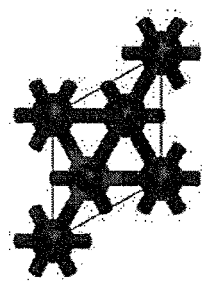

FIG. 18B illustrates a large group including three medium groups. FIG. 18C illustrates an atomic arrangement in the case where the layered structure in FIG. 18B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 18A but also a medium group in which the arrangement of the In atom, the Ga atom, and the Zn atom is different from that in FIG. 18A.

As a target used for forming the oxide semiconductor film by sputtering, an oxide target containing $In_2O_3$, $Ga_2O_3$, and ZnO at a composition ratio of 1:1:1 [molar ratio] is used, for example, and an In—Ga—Zn—O film is formed. Without limitation to the material and the composition of the above target, an oxide target containing $In_2O_3$, $Ga_2O_3$, and ZnO at a composition ratio of 1:1:2 [molar ratio] or a composition ratio of 1:1:4 [molar ratio] may be used, for example.

The filling rate of the oxide target is 90% to 100%, preferably 95% to 99.9%. With use of the metal oxide target with high filling rate, a dense oxide semiconductor film can be formed. Moreover, the purity of the target is preferably higher than or equal to 99.99%. In particular, it is preferable that impurities in the target, for example, an alkali metal such as Li or Na and an alkaline earth metal such as Ca be reduced.

It is preferable that a high-purity gas from which impurities such as hydrogen, water, hydroxyl group, or hydride have been removed be used as a sputtering gas used for forming the oxide semiconductor film. Specifically, a high-purity gas with a dew point of −60° C. or lower is preferable.

The substrate is held in a deposition chamber kept under reduced pressure, and the substrate temperature is set at 100° C. to 600° C., preferably 200° C. to 400° C. By forming the oxide semiconductor film while the substrate is heated, the concentration of impurities included in the formed oxide semiconductor film can be reduced. In addition, damage by sputtering can be reduced. Then, a sputtering gas from which hydrogen and moisture have been removed is introduced into the deposition chamber while moisture remaining therein is removed, and the oxide semiconductor film is formed with the use of the above target.

In order to remove moisture remaining in the deposition chamber, an entrapment vacuum pump such as a cryopump, an ion pump, or a titanium sublimation pump is preferably used. The evacuation unit may be a turbo pump provided with a cold trap. In the deposition chamber which is evacuated with the cryopump, a hydrogen atom, a compound containing a hydrogen atom, such as water ($H_2O$) (preferably, a compound containing a carbon atom as well), and the like are removed, whereby the concentration of impurities in the oxide semiconductor film formed in the deposition chamber can be reduced.

The atmosphere for sputtering may be a rare gas (typically argon) atmosphere, an oxygen atmosphere, or a mixed atmosphere containing a rare gas and oxygen.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferable because dust generated in deposition can be reduced and the film thickness can be made uniform.

When the leakage rate of the treatment chamber of the sputtering apparatus is set at $1\times10^{-10}$ Pa·m$^3$/s or less, entry of impurities such as an alkali metal or hydride into the oxide semiconductor film that is being deposited by sputtering can be reduced. Moreover, with the use of an entrapment vacuum pump as an exhaustion system, counter flow of impurities such as an alkali metal, a hydrogen atom, a hydrogen molecule, water, hydroxyl, or hydride from the exhaustion system can be reduced.

Note that impurities, for example, an alkali metal such as Li or Na and an alkaline earth metal such as Ca included in the oxide semiconductor film are preferably reduced. Specifically, as for the concentrations of such impurities contained in the oxide semiconductor film measured by SIMS, the concentrations of Li and K are preferably $5 \times 10^{15}$ cm$^{-3}$ or lower, further preferably $1 \times 10^{15}$ cm$^{-3}$ or lower.

An alkali metal and an alkaline earth metal are adverse impurities for the oxide semiconductor and are preferably contained as little as possible. Specifically, when an insulating film in contact with the oxide semiconductor is an oxide, Na, among the alkali metals, diffuses into the oxide and becomes Nat In addition, Na cuts a bond between metal and oxygen or enters the bond in the oxide semiconductor, which causes deterioration of transistor characteristics (e.g., normally-on state of the transistor (a negative shift of the threshold voltage) or the decrease in mobility) and variations in the characteristics. Such problems are significant especially in the case where the hydrogen concentration in the oxide semiconductor is extremely low. Therefore, the concentration of an alkali metal strongly needs to be the above value when the hydrogen concentration in the oxide semiconductor is $5 \times 10^{19}$ cm$^{-3}$ or lower, particularly $5 \times 10^{18}$ cm$^{-3}$ or lower.

Figure 5B:
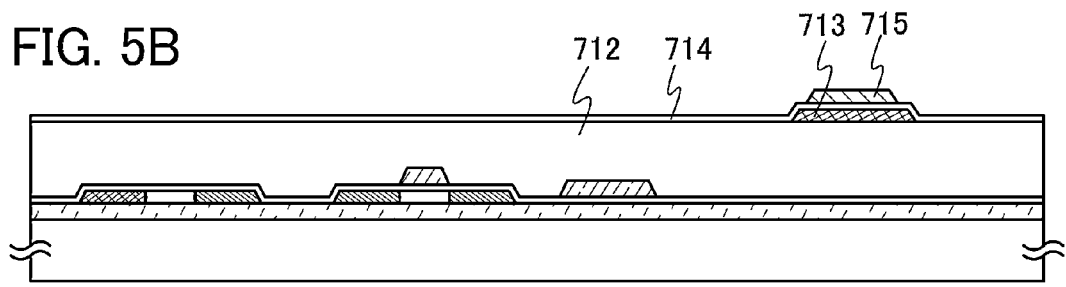

Next, the oxide semiconductor film is processed (patterned) into a desired shape by etching or the like, whereby an island-shaped oxide semiconductor layer 715 is formed over the gate insulating layer 714 so as to overlap with the gate electrode 713 (see FIG. 5B).

A resist mask used for forming the island-shaped oxide semiconductor layer 715 may be formed by an inkjet method. Formation of the resist mask by an inkjet method needs no photomask; thus, fabrication costs can be reduced.

Note that etching for forming the island-shaped oxide semiconductor layer 715 may be wet etching, dry etching, or both dry etching and wet etching. As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, parallel plate RIE (reactive ion etching) or ICP (inductively coupled plasma) etching can be used. In order to etch the films into desired shapes, the etching conditions (e.g., the amount of power applied to a coil-shaped electrode, the amount of power applied to an electrode on the substrate side, and the temperature of the electrode on the substrate side) are adjusted as appropriate.

As an etchant used for wet etching, a mixed solution of phosphoric acid, acetic acid, and nitric acid can be used, for example. In addition, ITO07N (produced by KANTO CHEMICAL CO., INC.) may be used.

Next, the oxide semiconductor layer is subjected to first heat treatment. With the first heat treatment, dehydration or dehydrogenation of the oxide semiconductor layer can be conducted. The temperature of the first heat treatment is 150° C. to 650° C., preferably 200° C. to 500° C. For example, the first heat treatment may be performed at 500° C. for 3 to 6 minutes. When rapid thermal annealing (RTA) is used for the heat treatment, dehydration or dehydrogenation can be performed in a short time; therefore, the treatment can be conducted even at a temperature higher than the strain point of the glass substrate.

Here, the substrate is put in an electric furnace which is one of heat treatment apparatuses and heat treatment is performed on the oxide semiconductor layer at 450° C. for one hour in a nitrogen atmosphere. Then, water or hydrogen is prevented from entering the oxide semiconductor layer without exposure to the air; thus, the oxide semiconductor layer 715 is obtained.

Note that a heat treatment apparatus is not limited to an electrical furnace and may be an apparatus for heating an object by heat conduction or heat radiation from a heating element such as a resistance heating element. For example, an RTA apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object by heat treatment, for example, nitrogen or a rare gas such as argon is used.

Note that it is preferable that in the first heat treatment, moisture, hydrogen, or the like be not contained in nitrogen or a rare gas such as helium, neon, or argon. The purity of nitrogen or the rare gas such as helium, neon, or argon which is introduced into a heat treatment apparatus is preferably 6N (99.9999%) or higher, further preferably 7N (99.99999%) or higher (i.e., the impurity concentration is preferably 1 ppm or lower, further preferably 0.1 ppm or lower).

In addition, after the oxide semiconductor layer is heated by the first heat treatment, a high-purity oxygen gas, a high-purity $N_2O$ gas, or ultra dry air (with a moisture content of 20 ppm (−55° C. by conversion into a dew point) or less, preferably 1 ppm or less, further preferably 10 ppb or less, in the case where measurement is performed with the use of a dew point meter of a cavity ring down laser spectroscopy (CRDS) system) may be introduced into the same furnace. It is preferable that water, hydrogen, and the like be not contained in the oxygen gas or the $N_2O$ gas. Alternatively, the purity of the oxygen gas or the $N_2O$ gas which is introduced into the heat treatment apparatus is preferably 6N or higher, further preferably 7N or higher (i.e., the impurity concentration of the oxygen gas or the $N_2O$ gas is preferably 1 ppm or lower, more preferably 0.1 ppm or lower). Oxygen which is the main component of the oxide semiconductor and has been reduced at the same time as the step for removing impurities by dehydration or dehydrogenation is supplied by the effect of the oxygen gas or the $N_2O$ gas, so that the oxide semiconductor layer can be a high-purity and electrically i-type (intrinsic) oxide semiconductor layer.

In addition, the first heat treatment for the oxide semiconductor layer can be performed on the oxide semiconductor film which has not been processed into the island-shaped oxide semiconductor layer. In that case, the substrate is taken out from the heat apparatus after the first heat treatment, and then a photolithography process is performed.

Note that the first heat treatment may be performed at either of the following timings without limitation to the above-described timing as long as it is performed after the oxide semiconductor layer is formed: after a source electrode layer and a drain electrode layer are formed over the oxide semiconductor layer; and after an insulating layer is formed over the source electrode layer and the drain electrode layer.

Through the above steps, the concentration of hydrogen in the island-shaped oxide semiconductor layer can be reduced. The above heat treatment can be performed at any time as long as it is performed after the oxide semiconductor layer is formed.

Alternatively, an oxide semiconductor film having a crystal region that is c-axis-aligned perpendicularly to a surface of the film may be formed by performing two deposition steps and two heat treatments. For example, a first oxide semiconductor film with a thickness 3 nm to 15 nm is formed and then first heat treatment is performed at temperatures ranging from 450° C. to 850° C., preferably from 550° C. to 750° C. in an atmosphere of nitrogen, oxygen, a rare gas, or dry air (e.g., an oxygen atmosphere, a nitrogen atmosphere, a mixed atmosphere of oxygen and argon, a mixed atmosphere of nitrogen and argon, or a mixed atmosphere of oxygen, nitrogen, and argon). Thus, the first oxide semiconductor film that has a crystal region (including plate-like crystals) in a region including its surface is formed. Then, a second oxide semiconductor film that is thicker than the first oxide semiconductor film is formed and then second heat treatment is performed at temperatures ranging from 450° C. to 850° C., preferably from 600° C. to 700° C. Thus, crystal growth proceeds upward with the use of the first oxide semiconductor film as a seed of the crystal growth, and the entire second oxide semiconductor film is crystallized as a result. In such a manner, an oxide semiconductor layer having a thick crystal region may be formed.

Moreover, an oxide semiconductor layer having a crystal region that is c-axis-aligned perpendicularly to a surface of the film may be formed by depositing an oxide semiconductor layer while the substrate is heated to a temperature at which the oxide semiconductor is c-axis-aligned. With such a film formation method, the process can be shortened. The temperature for heating the substrate is set as appropriate in accordance with other film formation conditions which differ depending on a film formation apparatus; for example, the substrate temperature during the film formation with a sputtering apparatus is set in the range of 150° C. to 450° C.

Next, the insulating film 708, the insulating film 712, and the gate insulating layer 714 are partly etched, whereby contact holes reaching the island-shaped semiconductor film 702, the island-shaped semiconductor film 703, and the wiring 711 are formed. Note that the contact holes may be formed before the first heat treatment is performed.

Then, a conductive film is formed so as to cover the oxide semiconductor layer 715 by sputtering or vacuum evaporation. After that, the conductive film is patterned by etching or the like, so that conductive films 716 to 721 each of which functions as a source electrode, a drain electrode, or a wiring are formed.

Note that the conductive films 716 and 717 are in contact with the island-shaped semiconductor film 702. The conductive films 718 and 719 are in contact with the island-shaped semiconductor film 703. The conductive film 720 is in contact with the wiring 711 and the oxide semiconductor layer 715. The conductive film 721 is in contact with the oxide semiconductor layer 715.

As a material for the conductive film to be the conductive films 716 to 721, a metal film containing an element selected from aluminum, chromium, copper, tantalum, titanium, molybdenum, or tungsten, an alloy film or a metal nitride film containing any of the above elements as its component (e.g., a titanium nitride film, a molybdenum nitride film, or a tungsten nitride film), or the like can be used. When a metal film of aluminum, copper, or the like is used, a film of a refractory metal such as molybdenum, titanium, chromium, tantalum, tungsten, neodymium, scandium, or yttrium or a metal nitride film thereof (e.g., a titanium nitride film, a molybdenum nitride film, or a tungsten nitride film) may be provided in contact with the metal film in order to solve problems of heat resistance and corrosion.

The conductive film may have a single-layer structure or a stacked structure including two or more layers. For example, the conductive film may have a single-layer structure of an aluminum film containing silicon; a two-layer structure of an aluminum film and a titanium film stacked thereover; or a three-layer structure in which a titanium film, an aluminum film, and a titanium film are stacked in this order.

Alternatively, the conductive film may have a structure in which a copper film is stacked over an alloy film of copper, magnesium, and aluminum. By using the alloy film of copper, magnesium, and aluminum, the adhesion between the conductive film and the insulating film can be increased.

The conductive film to be the conductive films 716 to 721 may be formed using a conductive metal oxide. As the conductive metal oxide, indium oxide, tin oxide, zinc oxide, indium tin oxide, indium zinc oxide, or the metal oxide material to which silicon or silicon oxide is added can be used.

In the case where heat treatment is performed after formation of the conductive film, the conductive film preferably has heat resistance high enough to withstand the heat treatment.

Note that the materials and etching conditions are adjusted as appropriate so that the oxide semiconductor layer 715 is not removed as much as possible in etching of the conductive film. Depending on etching conditions, an exposed portion of the oxide semiconductor layer 715 is partly etched and thus a groove (a recessed portion) is formed in some cases.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing films into different patterns. That is, a resist mask corresponding to at least two kinds of different patterns can be formed by one multi-tone mask. Thus, the number of light-exposure masks can be reduced and the number of corresponding photolithography steps can be also reduced, whereby the process can be simplified.

Next, plasma treatment using a gas such as $N_2O$, $N_2$, or Ar is performed. Through this plasma treatment, water or the like adsorbed on an exposed surface of the oxide semiconductor layer is removed. Plasma treatment may be performed using a mixture gas of oxygen and argon.

Figure 5C:
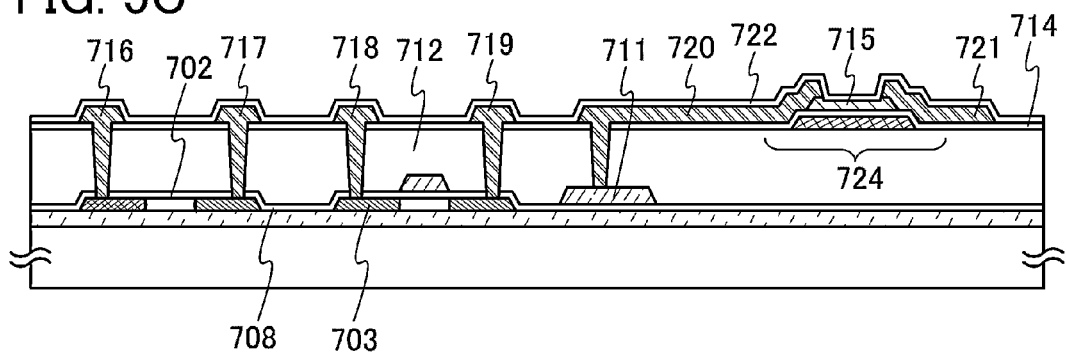

After the plasma treatment, an insulating film 722 is formed so as to cover the conductive films 716 to 721 and the oxide semiconductor layer 715 (see FIG. 5C).

The insulating film 722 preferably contains as little impurities such as moisture, hydrogen, and oxygen as possible. The insulating film 722 may be a single-layer insulating film or a stack of a plurality of insulating films. If hydrogen is contained in the insulating film 722, hydrogen might enter the oxide semiconductor layer or extract oxygen from the oxide semiconductor layer, thereby causing reduction in resistance of a back channel portion of the oxide semiconductor layer (making the back channel portion have n-type conductivity), which might result in formation of parasitic channel. Therefore, it is important that a film formation method in which hydrogen is not used be employed in order to form the insulating film 722 containing as little hydrogen as possible.

A material with high barrier properties is preferably used for the insulating film 722. For example, as an insulating film with high barrier properties, a silicon nitride film, a silicon nitride oxide film, an aluminum nitride film, an aluminum nitride oxide film, an aluminum oxide film, a gallium oxide film, or the like can be used. By using the insulating film with high barrier properties, impurities such as moisture or hydrogen can be prevented from entering the island-shaped oxide semiconductor layer, the gate insulating layer, or the interface between the island-shaped oxide semiconductor layer and another insulating layer and the vicinity thereof.

For example, an insulating film having a structure in which a 100-nm-thick aluminum oxide film formed by sputtering is stacked over a 200-nm-thick gallium oxide film formed by sputtering may be formed. The substrate temperature at the time of deposition is in the range of room temperature to 300° C. Further, the insulating film preferably contains much oxygen that exceeds the stoichiometric proportion, further preferably contains oxygen more than 1 time and less than two times the stoichiometric proportion. When the insulating film contains excessive oxygen in the above manner, oxygen is supplied to the interface with the island-shaped oxide semiconductor film; thus, oxygen vacancies can be reduced.

After the insulating film 722 is formed, heat treatment may be performed. The heat treatment is performed at preferably 200° C. to 400° C. (e.g., 250° C. to 350° C.) in a nitrogen atmosphere, an atmosphere of ultra-dry air, or a rare gas (e.g., argon or helium) atmosphere. The water content in the gas is preferably 20 ppm or less, more preferably 1 ppm or less, further preferably 10 ppb or less. In this embodiment, for example, heat treatment is performed at 250° C. for one hour in a nitrogen atmosphere. Alternatively, RTA treatment for a short time at a high temperature may be performed before the formation of the conductive films 716 to 721, in a manner similar to that of the previous heat treatment performed on the oxide semiconductor film for reduction of moisture or hydrogen. Even when oxygen defects are generated in the oxide semiconductor layer 715 because of the previous heat treatment performed on the oxide semiconductor film, by performing heat treatment after the insulating film 722 containing oxygen is provided, oxygen is supplied to the oxide semiconductor layer 715 from the insulating film 722. By supplying oxygen to the oxide semiconductor layer 715, oxygen defects that serve as donors can be reduced in the oxide semiconductor layer 715 and the stoichiometric proportion can be satisfied. The oxide semiconductor layer 715 preferably contains much oxygen that exceeds the stoichiometric proportion. As a result, the oxide semiconductor layer 715 can be made to be substantially i-type and variation in electrical characteristics of the transistor due to oxygen vacancy can be reduced; thus, the electrical characteristics can be improved. There is no particular limitation on the timing of this heat treatment as long as it is after the formation of the insulating film 722. When this heat treatment doubles as another step such as heat treatment for formation of a resin film or heat treatment for reduction of the resistance of a transparent conductive film, the oxide semiconductor layer 715 can be made to be substantially i-type without increase in the number of steps.

Further, oxygen vacancies that serves as donors in the oxide semiconductor layer 715 may be reduced by performing heat treatment on the oxide semiconductor layer 715 in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. The purity of oxygen gas which is introduced into a heat treatment apparatus is preferably 6N (99.9999%) or higher, further preferably 7N (99.99999%) or higher (i.e., the impurity concentration in the oxygen is preferably 1 ppm or lower, further preferably 0.1 ppm or lower).

Alternatively, an ion implantation method, an ion doping method, or the like may be employed to add oxygen to the oxide semiconductor layer 715 so that oxygen vacancies serving as donors are reduced. For example, oxygen which is made into a plasma state with a microwave at 2.45 GHz may be added to the oxide semiconductor layer 715.

Note that a backgate electrode may be formed in a position overlapping with the oxide semiconductor layer 715 by forming a conductive film over the insulating film 722 and patterning the conductive film. In the case where the backgate electrode is formed, an insulating film is preferably formed to cover the backgate electrode. The backgate electrode can be formed using a material and a structure similar to those of the gate electrode 713 or the conductive films 716 to 721.

The thickness of the backgate electrode is 10 nm to 400 nm, preferably 100 nm to 200 nm. For example, the backgate electrode may be formed in a such a manner that a conductive film in which a titanium film, an aluminum film, and a titanium film are stacked is formed, a resist mask is formed by photolithography or the like, and unnecessary portions are removed by etching so that the conductive film is processed (patterned) into a desired shape.

Through the above steps, the transistor 724 is formed.

Note that there is no particular limitation on the structure of a transistor in the present invention. FIGS. 6A to 6D illustrate other structure examples of transistors including an oxide semiconductor. Note that the same portions as the transistor 724 and portions having functions similar to those of the transistor 724 can be formed in the above manner, and steps same as or similar to those of the transistor 724 can be performed in the above manner; therefore, the description is not repeated in this embodiment. In addition, the detailed description of the same portions is omitted.

Figure 6A:
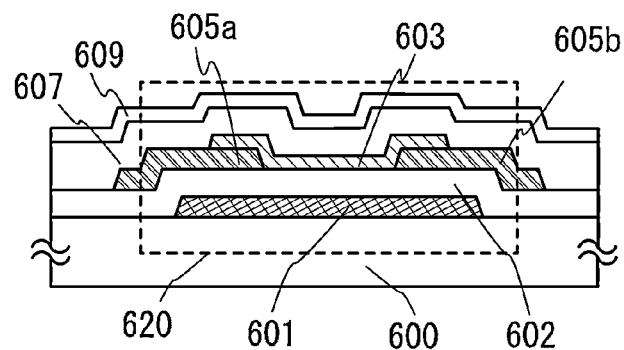
FIGS. 6A to 6D each illustrate an example of the structure of a transistor.

A transistor 620 illustrated in FIG. 6A is an example of a bottom-gate transistor in which a gate is formed below (on the substrate side in relation to) a semiconductor layer.

The transistor 620 has a bottom-gate structure and includes a gate electrode layer 601, a gate insulating layer 602 over the gate electrode layer 601, a source electrode layer 605a and a drain electrode layer 605b which are a pair of electrode layers formed over the gate insulating layer 602, and an island-shaped oxide semiconductor layer 603 that is in contact with the source electrode layer 605a, the drain electrode layer 605b, and the gate insulating layer 602 and overlaps with the gate electrode layer 601.

Figure 6B:
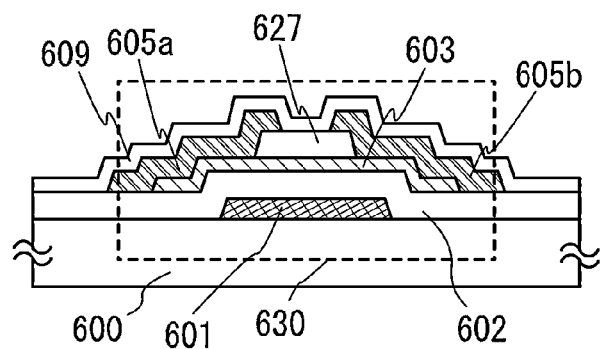

A transistor 630 illustrated in FIG. 6B has an example of a bottom-gate structure in which a channel protective layer is provided on the backchannel side in relation to an oxide semiconductor layer (the side opposite to a gate electrode). With the channel protective layer, damage to the oxide semiconductor layer at the time of etching a source electrode and a drain electrode can be suppressed.

The transistor 630 has a channel protective bottom-gate structure and includes a gate electrode layer 601, a gate insulating layer 602 over the gate electrode layer 601, an island-shaped oxide semiconductor layer 603 that overlaps the gate electrode layer 601 with the gate insulating layer 602 placed therebetween, a channel protective layer 627 that is in contact with the oxide semiconductor layer 603 and overlaps with a region of the oxide semiconductor layer 603 where a channel is formed, and a source electrode layer 605a and a drain electrode layer 605b which are a pair of electrode layers formed over the oxide semiconductor layer 603.

Figure 6C:
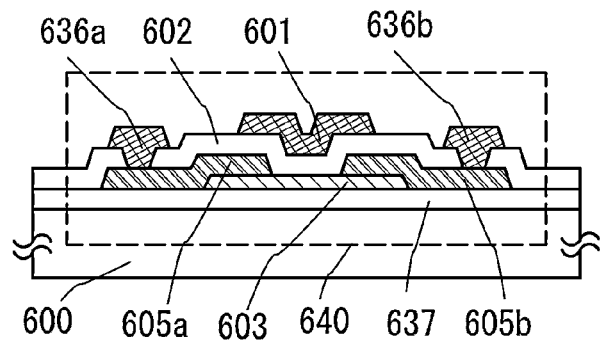

A transistor 640 illustrated in FIG. 6C is an example of a top-gate transistor.

The transistor 640 is a top-gate transistor including a base insulating layer 637, an island-shaped oxide semiconductor layer 603 over the base insulating layer 637, a source electrode layer 605a and a drain electrode layer 605b which are a pair of electrode layers in contact with the oxide semiconductor layer 603, a gate insulating layer 602 that is in contact with a channel formation region in the oxide semiconductor layer 603 between the source electrode layer 605a and the drain electrode layer 605b, and a gate electrode layer 601 that is over the gate insulating layer 602 and overlaps with the channel formation region in the oxide semiconductor layer 603.

Note that the transistor 640 may include a source wiring layer 636a and a drain wiring layer 636b that are connected to the source electrode layer 605a and the drain electrode layer 605b, respectively, through contact holes formed in the gate insulating layer 602.

Figure 6D:
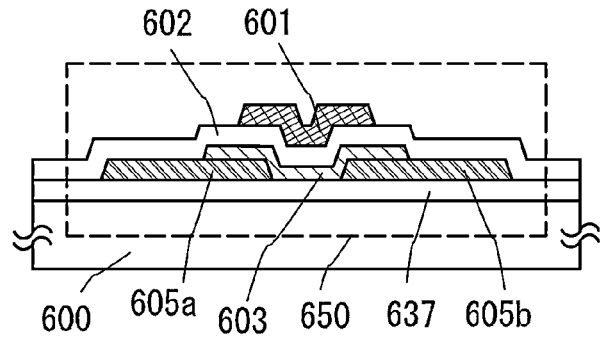

A transistor 650 illustrated in FIG. 6D is an example of a top-gate transistor having a structure different from that of the transistor 640.

The transistor 650 is a top-gate transistor including a base insulating layer 637; a source electrode layer 605a and a drain electrode layer 605b which are a pair of electrode layers over the base insulating layer 637; an oxide semiconductor layer 603 that fills a gap between the source electrode layer 605a and the drain electrode layer 605b; a gate insulating layer 602 over the source electrode layer 605a, the drain electrode layer 605b, and the oxide semiconductor layer 603; and a gate electrode layer 601 that is over the gate insulating layer 602 and overlaps with a region of the oxide semiconductor layer 603 where a channel is formed.

Note that like the transistor 640, the transistor 650 may include a source wiring layer and a drain wiring layer that are connected to the source electrode layer 605a and the drain electrode layer 605b, respectively, through contact holes formed in the gate insulating layer 602.

Although not illustrated, in a top-gate transistor such as the transistor 640 or the transistor 650, a second gate electrode layer (also referred to as a backgate electrode layer) may be formed between the substrate and the base insulating layer so as to overlap with the channel formation region in the oxide semiconductor layer 603. In this case, one of the two gate electrode layers may be referred to as a first gate electrode layer and the other may be referred to as a backgate electrode. The first gate electrode layer and the backgate electrode layer can be electrically connected to each other so as to function as one electrode.

By changing the potential of the backgate electrode layer, the threshold voltage of the transistor can be changed. The backgate electrode layer may be in a floating state (i.e., electrically insulated), or may be supplied with a potential or a fixed potential such as a ground potential or a common potential. By controlling the level of a potential applied to the backgate electrode layer, the threshold voltage of the transistor can be controlled.

In a top-gate structure, when the oxide semiconductor layer 603 is covered with the backgate electrode layer, light from the backgate electrode layer side can be prevented from entering the oxide semiconductor layer 603. Thus, photodegradation of the oxide semiconductor layer 603 can be prevented, and deterioration in characteristics of the transistor, such as a shift of the threshold voltage, can be prevented.

Note that an insulating film to be the insulating layer in contact with the oxide semiconductor layer 603 (which corresponds to the gate insulating layer 602, the insulating layer 607, the channel protective layer 627, and the base insulating layer 637 in this embodiment) is preferably formed using an insulating material containing a Group 13 element and oxygen. Many of oxide insulating materials contain elements of Group 13, and an insulating material containing a Group 13 element is compatible with an oxide semiconductor layer. Consequently, when an insulating material containing a Group 13 element is used for the insulating layer in contact with the oxide semiconductor layer, the state of the interface between the oxide semiconductor layer and the insulating layer can be kept favorable.

An insulating material containing a Group 13 element refers to an insulating material containing one or plural kinds of Group 13 elements. Examples of the insulating material containing a Group 13 element are gallium oxide, aluminum oxide, aluminum gallium oxide, and gallium aluminum oxide. Here, aluminum gallium oxide refers to a material in which the aluminum content is higher than that the gallium content in atomic percent (at. %), and gallium aluminum oxide refers to a material in which the gallium content is higher than the aluminum content in atomic percent (at. %).

For example, when a material containing gallium oxide is used for the insulating layer that is in contact with an oxide semiconductor layer containing gallium, characteristics at the interface between the oxide semiconductor layer and the insulating layer can be kept favorable. For example, when the oxide semiconductor layer and an insulating layer containing gallium oxide are provided in contact with each other, pile up of hydrogen at the interface between the oxide semiconductor layer and the insulating layer can be reduced. Note that a similar effect can be obtained in the case where an element in the same group as a constituent element of the oxide semiconductor layer is used for the insulating layer. For example, it is effective to form an insulating layer with the use of a material containing aluminum oxide. Note that water is not likely to permeate an aluminum oxide; therefore, it is preferable to use a material containing aluminum oxide in terms of preventing entry of water to the oxide semiconductor layer.

The insulating layer in contact with the oxide semiconductor layer 603 is preferably made to contain oxygen in a proportion higher than that in the stoichiometric composition by heat treatment in an oxygen atmosphere or by oxygen doping. Oxygen doping refers to addition of oxygen into a bulk. Note that the term "bulk" is used in order to clarify that oxygen is added not only to a surface of a thin film but also to the inside of the thin film. In addition, "oxygen doping" includes oxygen plasma doping by which oxygen plasma is added to a bulk. The oxygen doping may be performed by an ion implantation method or an ion doping method.

For example, in the case where an insulating film containing gallium oxide is used for the insulating layer in contact with the oxide semiconductor layer 603, the composition of gallium oxide can be set to be $Ga_2O_x$ ($x=3+\alpha$, where $0<\alpha<1$) by heat treatment in an oxygen atmosphere or by oxygen doping.

In the case where an insulating film containing aluminum oxide is used for the insulating layer in contact with the oxide semiconductor layer 603, the composition of aluminum oxide can be set to be $Al_2O_x$ ($x=3+\alpha$, where $0<\alpha<1$) by heat treatment in an oxygen atmosphere or by oxygen doping.

For example, in the case where an insulating film containing gallium aluminum oxide (aluminum gallium oxide) is used for the insulating layer in contact with the oxide semiconductor layer 603, the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film that includes a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen vacancies in the oxide semiconductor layer or at the interface between the oxide semiconductor layer and the insulating layer are reduced. Thus, the oxide semiconductor layer can be an i-type or substantially i-type oxide semiconductor.

The insulating layer including a region where the proportion of oxygen is higher than that in the stoichiometric composition may be used as either the insulating layer placed above the oxide semiconductor layer 603 or the insulating layer placed below the oxide semiconductor layer 603 of the insulating layers in contact with the oxide semiconductor layer 603; it is preferably used as both of the insulating layers in contact with the oxide semiconductor layer 603. The above-described effect can be enhanced with a structure where the insulating layers that include a region where the proportion of oxygen is higher than that in the stoichiometric composition are used as insulating layers placed above and below the insulating layers in contact with the oxide semiconductor layer 603 so that the oxide semiconductor layer 603 is sandwiched therebetween.

The insulating layers placed above and below the oxide semiconductor layer 603 may contain the same constituent element or different constituent elements. For example, both of the insulating layers placed above and below the oxide semiconductor layer 603 may be formed using gallium oxide whose composition is $Ga_2O_x$ ($x=3+\alpha$, where $0<\alpha<1$). Alternatively, one of these insulating layers may be formed using gallium oxide whose composition is $Ga_2O_x$ ($x=3+\alpha$, where $0<\alpha<1$) and the other thereof may be formed using aluminum oxide whose composition is $Al_2O_x$ ($x=3+a$, where $0<\alpha<1$).

The insulating layer in contact with the oxide semiconductor layer 603 may be a stack of insulating films each of which includes a region where the proportion of oxygen is higher than that in the stoichiometric composition. For example, the insulating layer placed above the oxide semiconductor layer 603 may be formed as follows: gallium oxide whose composition is $Ga_2O_x$ ($x=3+\alpha$, where $0<\alpha<1$) is formed and gallium aluminum oxide (aluminum gallium oxide) whose composition is $Ga_xAl_{2-x}O_{3+\alpha}$ ($0<x<2$, $0<\alpha<1$) is formed thereover. Note that it is possible that the insulating layer placed below the oxide semiconductor layer 603, or both of the insulating layers placed above and below the oxide semiconductor layer 603 may be a stack of insulating films each of which includes a region where the proportion of oxygen is higher than that in the stoichiometric composition.

Any of the above transistors can have an extremely low off-state current. With the use of such a transistor, the photosensor to which one embodiment of the present invention can be applied can be fabricated. Further, by using the photosensor to which one embodiment of the present invention is applied, a solid-state imaging device and a semiconductor display device with low power consumption can be provided.

This embodiment can be implemented in combination with any of the other embodiments as appropriate.

Embodiment 3

The actually measured field-effect mobility of an insulated gate transistor can be lower than its original mobility because of a variety of reasons; this phenomenon occurs not only in the case of using a transistor whose channel is formed in an oxide semiconductor layer. One of the reasons that reduce the mobility is a defect inside a semiconductor or a defect at an interface between the semiconductor and an insulating film. When a Levinson model is used, the field-effect mobility that is based on the assumption that no defect exists inside the semiconductor can be calculated theoretically.

Assuming that the original mobility of a semiconductor is $\mu_0$ and a potential barrier (such as a grain boundary) exists in the semiconductor, the measured field-effect mobility $\mu$ can be expressed as the following Formula 2.

$$\mu = \mu_0 \exp\left(-\frac{E}{kT}\right) \quad \text{[Formula 2]}$$

In Formula 2, E represents the height of the potential barrier, k represents the Boltzmann constant, and T represents the absolute temperature. When the potential barrier is assumed to be attributed to a defect, the height E of the potential barrier is expressed as the following Formula 3 according to the Levinson model.

$$E = \frac{e^2 N^2}{8\varepsilon n} = \frac{e^3 N^2 t}{8\varepsilon C_{ox} V_g} \quad \text{[Formula 3]}$$

In Formula 3, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region is expressed as the following Formula 4.

$$I_d = \frac{W \mu V_g V_d C_{ox}}{L} \exp\left(-\frac{E}{kT}\right) \quad \text{[Formula 4]}$$

In Formula 4, L represents the channel length and W represents the channel width, and L and W are each 10 μm. In addition, $V_d$ represents the drain voltage. When dividing both sides of Formula 4 by $V_g$ and then taking logarithms of both sides, the following Formula 5 is obtained.

$$\ln\left(\frac{I_d}{V_g}\right) = \ln\left(\frac{W\mu V_d C_{ox}}{L}\right) - \frac{E}{kT} \quad \text{[Formula 5]}$$
$$= \ln\left(\frac{W\mu V_d C_{ox}}{L}\right) - \frac{e^3 N^2 t}{8kT\varepsilon C_{ox} V_g}$$

The right side of Formula 5 is a function of $V_g$. From Formula 5, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, $\mu_0$ can be calculated to be 120 cm²/Vs from Formula 2 and Formula 3. The measured mobility of an In—Sn—Zn oxide including a defect is approximately 40 cm²/Vs. However, assuming that no defect exists inside an oxide semiconductor and at the interface between the oxide semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer adversely affects the transport properties of the transistor. In other words, the mobility $\mu_1$ at a position that is distance x away from the interface between the channel and the gate insulating layer can be expressed as the following Formula 6.

$$\frac{1}{\mu_1} = \frac{1}{\mu_0} + \frac{D}{B}\exp\left(-\frac{x}{G}\right) \quad \text{[Formula 6]}$$

In Formula 6, D represents the electric field in the gate direction, and B and G are constants. B and G can be obtained from actual measurement results; according to the above measurement results, B is $4.75\times10^7$ (cm/s) and G is 10 (nm) (the depth to which the influence of interface scattering reaches). When D is increased (i.e., when the gate voltage is increased), the second term of Formula 6 is increased and accordingly the mobility $\mu_1$ is decreased.

Figure 19:
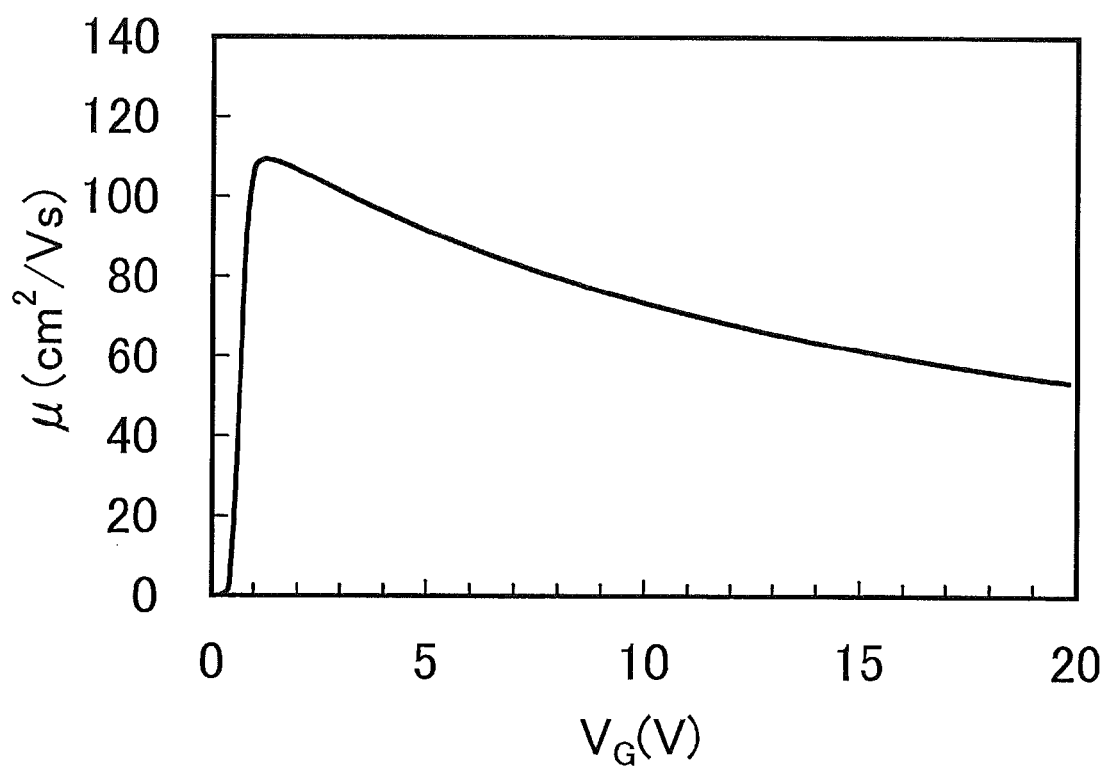
FIG. 19 shows gate voltage dependence of mobility obtained by calculation.

FIG. 19 shows calculation results of the mobility $\mu_2$ of a transistor whose channel is formed using an ideal oxide semiconductor without a defect inside the semiconductor. In FIG. 19, the horizontal axis indicates gate voltage $V_G$ (unit: V) and the vertical axis indicates mobility $\mu_2$ (unit: cm²/Vs). For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 19, the mobility $\mu_2$ has a peak of more than 100 cm²/Vs at a gate voltage $V_G$ of slightly over 1 V, and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors formed using an oxide semiconductor having such a mobility are shown in FIGS. 20A to 20C, FIGS. 21A to 21C, and FIGS. 22A to 22C. FIGS. 23A and 23B illustrate cross-sectional structures of the transistors used for the calculation. The transistors illustrated in FIGS. 23A and 23B each include a semiconductor region 1030a and a semiconductor region 1030c that have n⁺-type conductivity in an oxide semiconductor layer. The resistivity of the semiconductor regions 1030a and 1030c is $2\times10^{-3}$ Ωcm.

The transistor in FIG. 23A is formed over a base insulating layer 1010 and an embedded insulator 1020 that is embedded in the base insulating layer 1010 and formed of aluminum oxide. The transistor includes the semiconductor region 1030a, the semiconductor region 1030c, an intrinsic semiconductor region 1030b that is placed between the semiconductor regions 1030a and 1030c and serves as a channel formation region, and a gate 1050. The width of the gate 1050 is 33 nm.

A gate insulating layer 1040 is formed between the gate 1050 and the semiconductor region 1030b. A sidewall insulator 1060a and a sidewall insulator 1060b are formed on both side surfaces of the gate 1050, and an insulator 1070 is formed over the gate 1050 so as to prevent a short circuit between the gate 1050 and another wiring. The sidewall insulator has a width of 5 nm. A source 1080a and a drain 1080b are provided in contact with the semiconductor region 1030a and the semiconductor region 1030c, respectively. Note that the channel width of this transistor is 40 nm.

The transistor in FIG. 23B is the same as the transistor in FIG. 23A in that it is formed over the base insulating layer 1010 and the embedded insulator 1020 formed of aluminum oxide and that it includes the semiconductor region 1030a, the semiconductor region 1030c, the intrinsic semiconductor region 1030b provided therebetween, the gate 1050 having a width of 33 nm, the gate insulating layer 1040, the sidewall insulator 1060a, the sidewall insulator 1060b, the insulator 1070, the source 1080a, and the drain 1080b.

The difference between the transistor in FIG. 23A and the transistor in FIG. 23B is the conductivity type of semiconductor regions under the sidewall insulators 1060a and 1060b. In the transistor in FIG. 23A, the semiconductor regions under the sidewall insulator 1060a and the sidewall insulator 1060b are part of the semiconductor region 1030a having n⁺-type conductivity and part of the semiconductor region 1030c having n⁺-type conductivity, whereas in the transistor in FIG. 23B, the semiconductor regions under the sidewall insulator 1060a and the sidewall insulator 1060b are part of the intrinsic semiconductor region 1030b. In other words, in FIG. 23B, there is a region with a width $L_{off}$ in which the gate 1050 does not overlap with the semiconductor region 1030a (the semiconductor region 1030c). This region is called an offset region, and the width $L_{off}$ is called an offset length. As is seen from the drawing, the offset length is equal to the width of the sidewall insulator 1060a (the sidewall insulator 1060b).

Figure 20A:
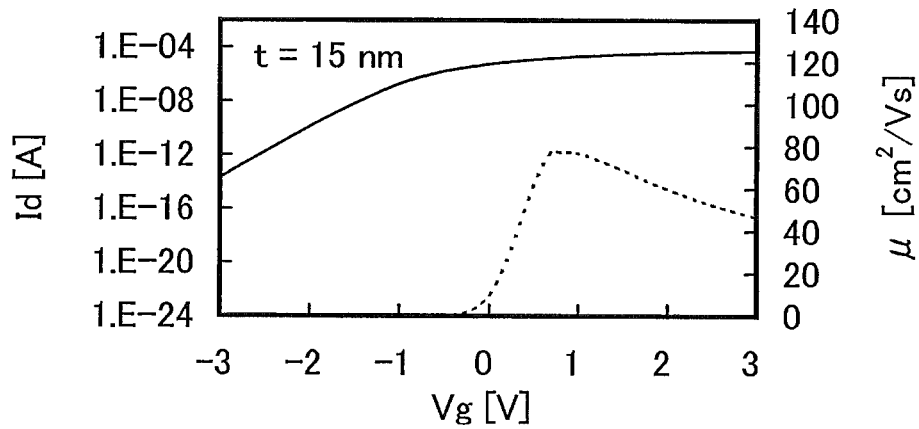
FIGS. 20A to 20C show gate voltage dependence of drain current and mobility, obtained by calculation.
Figure 20B:
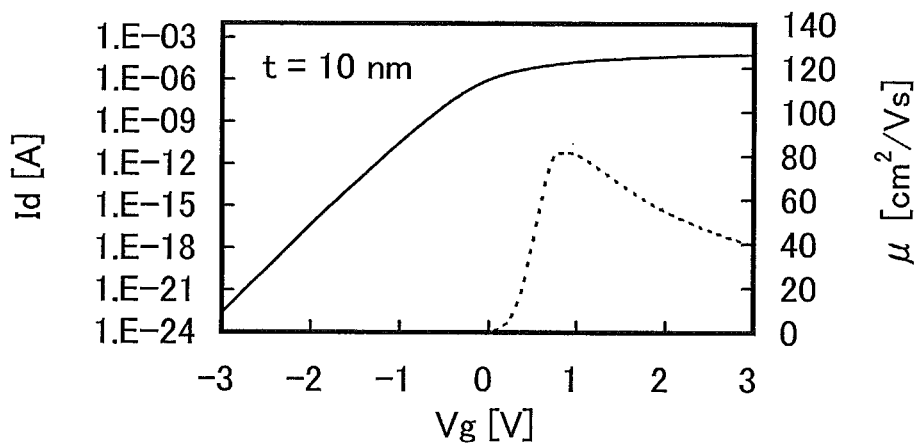
Figure 20C:
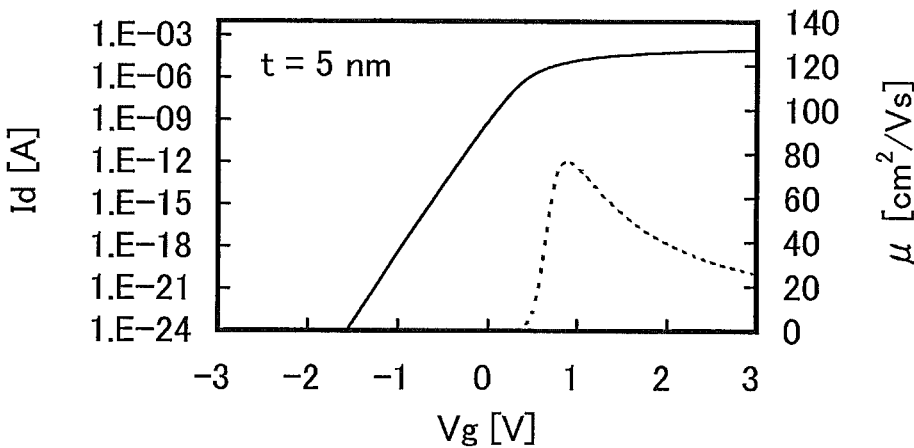

The other parameters used in calculation are as described above. For the calculation, device simulation software Sentaurus Device manufactured by Synopsys, Inc. was used. FIGS. 20A to 20C show the gate voltage ($V_g$: a potential difference between the gate and the source) dependence of the drain current ($I_d$, a solid line) and the mobility (μ, a dotted line) of the transistor having the structure illustrated in FIG. 23A. The drain current $I_d$ is obtained by calculation under the assumption that the drain voltage (a potential difference between the drain and the source) is +1 V, and the mobility μ is obtained by calculation under the assumption that the drain voltage is +0.1 V. In FIGS. 20A to 20C, the horizontal axis indicates gate voltage $V_g$ (unit: V) and the vertical axis indicates drain current $I_d$ (unit: A) and mobility μ (unit: cm²/Vs).

FIG. 20A shows the gate voltage dependence of the transistor in the case where the thickness t of the gate insulating layer is 15 nm, FIG. 20B shows that of the transistor in the case where the thickness t of the gate insulating layer is 10 nm, and FIG. 20C shows that of the transistor in the case where the thickness t of the gate insulating layer is 5 nm. As the gate insulating layer is thinner, the drain current $I_d$ in the off state (the off-state current) in particular is significantly decreased. In contrast, there is no noticeable change in the peak value of the mobility μ and the drain current $I_d$ in the on state (the on-state current). The graphs show that the drain current $I_d$ exceeds 10 μA at a gate voltage $V_g$ of around 1 V.

Figure 21A:
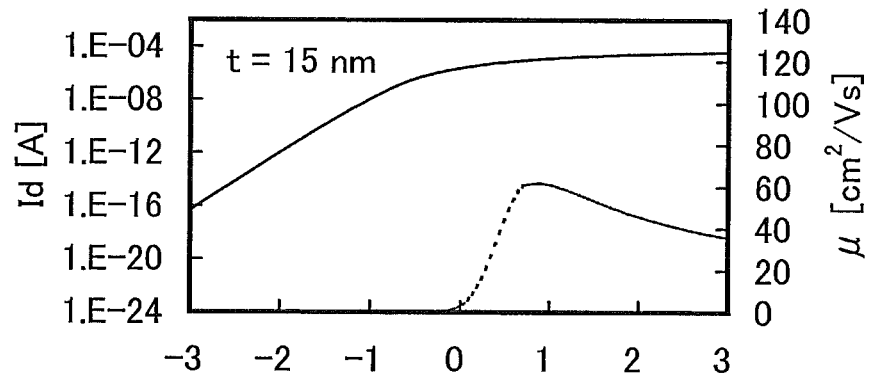
FIGS. 21A to 21C show gate voltage dependence of drain current and mobility, obtained by calculation.
Figure 21B:
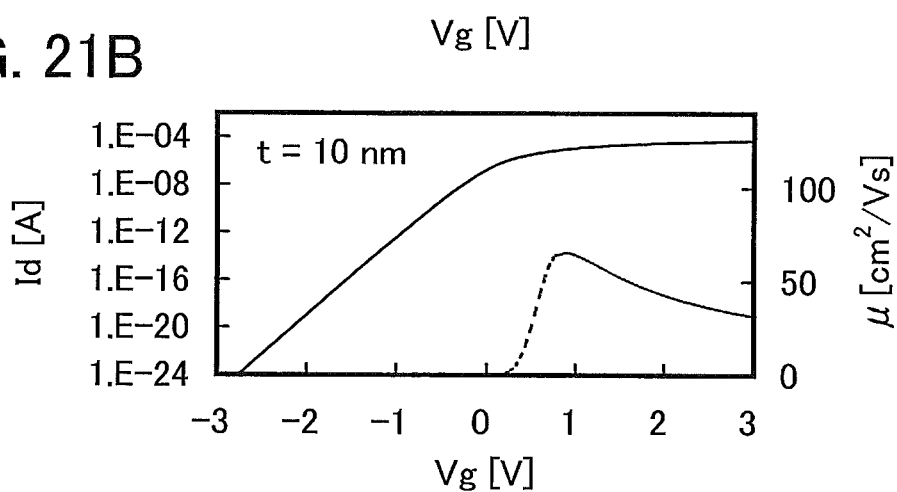
Figure 21C:
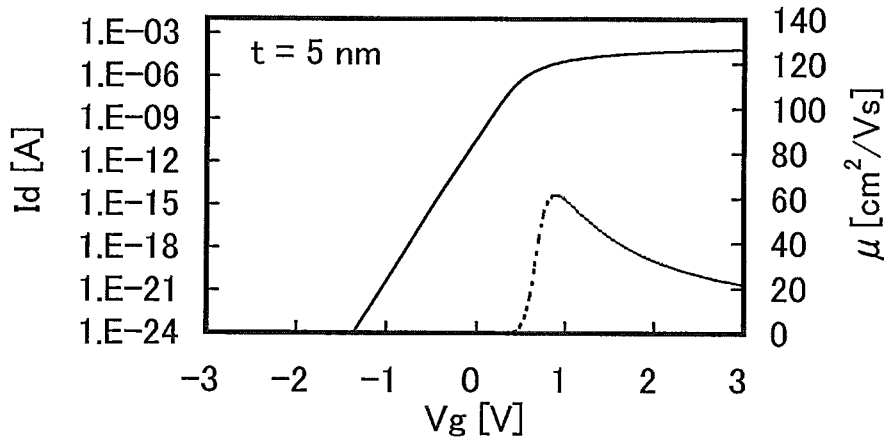

FIGS. 21A to 21C show the gate voltage $V_g$ dependence of the drain current $I_d$ (a solid line) and the mobility μ (a dotted line) of the transistor having the structure in FIG. 23B and an offset length $L_{off}$ of 5 nm. The drain current $I_d$ is obtained by calculation under the assumption that the drain voltage is +1 V and the mobility μ is obtained by calculation under the assumption that the drain voltage is +0.1 V. FIG. 21A shows the gate voltage dependence of the transistor in the case where the thickness t of the gate insulating layer is 15 nm, FIG. 21B shows that of the transistor in the case where the thickness t of the gate insulating layer is 10 nm, and FIG. 21C shows that of the transistor in the case where the thickness t of the gate insulating layer is 5 nm. In FIGS. 21A to 21C, the horizontal axis indicates gate voltage $V_g$ (unit: V) and the vertical axis indicates drain current $I_d$ (unit: A) and mobility μ (unit: cm²/Vs).

Figure 22A:
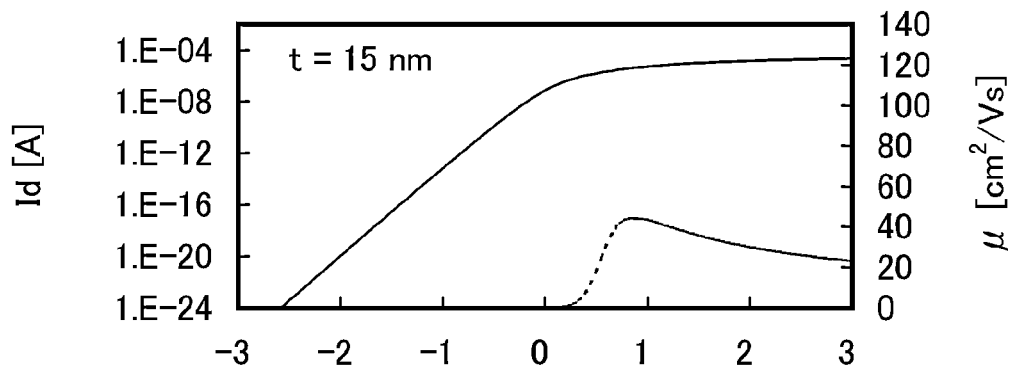
FIGS. 22A to 22C show gate voltage dependence of drain current and mobility, obtained by calculation.
Figure 22B:
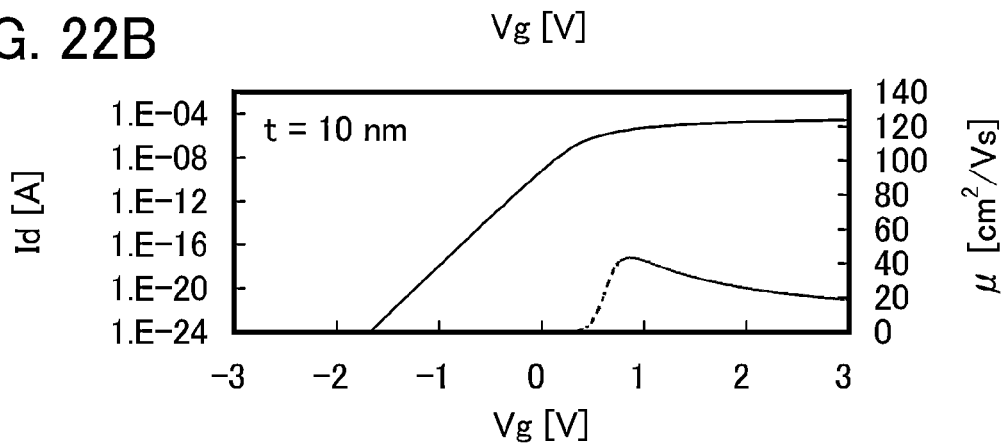
Figure 22C:
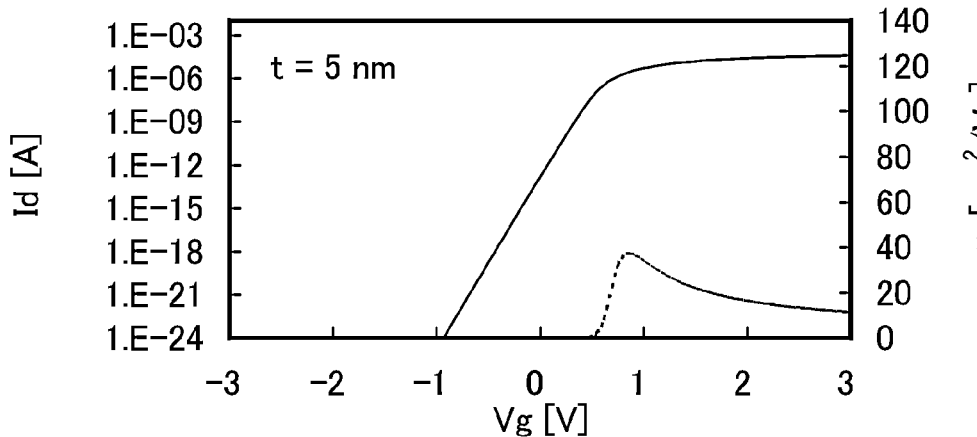
Figure 23A:
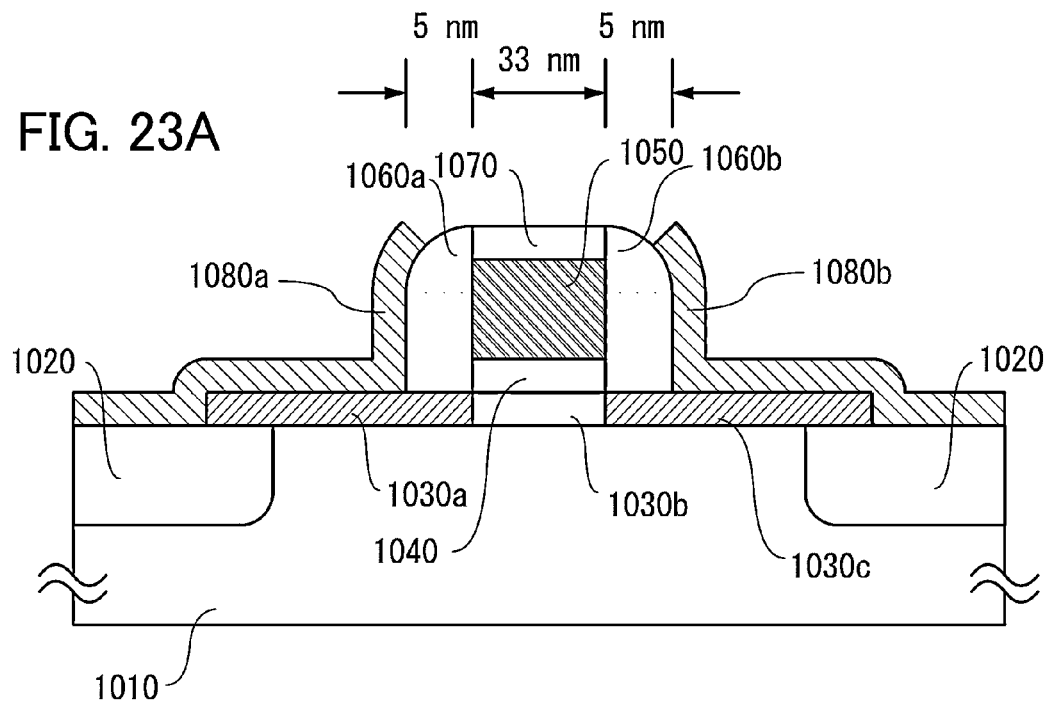
FIGS. 23A and 23B show cross-sectional structures of transistors used in calculation.
Figure 23B:
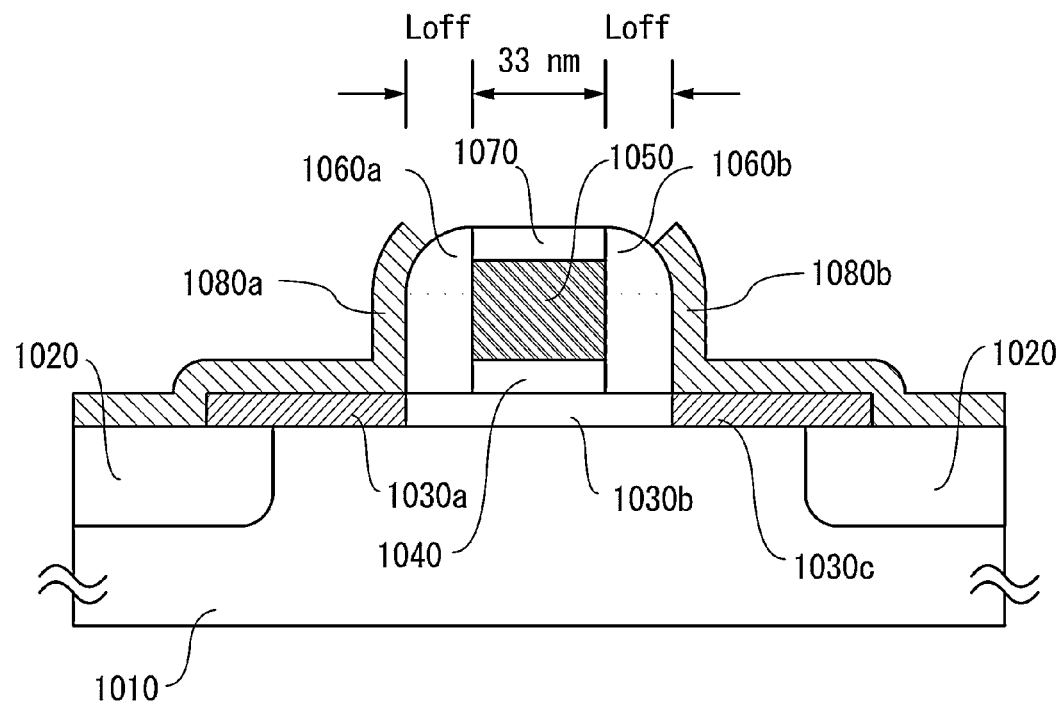

FIGS. 22A to 22C show the gate voltage dependence of the drain current $I_d$ (a solid line) and the mobility μ (a dotted line) of the transistor having the structure in FIG. 23B and an offset length $L_{off}$ of 15 nm. The drain current $I_d$ is obtained by calculation under the assumption that the drain voltage is +1 V and the mobility μ is obtained by calculation under the assumption that the drain voltage is +0.1 V. FIG. 22A shows the gate voltage dependence of the transistor in the case where the thickness t of the gate insulating layer is 15 nm, FIG. 22B shows that of the transistor in the case where the thickness t of the gate insulating layer is 10 nm, and FIG. 22C shows that of the transistor in the case where the thickness t of the gate insulating layer is 5 nm. In FIGS. 22A to 22C, the horizontal axis indicates gate voltage $V_g$ (unit: V) and the vertical axis indicates drain current $I_d$ (unit: A) and mobility μ (unit: cm²/Vs).

In either of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 20A to 20C, approximately 60 cm²/Vs in FIGS. 21A to 21C, and approximately 40 cm²/Vs in FIGS. 22A to 22C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current $I_d$ exceeds 10 μA at a gate voltage $V_g$ of around 1 V.

A transistor in which an oxide semiconductor including In, Sn, and Zn as main components is used for a channel formation region can have favorable characteristics by depositing the oxide semiconductor while heating a substrate or by performing heat treatment after the oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 24A:
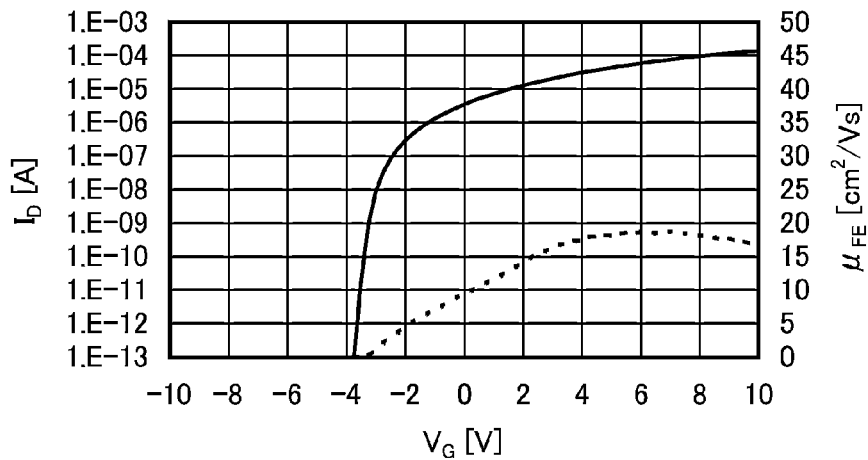
FIGS. 24A to 24C show results of characteristics of a transistor.
Figure 24B:
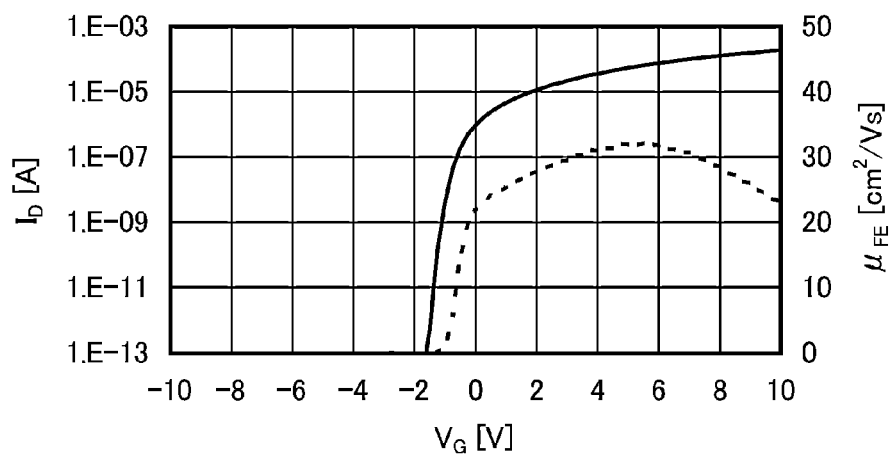
Figure 24C:
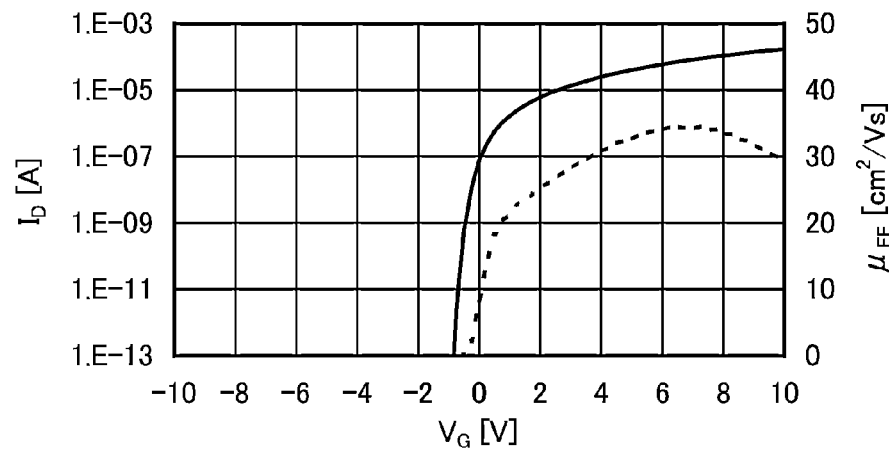

As an example, FIGS. 24A to 24C each show characteristics (gate voltage dependence of drain current $I_D$ (a solid line) and mobility $μ_{FE}$ (a dotted line)) of a transistor that includes an oxide semiconductor film including In, Sn, and Zn as main components and having a channel length L of 3 μm and a channel width W of 10 μm, and a gate insulating film with a thickness of 100 nm. Note that $V_D$ was set to 10 V. In FIGS. 24A to 24C, the horizontal axis indicates gate voltage $V_G$ (unit: V) and the vertical axis indicates drain current $I_D$ (unit: A) and mobility $μ_{FE}$ (unit: cm²/Vs).

FIG. 24A shows characteristics of a transistor whose oxide semiconductor film including In, Sn, and Zn as main components was formed by sputtering without heating a substrate intentionally. The peak of the field-effect mobility of the transistor is 18.8 cm²/Vs. On the other hand, when the oxide semiconductor film including In, Sn, and Zn as main components is formed while heating the substrate intentionally, the field-effect mobility can be improved. FIG. 24B shows characteristics of a transistor whose oxide semiconductor film including In, Sn, and Zn as main components was formed while heating a substrate at 200° C. The peak of the field-effect mobility of the transistor is 32.2 cm²/Vs.

The field-effect mobility can be further improved by performing heat treatment after formation of the oxide semiconductor film including In, Sn, and Zn as main components. FIG. 24C shows characteristics of a transistor whose oxide semiconductor film including In, Sn, and Zn as main components was formed by sputtering at 200° C. and then subjected to heat treatment at 650° C. The peak of the field-effect mobility of the transistor is 34.5 cm²/Vs.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being purified by removal of impurities from the oxide semiconductor. In the case of using such a purified non-single-crystal oxide semiconductor, ideally, a field-effect mobility exceeding 100 cm$^2$/Vs is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 24A and 24B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and a drain voltage $V_{ds}$ of 10 V. Then, the substrate temperature was set to 150° C. and $V_{ds}$ was set to 0.1 V. After that, $V_g$ of 20 V was applied so that the intensity of an electric field applied to the gate insulating layer was 2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a positive BT test.

In a similar manner, first, $V_g$-$I_d$ characteristics of the transistors were measured at a substrate temperature of 25° C. and $V_{ds}$ of 10 V. Then, the substrate temperature was set at 150° C. and $V_{ds}$ was set to 0.1 V. After that, $V_g$ of −20 V was applied so that the intensity of an electric field applied to the gate insulating layer was −2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a negative BT test.

Figure 25A:
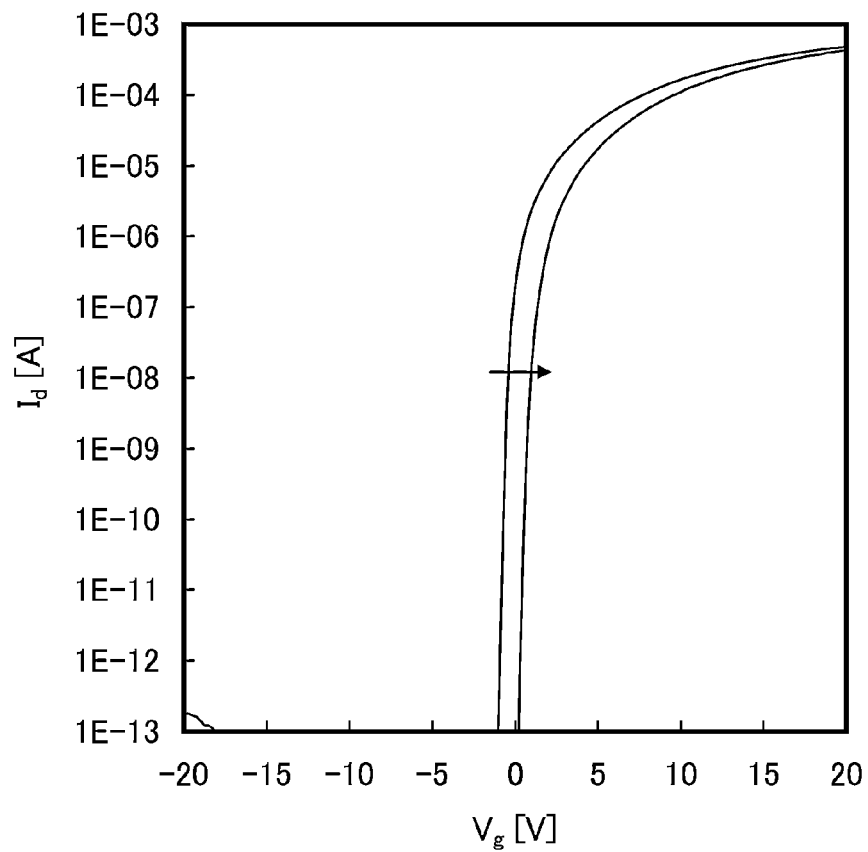
FIGS. 25A and 25B show results of characteristics of a transistor.
Figure 25B:
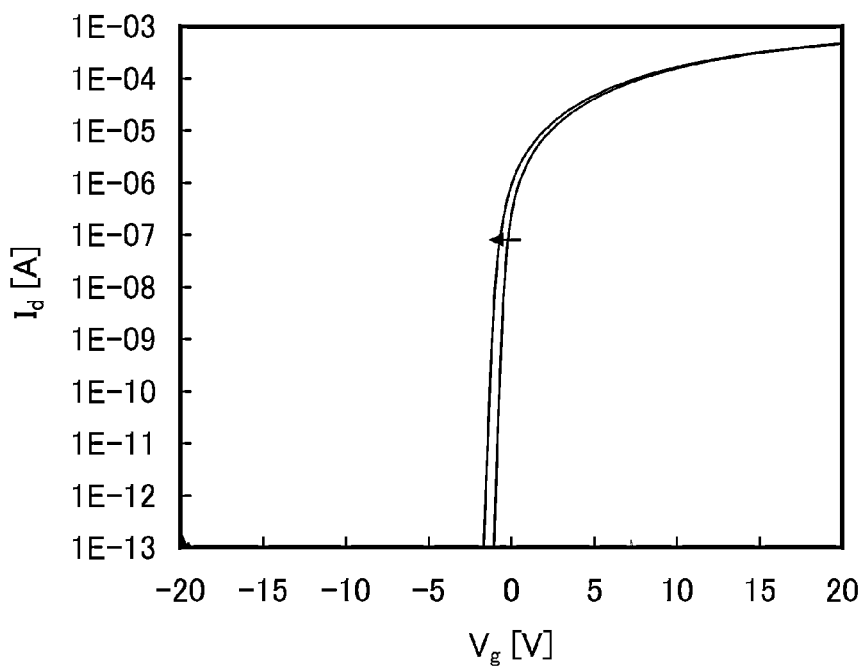
Figure 26A:
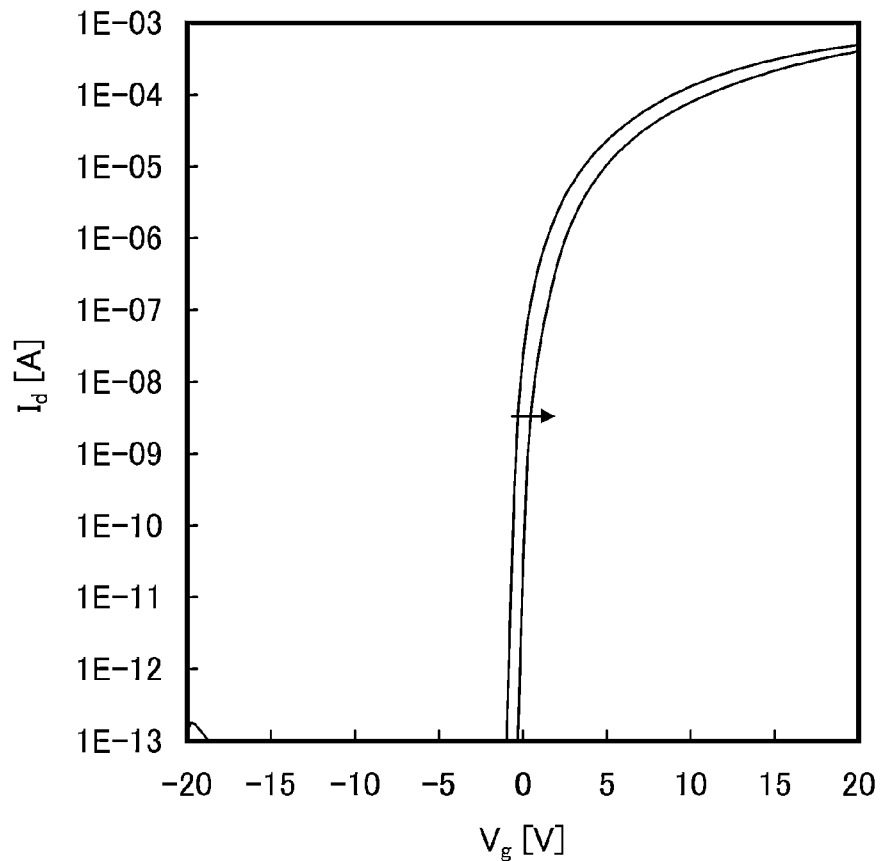
FIGS. 26A and 26B show results of characteristics of a transistor.
Figure 26B:
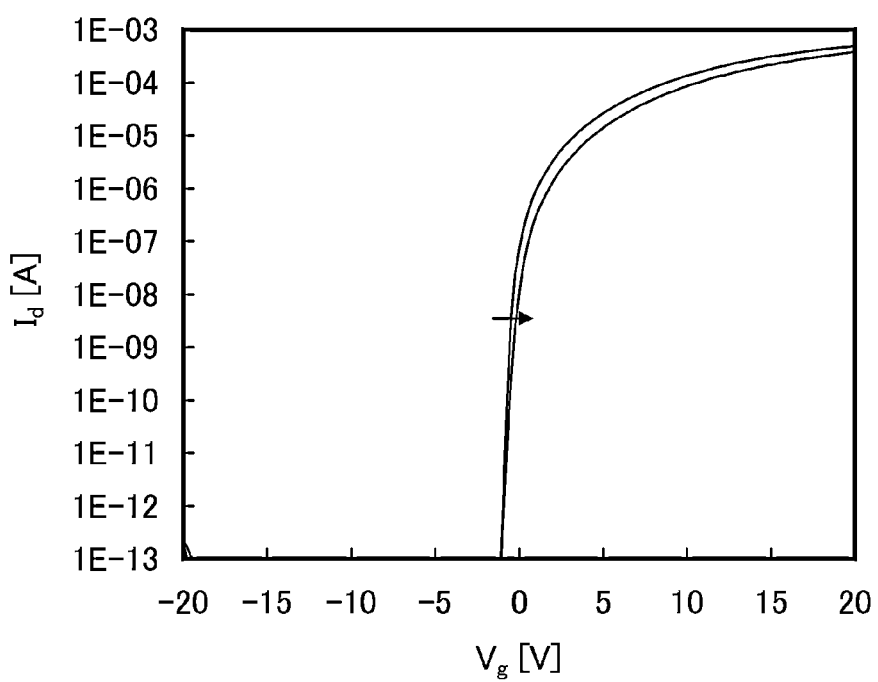

FIGS. 25A and 25B show results of the positive BT test and the negative BT test, respectively, of Sample 1. FIGS. 26A and 26B show results of the positive BT test and the negative BT test, respectively, of Sample 2. In FIGS. 25A and 25B and FIGS. 26A and 26B, the horizontal axis indicates gate voltage $V_g$ (unit: V) and the vertical axis indicates drain current $I_d$ (unit: A).

The amount of shift in the threshold voltage of Sample 1 due to the positive BT test and that due to the negative BT test were 1.80 V and 0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor or at an interface between the oxide semiconductor and a film in contact with the oxide semiconductor; when excess oxygen is included in the oxide semiconductor by the heat treatment, oxygen vacancy caused constantly can be compensated for with excess oxygen. The excess oxygen is mainly oxygen existing between lattices. When the concentration of oxygen is set in the range of $1\times10^{16}$/cm$^3$ to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film that is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample formed in this manner was used as Sample A.

Next, a sample formed by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 27:
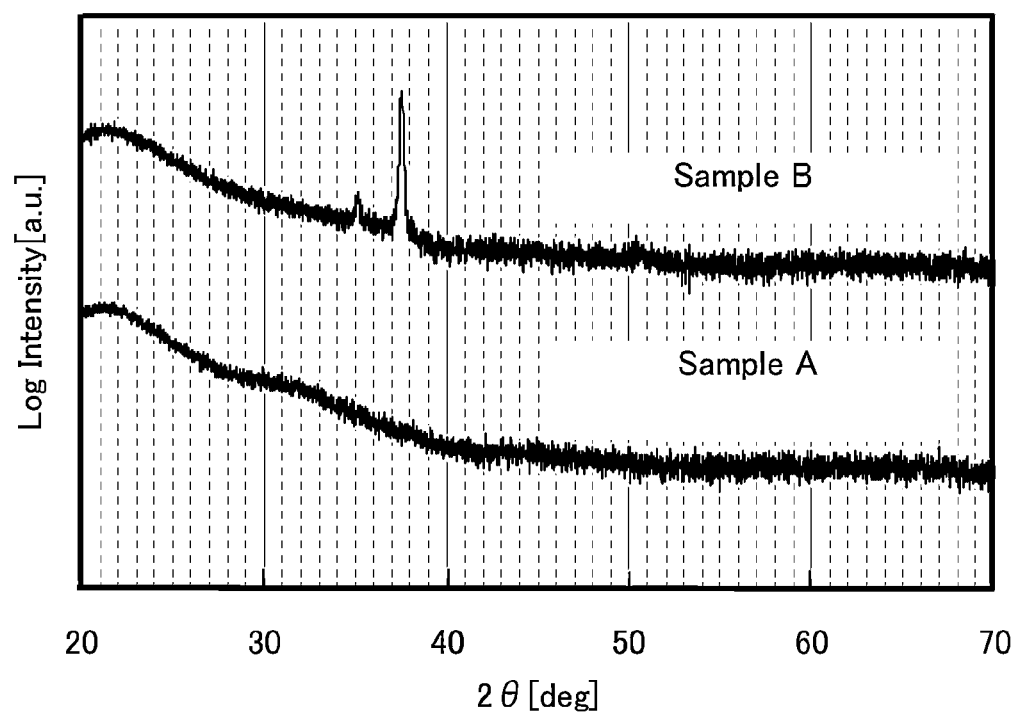
FIG. 27 shows XRD spectra of transistors.

FIG. 27 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 28:
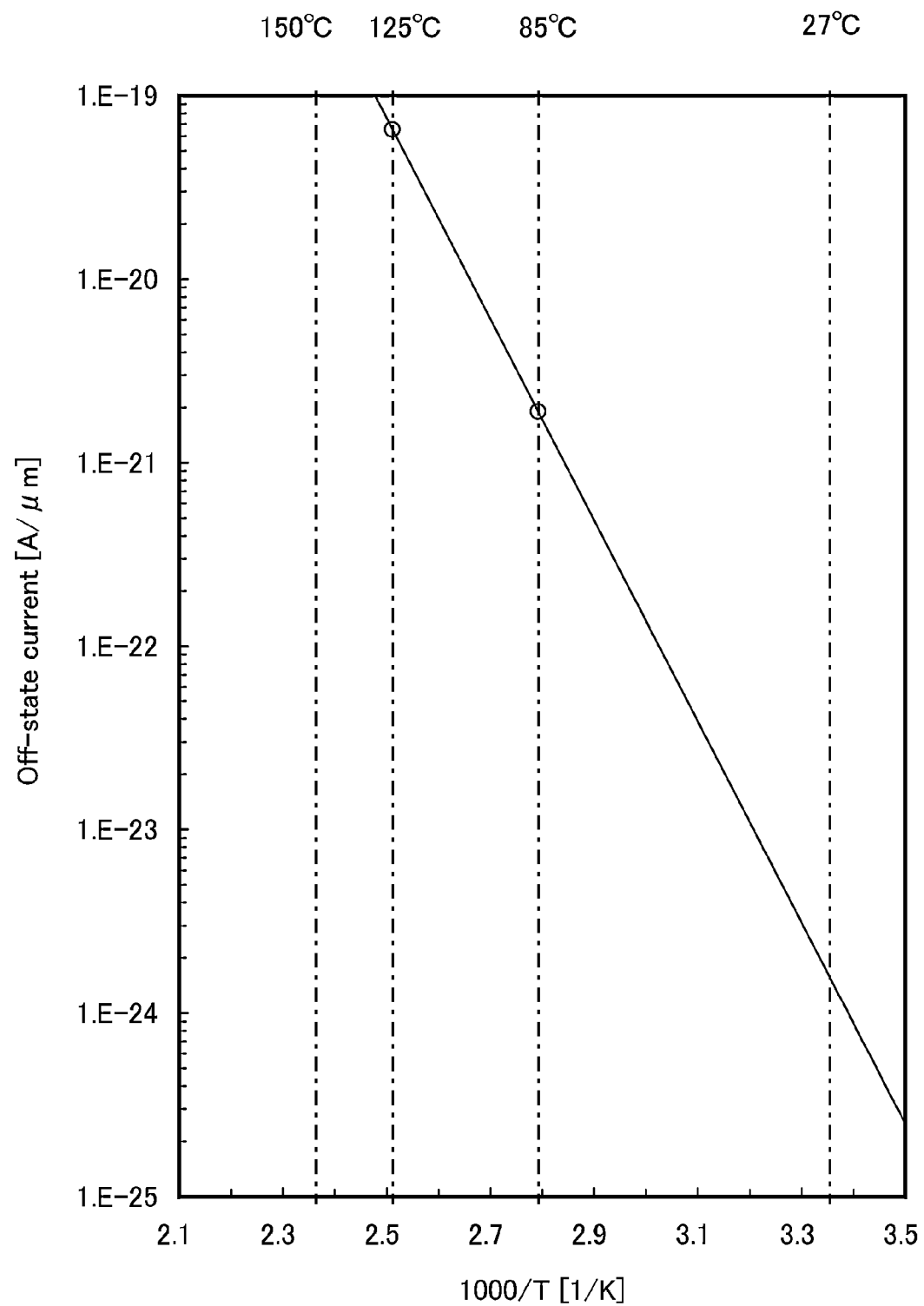
FIG. 28 shows results of characteristics of a transistor.

Specifically, FIG. 28 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000. Moreover, the vertical axis in FIG. 28 indicates off-state current (unit: aA/μm). As shown in FIG. 28, the off-state current of the transistor can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor film during formation of the film, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of the transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 29:
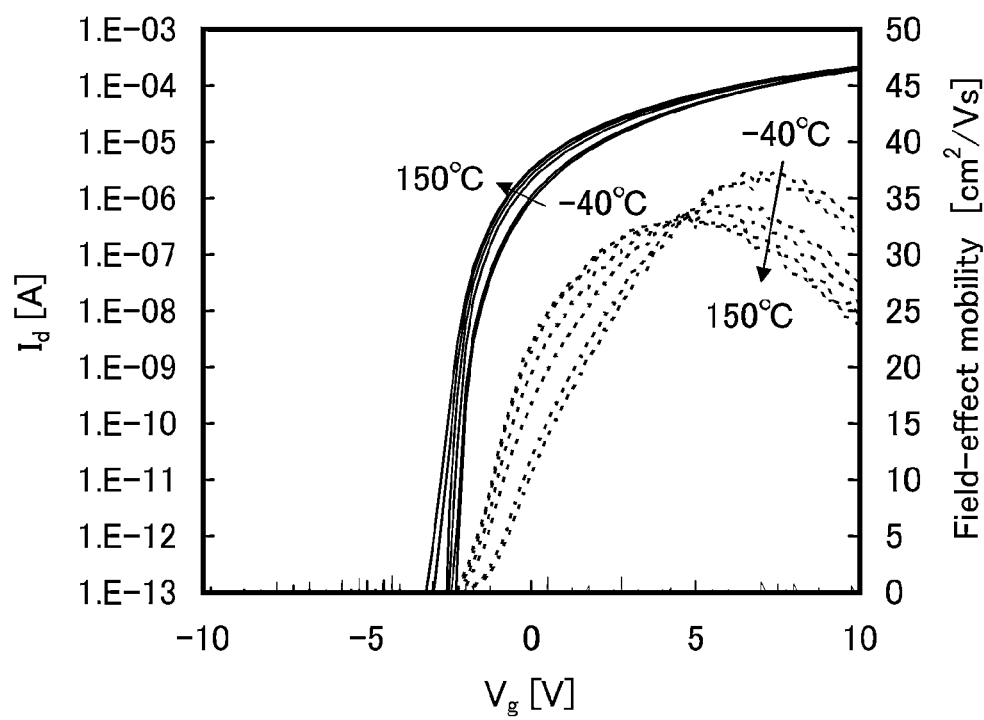
FIG. 29 shows results of characteristics of a transistor.
Figure 30A:
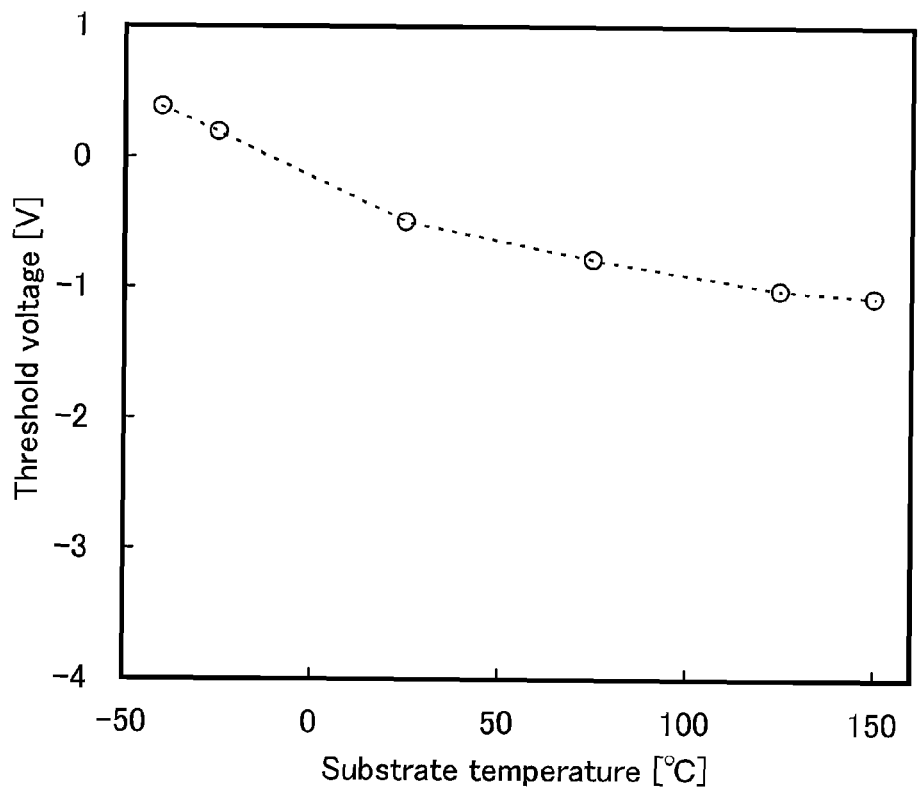
FIGS. 30A and 30B show results of characteristics of a transistor.

FIG. 29 shows the $V_g$ dependence of $I_d$ (a solid line) and field-effect mobility (a dotted line). FIG. 30A shows a relation between the substrate temperature and the threshold voltage, and FIG. 30B shows a relation between the substrate temperature and the field-effect mobility.

From FIG. 30A, it is found that the threshold voltage gets lower as the substrate temperature increases. Note that the threshold voltage is decreased from 0.38 V to 1.08 V in the range from −40° C. to 150° C.

Figure 30B:
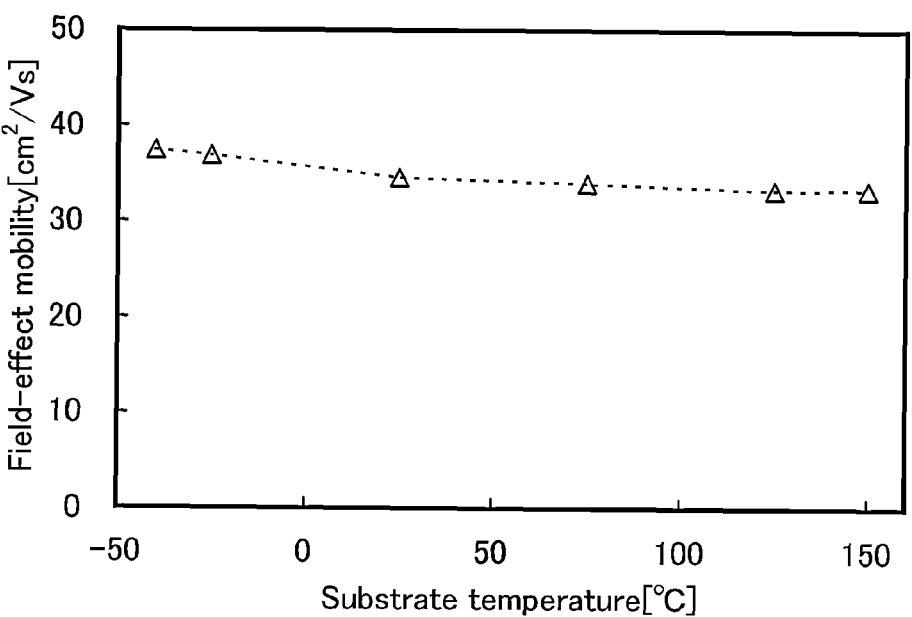

From FIG. 30B, it is found that the field-effect mobility gets lower as the substrate temperature increases. Note that the field-effect mobility is decreased from 37.4 cm²/Vs to 33.4 cm²/Vs in the range from −40° C. to 150° C. Thus, it is found that variation in electric characteristics is small in the above temperature range.

In a transistor in which such an oxide semiconductor including In, Sn, and Zn as main components is used for a channel formation region, a field-effect mobility of 30 cm²/Vs or higher, preferably 40 cm²/Vs or higher, further preferably 60 cm²/Vs or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for the operation of a transistor. With such characteristics, an integrated circuit having a novel function can be realized without decreasing the operation speed even when a transistor including an oxide semiconductor is provided in an integrated circuit formed using a Si semiconductor.

This embodiment can be implemented in appropriate combination with the structures described in the other embodiments.

Embodiment 4

In this embodiment, examples of electronic devices including the semiconductor device according to one embodiment of the present invention will be described with reference to FIGS. 7A to 7E.

The semiconductor device according to one embodiment of the present invention can be used for display devices, laptops, and image reproducing devices provided with recording media (typically, devices that reproduce the content of recording media such as digital versatile discs (DVDs) and have displays for displaying the reproduced images). Other examples of electronic devices that can include the semiconductor device according to one embodiment of the present invention are mobile phones, portable game machines, personal digital assistants, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), and vending machines.

Figure 7A:
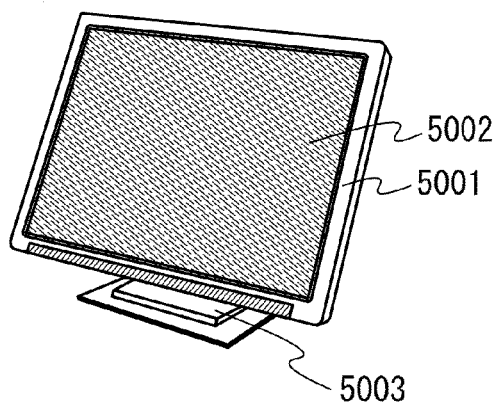
FIGS. 7A to 7E each illustrate an example of an electronic device.

FIG. 7A illustrates a display device including a housing 5001, a display portion 5002, a supporting base 5003, and the like. The semiconductor device according to one embodiment of the present invention can be used for the display portion 5002. By using the semiconductor device according to one embodiment of the present invention for the display portion 5002, high-contrast image data can be obtained. The display device includes, in its category, any display device for displaying information, such as display devices for personal computers, TV broadcast reception, advertisement, and the like.

Figure 7B:
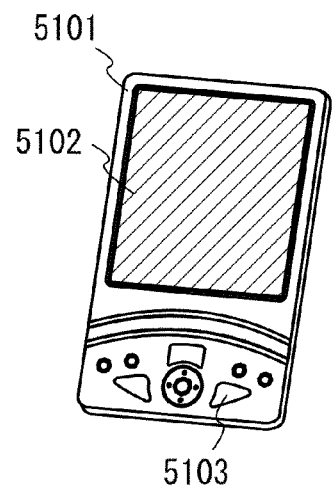

FIG. 7B illustrates a personal digital assistant including a housing 5101, a display portion 5102, operation keys 5103, and the like. The semiconductor device according to one embodiment of the present invention can be used for the display portion 5102. By using the semiconductor device according to one embodiment of the present invention for the display portion 5102, high-contrast image data can be obtained or power consumption of the personal digital assistant can be reduced.

Figure 7C:
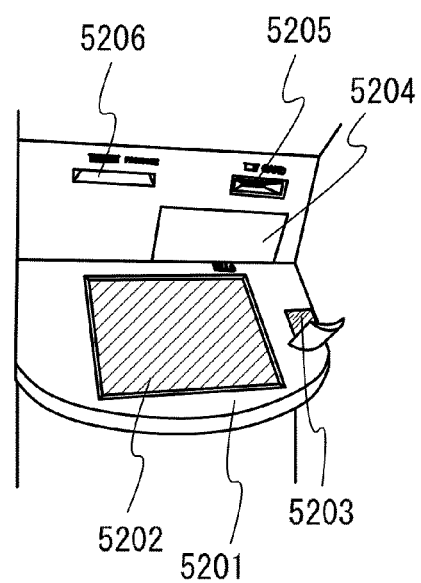

FIG. 7C illustrates an automated teller machine that includes a housing 5201, a display portion 5202, a coin slot 5203, a paper money slot 5204, a card slot 5205, a passbook slot 5206, and the like. The semiconductor device according to one embodiment of the present invention can be used for the display portion 5202. By using the semiconductor device according to one embodiment of the present invention for the display portion 5202, high-contrast image data can be obtained. In addition, the automated teller machine including the semiconductor device according to one embodiment of the present invention can read biometric information such as a finger print, a face, a handprint, a palm print, a pattern of a hand vein, an iris, and the like used for biometric authentication with higher accuracy. It is therefore possible to reduce a false non-match rate which is false recognition of a person to be identified as a different person and a false acceptance rate which is false recognition of a different person as a person to be identified.

Figure 7D:
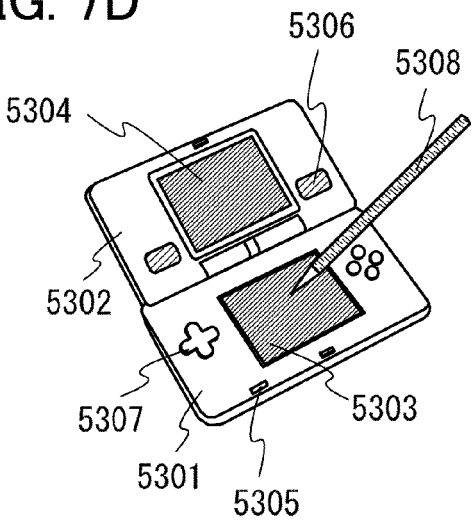

FIG. 7D illustrates a portable game machine that includes a housing 5301, a housing 5302, a display portion 5303, a display portion 5304, a microphone 5305, a speaker 5306, an operation key 5307, a stylus 5308, and the like. The semiconductor device according to one embodiment of the present invention can be used for the display portion 5303 or the display portion 5304. By using the semiconductor device according to one embodiment of the present invention for the display portion 5303 or the display portion 5304, high-contrast image data can be obtained. Although the portable game machine in FIG. 7D has the two display portions 5303 and 5304, the number of display portions included in the portable game machine is not limited to two.

Figure 7E:
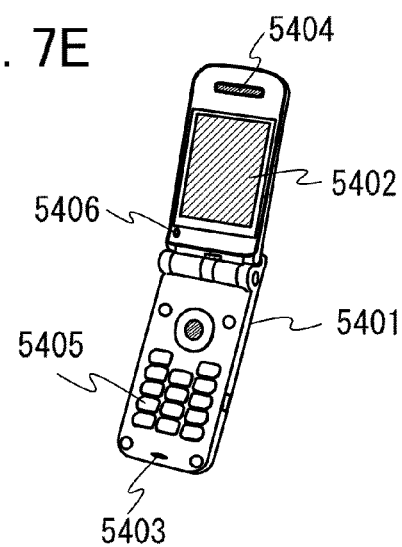

FIG. 7E illustrates a mobile phone that includes a housing 5401, a display portion 5402, an audio input portion 5403, an audio output portion 5404, operation keys 5405, a light-receiving portion 5406, and the like. Light received in the light-receiving portion 5406 is converted into electrical signals, whereby external images can be loaded. The semiconductor display device according to one embodiment of the present invention can be used for the display portion 5402. By using the semiconductor device according to one embodiment of the present invention for the display portion 5402, high-contrast image data can be obtained. In addition, the semiconductor device according to one embodiment of the present invention can be used to convert light received by the light-receiving portion 5406 into electrical signals, whereby high-contrast image data can be obtained.

This embodiment can be implemented in combination with any of the other embodiments as appropriate.

Example 1

In this example, the results of calculating the operation of a photosensor driven by the driving method according to one embodiment of the present invention will be described with reference to FIG. 8, FIGS. 9A and 9B, and FIG. 10.

Figure 8:
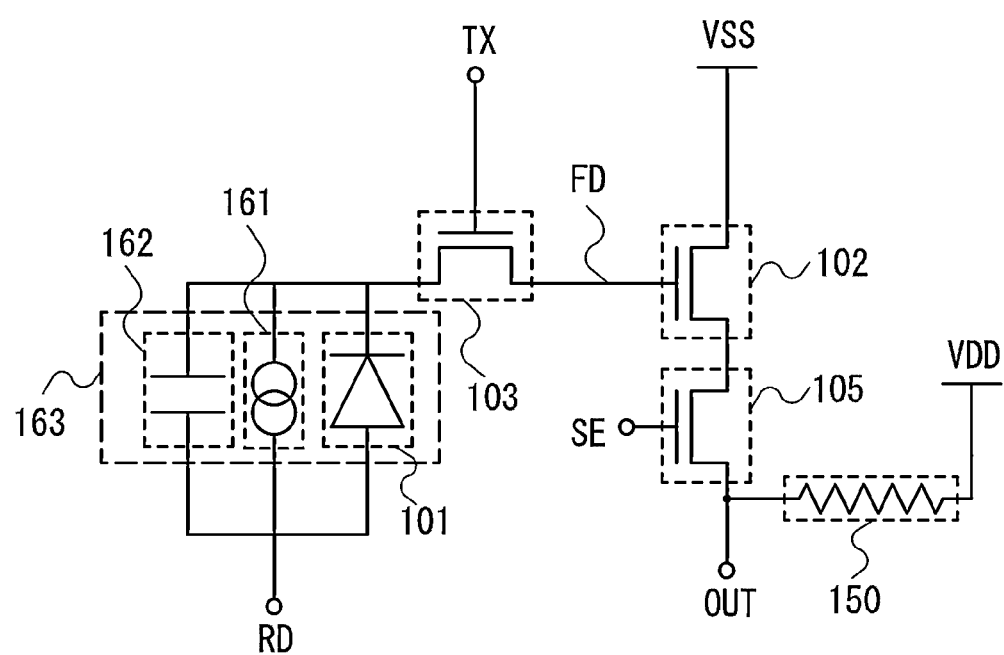
FIG. 8 is a circuit diagram of a photosensor in Example 1.

FIG. 8 illustrates the circuit configuration of a photosensor used in this example. In FIG. 8, a PIN photodiode 163 generates a current corresponding to light entering the i-layer. An equivalent circuit of the PIN photodiode 163 is constituted by a constant current source 161, a capacitor 162, and the photodiode 101. The transistor 102 which is an amplifier element converts a voltage of the charge retention node FD into a current corresponding to the potential of the charge retention node FD. The transistor 103 which is a switching element controls accumulation of charge in the charge retention node FD by the PIN photodiode 163. The transistor 105 controls an output of the photosensor. The charge retention node FD holds charge that varies depending on the amount of light received by the PIN photodiode 163. The wiring TX is a signal line for controlling the transistor 103. The wiring SE is a signal line for controlling the transistor 105. The wiring RD is a signal line for controlling initialization of the potential of the charge retention node FD. The wiring OUT is an output wiring for outputting a signal corresponding to charge accumulation in the PIN photodiode 163. A wiring VSS and a wiring VDD are power supply wirings. A resistor 150 is a pull-down resistor.

A method for driving the photosensor in this example is the same as that for the photosensor 100; therefore, the description is not repeated here. For the operation of the photosensor in this example, the timing chart in FIG. 2 can be referred to.

In the calculation, the potential of the charge retention node FD at a fall time $TX_{H\text{-}L}$, which is the time it takes to switch the potential of the wiring TX from the potential HTX to the potential LTX at the time T4 in FIG. 2, was evaluated.

For the calculation, the circuit simulator SPICE (Simulation Program with Integrated Circuit Emphasis) was used.

Specifically, the potential of the charge retention node FD in the operation of the photosensor to which each of the following fall times $TX_{H\text{-}L}$ is applied in the cases where the current $I_{diode}$ of the constant current source 161 is 0.10 nanoamperes (nA), 0.30 nA, and 0.34 nA was obtained. Note that the value of $I_{diode}$ corresponds to the intensity of light entering the photodiode 101.

As the fall times $TX_{H\text{-}L}$, the following 21 values were used: 0 nanoseconds (ns) which is a conventional example; 1 ns, 2 ns, 3 ns, 4 ns, 5 ns, 6 ns, 7 ns, 8 ns, 9 ns, 10 ns, 20 ns, 30 ns, 40 ns, 50 ns, 60 ns, 70 ns, 80 ns, 90 ns, and 100 ns which are examples to which one embodiment of the present invention is applied; and 200 ns which is a comparative example.

Other calculation conditions are as follows. The capacitance of the capacitor 162 was 1 femtofarad (fF). The time for performing an accumulation operation (the time between the time T3 and the time T4 in FIG. 2) was 2.8 milliseconds (ms). The transistors 102, 103, and 105 had the same size and the same characteristics.

Figure 9A:
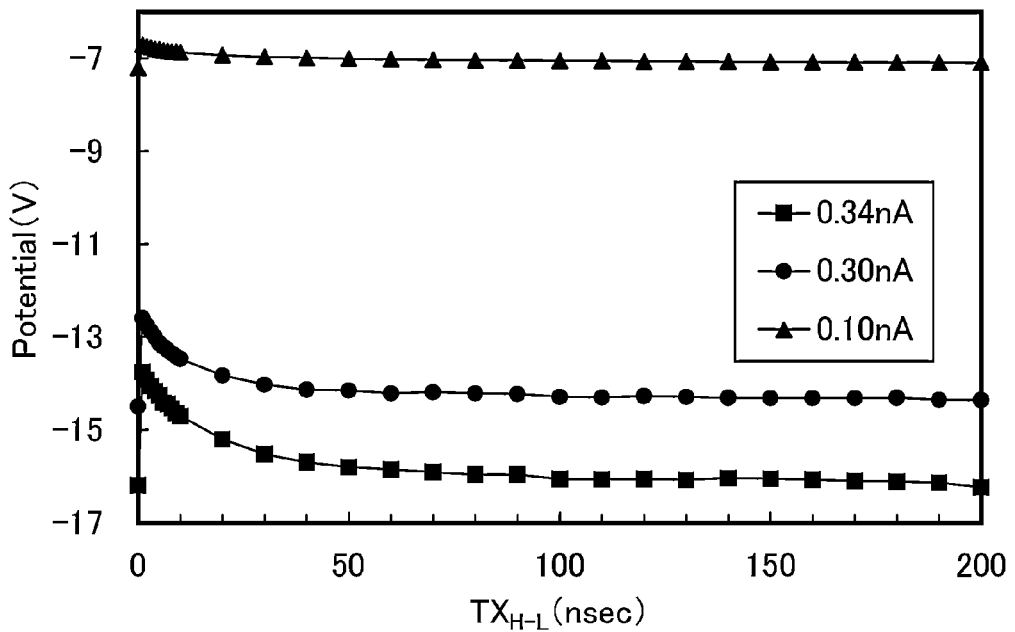
FIGS. 9A and 9B are graphs showing calculation results in Example 1.
Figure 9B:
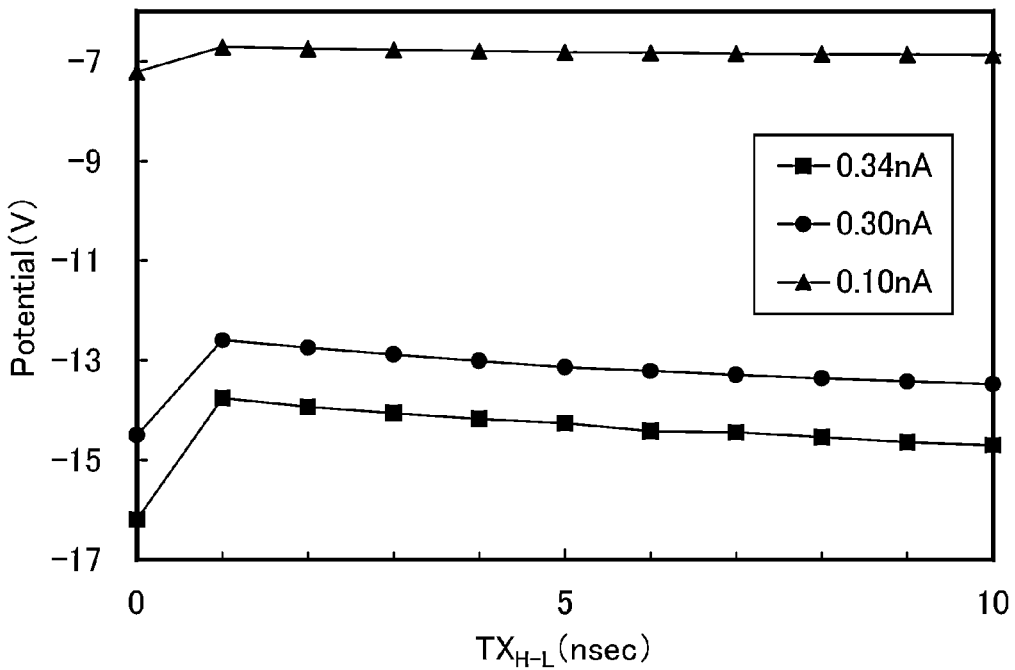

FIGS. 9A and 9B show the relation between the fall time $TX_{H\text{-}L}$ of the wiring TX and the potential of the charge retention node FD. FIG. 9B is an enlarged view of FIG. 9A in the range of the fall time $TX_{H-L}$ from 0 ns to 10 ns. In FIGS. 9A and 9B, the horizontal axis indicates fall time $TX_{H-L}$ (unit: ns) and the vertical axis indicates the potential (unit: V) of the charge retention node FD.

As shown in FIGS. 9A and 9B, the potentials in the examples to which one embodiment of the present invention was applied were higher than the potential in the conventional example ($TX_{H-L}$=0 ns) regardless of the values of $I_{diode}$.

The difference between the potential in the conventional example and the potentials in the examples to which one embodiment of the present invention was applied was larger when the value of $I_{diode}$ was large than when the value of $I_{diode}$ was small. In particular, when $I_{diode}$ was 0.34 nA, the potential in the conventional example ($TX_{H-L}$=0 ns) was −16.2 V, whereas the potential in the example to which one embodiment of the present invention was applied ($TX_{H-L}$=1 ns) was −13.8 V. In other words, it has been suggested that clock feedthrough can be suppressed by applying one embodiment of the present invention particularly when the intensity of light entering the photodiode 101 is high.

When $I_{diode}$ was 0.34 nA, the potential in the comparative example ($TX_{H-L}$=200 ns) was lower than that in the conventional example.

These results show that a change in the potential of the charge retention node FD (clock feedthrough) due to parasitic capacitance of the transistor 103 used in this example can be suppressed when the fall time $TX_{H-L}$ of the wiring TX is longer than 0 ns and shorter than 200 ns.

In addition, it has been suggested that the fall of a pulse signal of the wiring TX is too gentle when $TX_{H-L}$ is equal to or longer than 200 ns, and thus clock feedthrough occurs.

Figure 10:
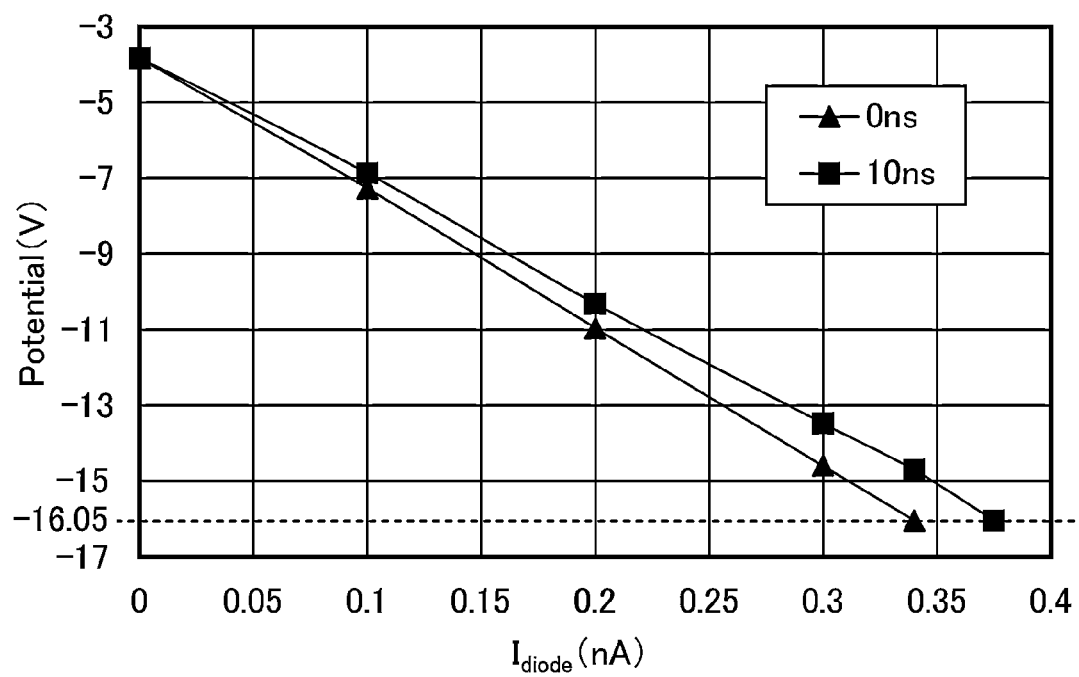
FIG. 10 is a graph showing calculation results in Example 1.

FIG. 10 shows the relation between the amount of current $I_{diode}$ of the constant current source 161 and the potential of the charge retention node FD. In FIG. 10, the vertical axis indicates the potential (unit: V) of the charge retention node FD and the horizontal axis indicates $I_{diode}$ (unit: nA). The potential at which all charge leaks from the charge retention node FD is −16.05 V in FIG. 10.

In FIG. 10, the potential with $TX_{H-L}$=0 ns, which is the conventional example, reached −16.05 V when $I_{diode}$ was 0.34 nA. On the other hand, the potential with $TX_{H-L}$=10 ns, which is the example to which one embodiment of the present invention was applied, reached −16.05 V when $I_{diode}$ was 0.38 nA.

In other words, the conventional photosensor can output signals corresponding to potentials that correspond to the intensity of light with $I_{diode}$ in the range of 0 to 0.34 nA. In addition, the photosensor to which one embodiment of the present invention is applied can output signals corresponding to potentials that correspond to a wider range of light intensity, that is, the intensity of light with $I_{diode}$ in the range of 0 to 0.38 nA.

These results suggest that the photosensor to which one embodiment of the present invention is applied can obtain data of a higher contrast image than the conventional photosensor.

Example 2

In this example, the operation of a solid-state imaging device which is a semiconductor device according to one embodiment of the present invention will be described with reference to FIGS. 11A and 11B, FIGS. 12A and 12B, and FIGS. 13A and 13B.

This example explains two solid-state imaging devices: a structural example to which one embodiment of the present invention is applied, and a comparative example to which the present invention is not applied. The configurations of photosensors included in the solid-state imaging devices used in this example are described.

Figure 13A:
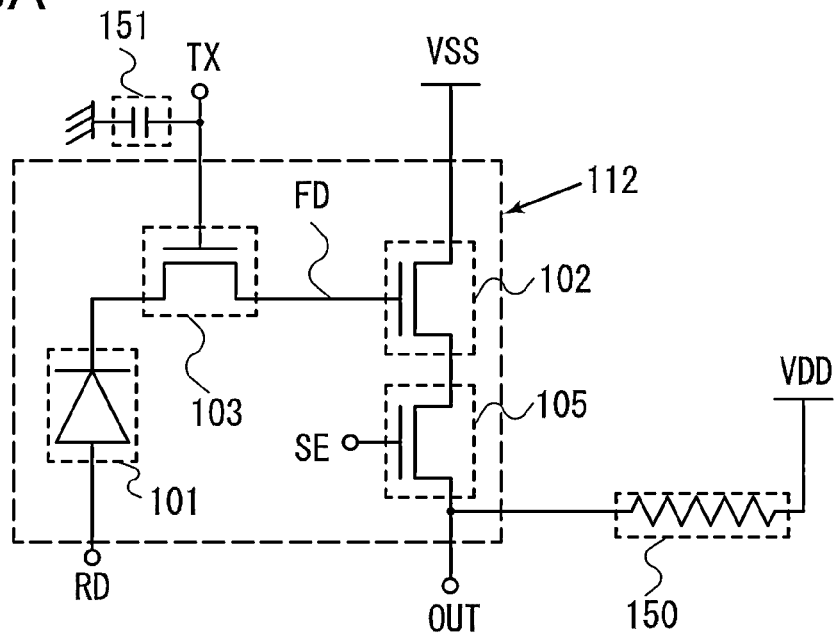
FIGS. 13A and 13B are each a circuit diagram of a photosensor in Example 2.

The photosensor included in the solid-state imaging device of the structural example is a photosensor 112 illustrated in FIG. 13A.

In the photosensor 112, the photodiode 101 generates a current corresponding to light entering the i-layer. The transistor 102 which is an amplifier element converts a voltage of the charge retention node FD into a current corresponding to the potential of the charge retention node FD. The transistor 103 which is a switching element controls accumulation of charge in the charge retention node FD by the photodiode 101. The transistor 105 controls an output of the photosensor. The charge retention node FD holds charge that varies depending on the amount of light received by the photodiode 101.

In FIG. 13A, the wiring TX is a signal line for controlling the transistor 103. The wiring SE is a signal line for controlling the transistor 105. The wiring RD is a signal line for controlling initialization of the potential of the charge retention node FD. The wiring OUT is an output wiring for outputting a signal corresponding to charge accumulation in the photodiode 101. The wiring VSS and the wiring VDD are power supply wirings. The resistor 150 is a pull-down resistor. A capacitor 151 is electrically connected to the wiring TX.

Figure 13B:
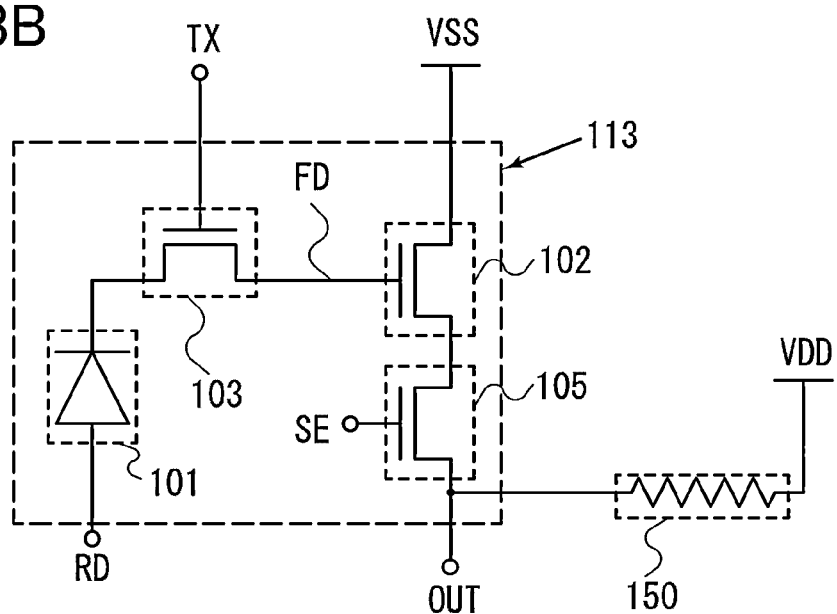

The photosensor included in the comparative solid-state imaging device is a photosensor 113 illustrated in FIG. 13B. The photosensor 113 has the same configuration as the photosensor 112 except that the capacitor 151 is not provided.

The operation of the photosensors included in the solid-state imaging devices used in this example will be described. For the operation of the photosensors in this example, the timing chart in FIG. 2 can be referred to. In this example, the potentials of the wiring TX were set such that the potential HTX was 3 V and the potential LTX was −16 V.

Figure 11A:
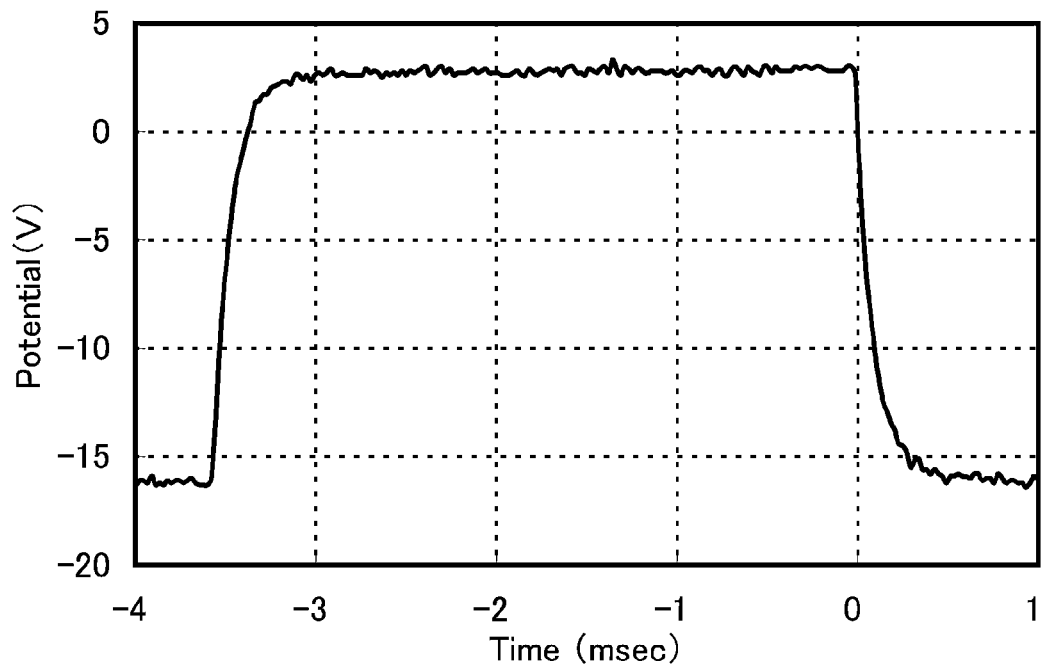
FIGS. 11A and 11B each illustrate a waveform of an input to a wiring TX in a photosensor in Example 2.

FIG. 11A shows a waveform of an input to the wiring TX in the structural example. Note that 0 milliseconds (ms) shown in FIG. 11A corresponds to the time T4 in FIG. 2. Specifically, the capacitor 151 with a capacitance of 1 µF (microfarad) was used so that the level of a pulse changes from the potential HTX to the potential LTX more gently than in the comparative example.

Figure 11B:
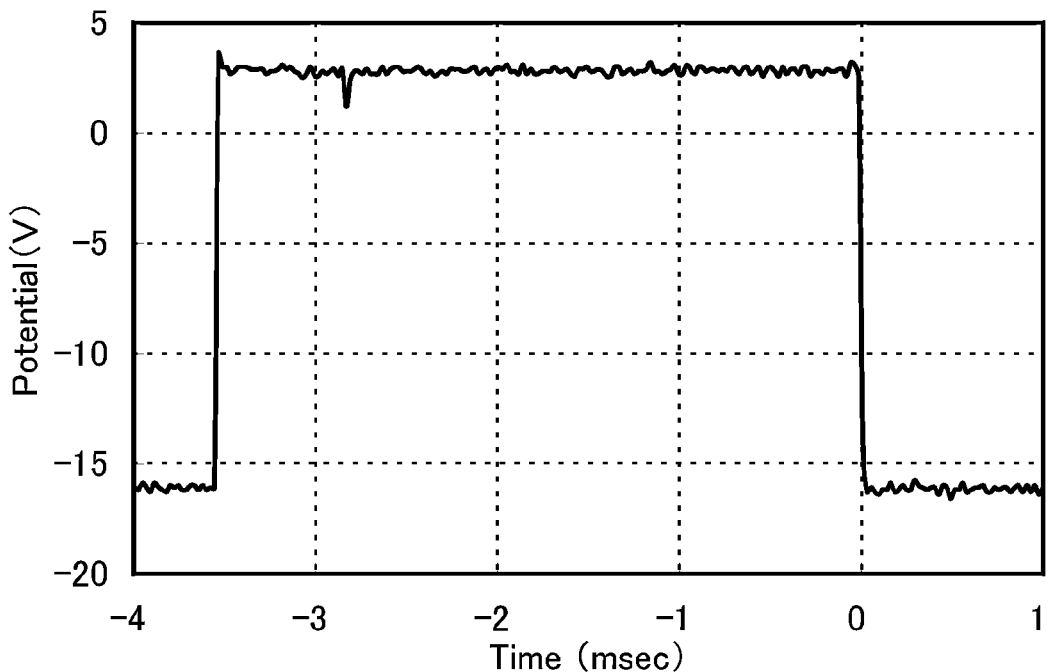

FIG. 11B shows a waveform of an input to the wiring TX in the comparative example. Note that 0 ms shown in FIG. 11B corresponds to the time T4 in FIG. 2. Specifically, the level of a pulse changes from the potential HTX to the potential LTX at the time of 0 ms.

In FIGS. 11A and 11B, the vertical axis indicates the potential (unit: V) of the wiring TX and the horizontal axis indicates time (unit: ms).

Next, the configuration of a photosensor reading circuit will be described with reference to FIG. 14. A display portion in the solid-state imaging device in this example includes pixels of 1024 rows and 768 columns. One display element is provided in every pixel in each row and each column. One photosensor is provided in every four pixels in two rows and two columns. That is, the display elements are provided in 1024 rows and 768 columns, and the photosensors are provided in 512 rows and 384 columns. In addition, photosensor output signal lines of two columns are regarded as one pair. In other words, one output is obtained from two photosensors provided between eight pixels in two rows and four columns and is output to the outside of the display device.

Figure 14:
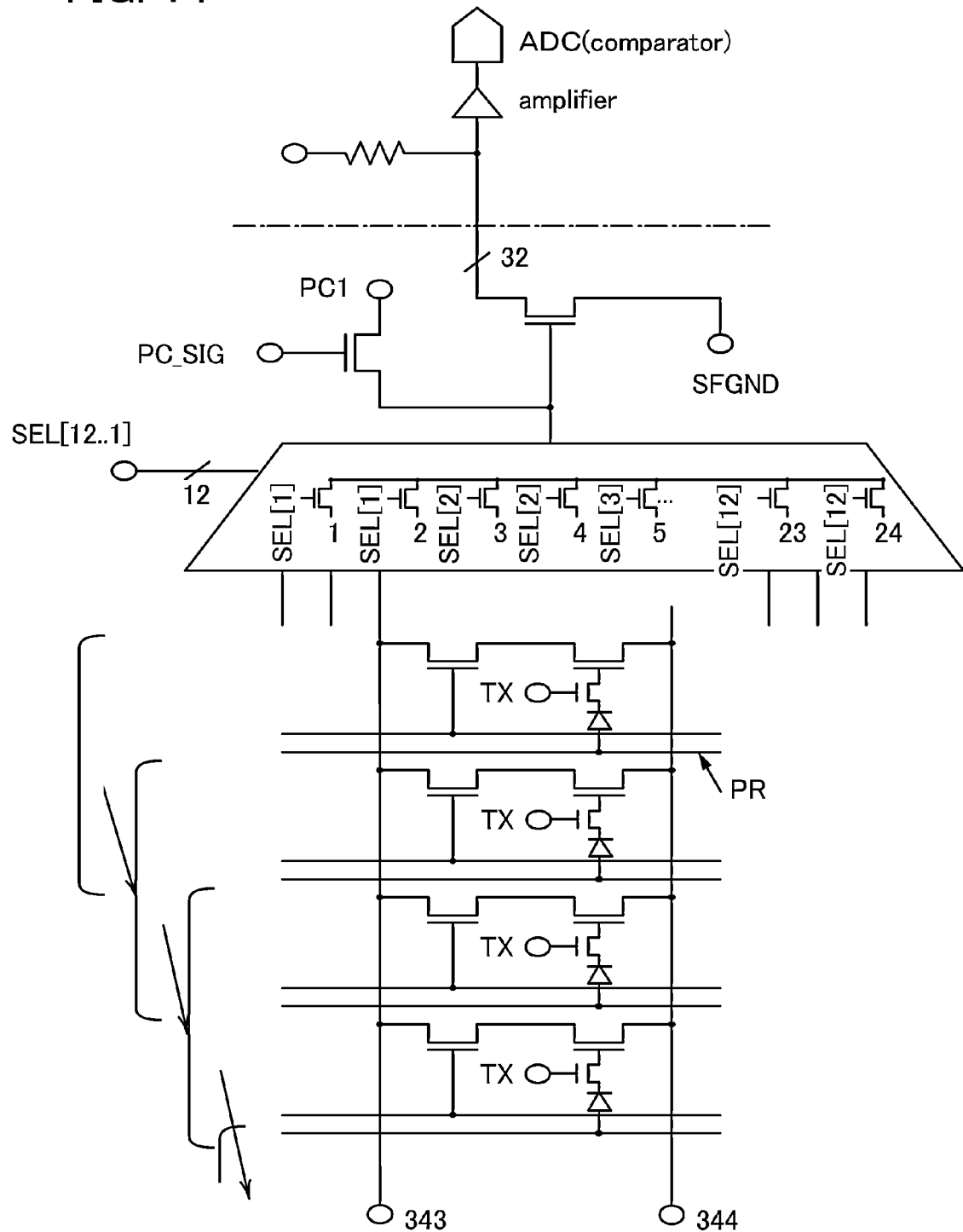
FIG. 14 shows a photosensor reading circuit in Example 2.

A scan line driver circuit for the photosensors illustrated in FIG. 14 simultaneously drives pixels in four rows (i.e., photosensors in two rows) and sequentially shifts selected rows of photosensors by one row, which corresponds to two rows of pixels. Here, photosensors in each row are continually selected in a period during which the scan line driver circuit shifts selected rows twice. Note that outputs of photosensors in two rows are superimposed in a photosensor output signal line 343 at one time. All the photosensors can be driven by repeating a shift of selected rows 512 times.

As illustrated in FIG. 14, the photosensor reading circuit includes one selector per 24 columns of pixels. The selector selects one pair from 12 pairs of photosensor output signal lines 343 (one pair corresponds to the photosensor output signal lines 343 of two columns) in the display portion and obtains an output. That is, the photosensor reading circuit includes 32 selectors in total and thus obtains 32 outputs at one time. Selection is performed on all the 12 pairs by each of the selectors, whereby a total of 384 outputs which correspond to photosensors in one row can be obtained. The selector selects one pair from the 12 pairs every time selected rows are shifted by the scan line driver circuit for the photosensors, so that outputs from all of the photosensors can be obtained.

In this example, as illustrated in FIG. 14, an output of the photosensor, which is an analog signal, is extracted to the outside of the display device, amplified by an amplifier provided outside the display device, and converted into a digital signal with an AD converter.

Figure 12A:
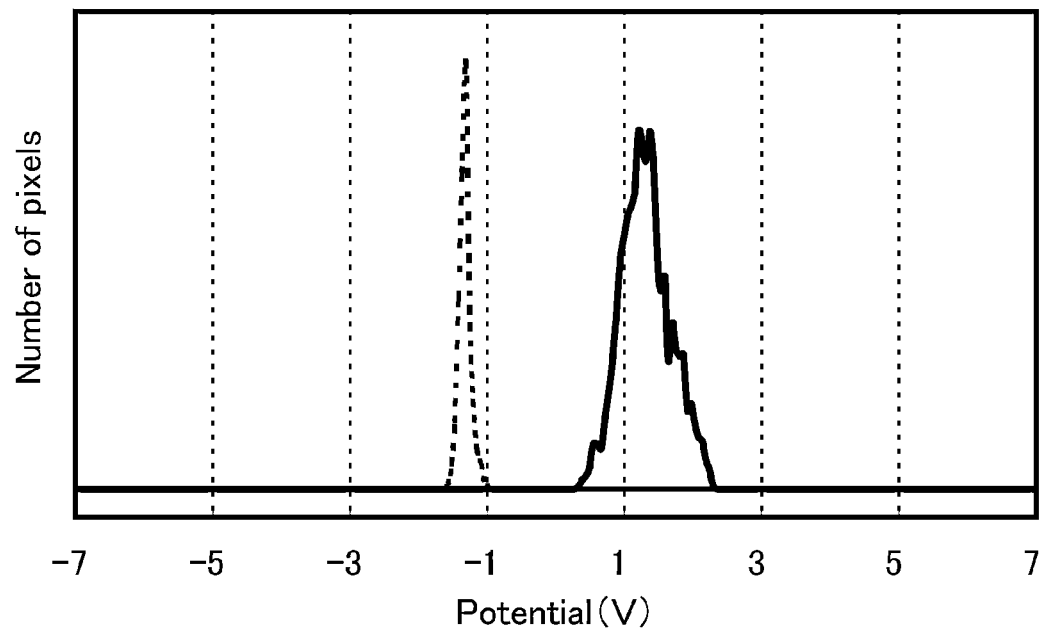
FIGS. 12A and 12B are histograms showing experiment results in Example 2.
Figure 12B:
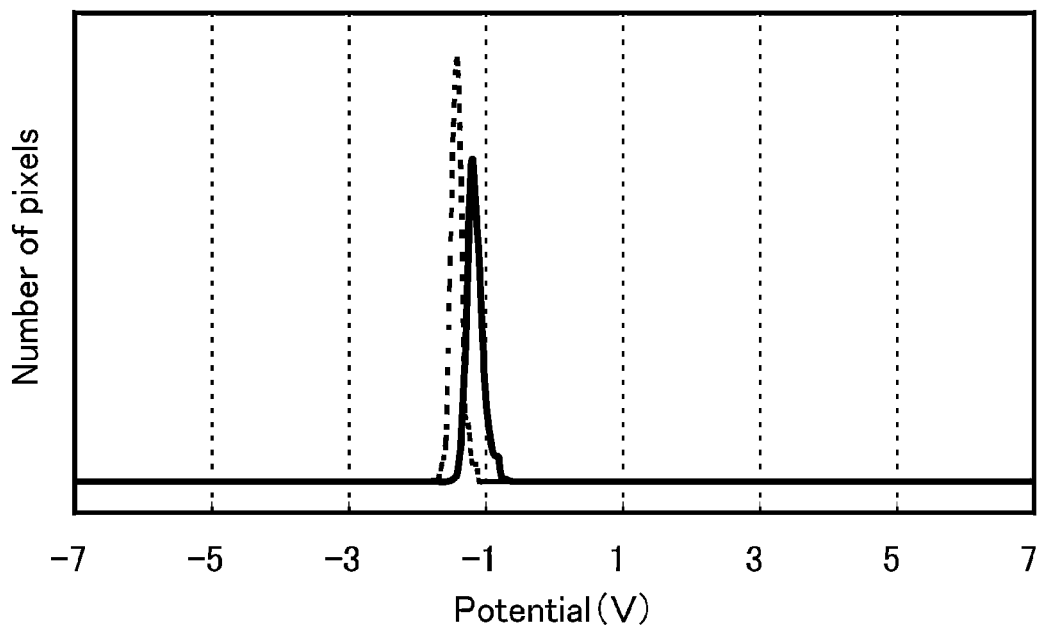

FIGS. 12A and 12B are histograms each showing the results of capturing images of a black object and a white object with the solid-state imaging devices in this example. In FIGS. 12A and 12B, the vertical axis indicates the number of pixels (no unit) and the horizontal axis indicates the output voltage (unit: V) of the AD converter.

Figure 15A:
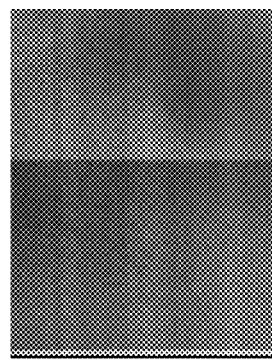
FIGS. 15A to 15D show experiment results in Example 2.
Figure 15B:
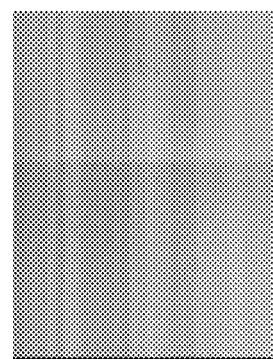
Figure 15C:
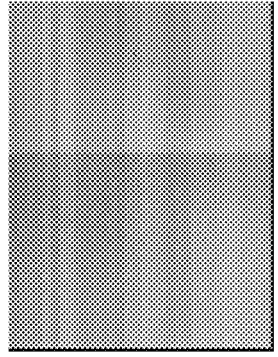
Figure 15D:
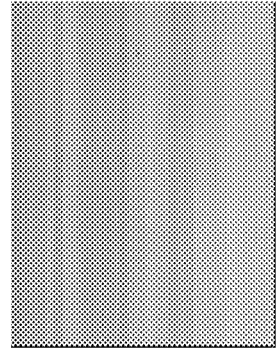

In FIG. 12B, the result of capturing an image of the black object with the comparative solid-state imaging device is shown by a solid line, and the result of capturing an image of the white object is shown by a dashed line. FIGS. 15C and 15D show the actually obtained images of the black object and the white object, respectively. As seen from FIG. 12B and FIGS. 15C and 15D, the contrast between black and white is very low.

In FIG. 12A, the result of capturing an image of the black object with the solid-state imaging device of the structural example is shown by a solid line, and the result of capturing an image of the white object is shown by a dashed line. FIGS. 15A and 15B show the actually obtained images of the black object and the white object, respectively. As seen from FIG. 12A and FIGS. 15A and 15B, the contrast between black and white is higher than that in the comparative device.

These results suggest that when the capacitor electrically connected to the wiring TX is provided in the solid-state imaging device and a pulse whose level changes from the potential HTX to the potential LTX gently by using the capacitor is input as the potential of the wiring TX, a change in the potential of the charge retention node FD (clock feedthrough) due to parasitic capacitance of the transistor 103 can be suppressed.

As has been described, by applying one embodiment of the present invention, a semiconductor device that includes the photosensor, is small in size, and can obtain high-contrast image data can be provided.

Example 3

In this example, an example of a transistor in which an In—Sn—Zn—O film is used as an oxide semiconductor film will be described with reference to FIGS. 31A and 31B.

Figure 31A:
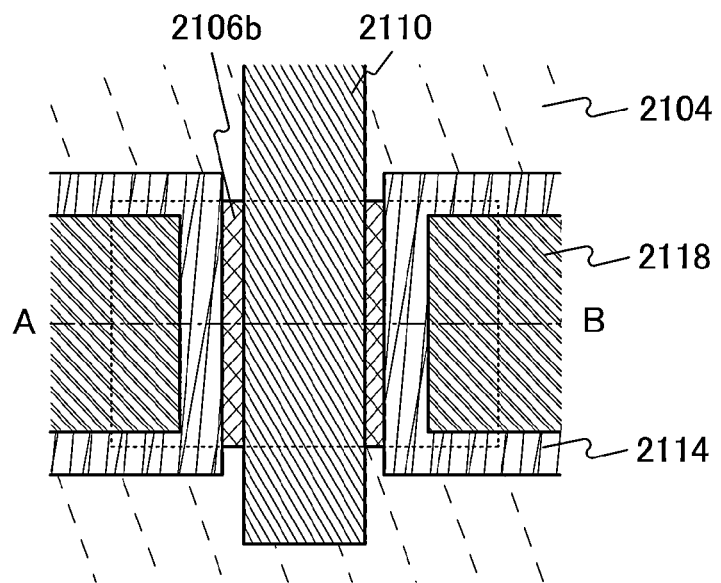
FIGS. 31A and 31B illustrate a structure of a transistor.
Figure 31B:
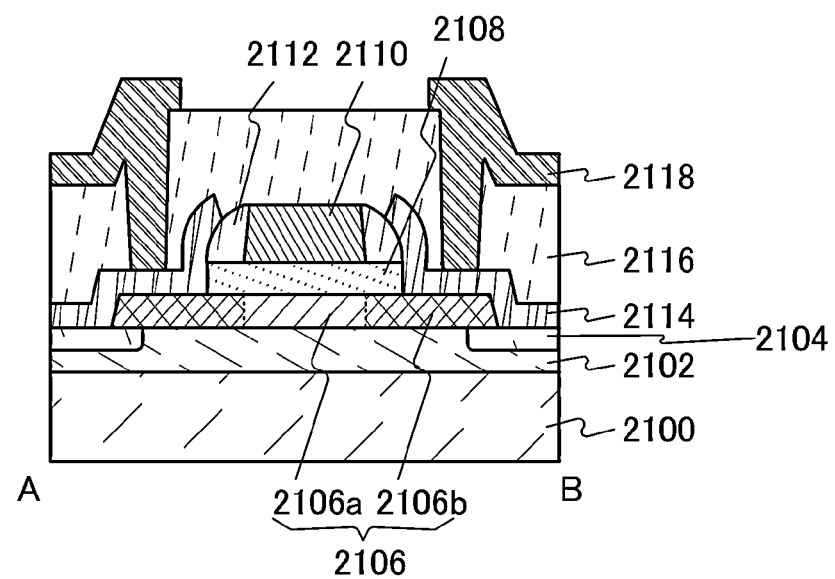

FIGS. 31A and 31B are a top view and a cross-sectional view of a coplanar transistor having a top-gate top-contact structure. FIG. 31A is the top view of the transistor. FIG. 31B illustrates cross section A-B along dashed-dotted line A-B in FIG. 31A.

The transistor illustrated in FIG. 31B includes a substrate 2100; a base insulating layer 2102 provided over the substrate 2100; a protective insulating film 2104 provided in the periphery of the base insulating layer 2102; an oxide semiconductor film 2106 that is provided over the base insulating layer 2102 and the protective insulating film 2104 and includes a high-resistance region 2106a and low-resistance regions 2106b; a gate insulating layer 2108 provided over the oxide semiconductor film 2106; a gate electrode 2110 provided to overlap with the oxide semiconductor film 2106 with the gate insulating layer 2108 positioned therebetween; a sidewall insulating film 2112 provided in contact with a side surface of the gate electrode 2110; a pair of electrodes 2114 provided in contact with at least the low-resistance regions 2106b; an interlayer insulating film 2116 provided to cover at least the oxide semiconductor film 2106, the gate electrode 2110, and the pair of electrodes 2114; and a wiring 2118 provided to be connected to at least one of the pair of electrodes 2114 through an opening formed in the interlayer insulating film 2116.

Although not illustrated, a protective film may be provided to cover the interlayer insulating film 2116 and the wiring 2118. With the protective film, a minute amount of leakage current generated by surface conduction of the interlayer insulating film 2116 can be reduced, so that the off-state current of the transistor can be reduced.

This example can be implemented in appropriate combination with any of the structures described in the other embodiments and examples.

Example 4

In this example, another example of a transistor in which an In—Sn—Zn—O film is used as an oxide semiconductor film, which is different from the transistor in Example 3, will be described with reference to FIGS. 32A and 32B.

Figure 32A:
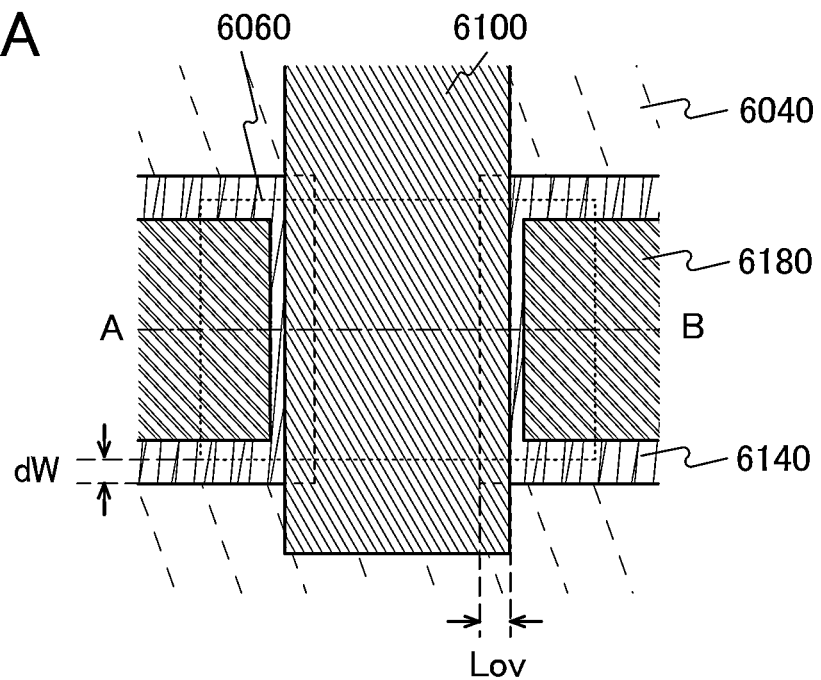
FIGS. 32A and 32B illustrate a structure of a transistor.
Figure 32B:
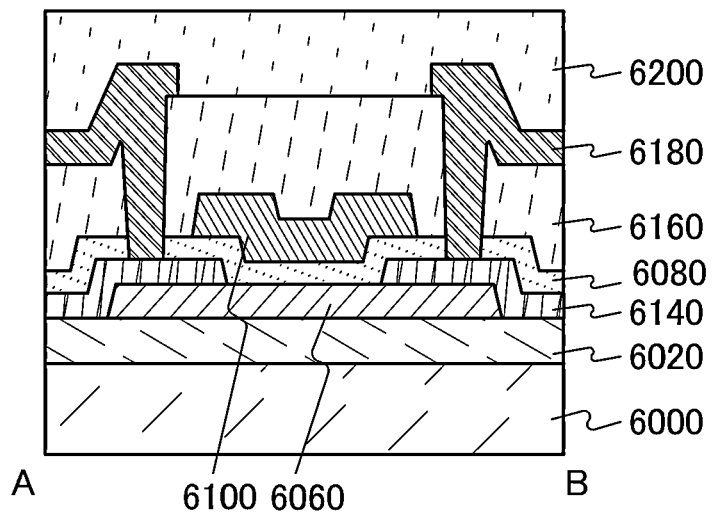

FIGS. 32A and 32B are a top view and a cross-sectional view illustrating a structure of a transistor. FIG. 32A is the top view of the transistor. FIG. 32B is a cross-sectional view along dashed-dotted line A-B in FIG. 32A.

The transistor illustrated in FIG. 32B includes a substrate 6000; a base insulating layer 6020 provided over the substrate 6000; an oxide semiconductor film 6060 provided over the base insulating layer 6020; a pair of electrodes 6140 in contact with the oxide semiconductor film 6060; a gate insulating layer 6080 provided over the oxide semiconductor film 6060 and the pair of electrodes 6140; a gate electrode 6100 provided to overlap with the oxide semiconductor film 6060 with the gate insulating layer 6080 positioned therebetween; an interlayer insulating film 6160 provided to cover the gate insulating layer 6080 and the gate electrode 6100; wirings 6180 connected to the pair of electrodes 6140 through openings formed in the interlayer insulating film 6160; and a protective film 6200 provided to cover the interlayer insulating film 6160 and the wirings 6180.

As the substrate 6000, a glass substrate was used. As the base insulating layer 6020, a silicon oxide film was used. As the oxide semiconductor film 6060, an In—Sn—Zn—O film was used. As the pair of electrodes 6140, a tungsten film was used. As the gate insulating layer 6080, a silicon oxide film was used. The gate electrode 6100 had a stacked structure of a tantalum nitride film and a tungsten film. The interlayer insulating film 6160 had a stacked structure of a silicon oxynitride film and a polyimide film. The wirings 6180 had a stacked structure in which a titanium film, an aluminum film, and a titanium film were formed in this order. As the protective film 6200, a polyimide film was used.

Note that in the transistor having the structure illustrated in FIG. 32A, the width of a portion where the gate electrode 6100 overlaps with one of the pair of electrodes 6140 is referred to as Lov. Similarly, the width of a portion of the pair of electrodes 6140, which does not overlap with the oxide semiconductor film 6060, is referred to as dW.

This example can be implemented in appropriate combination with any of the structures described in the other embodiments and examples.

EXPLANATION OF REFERENCES

100: photosensor, 101: photodiode, 102: transistor, 103: transistor, 105: transistor, 107: transistor, 110: photosensor, 111: photosensor, 112: photosensor, 113: photosensor, 150: resistor, 151: capacitor, 161: constant current source, 162: capacitor, 163: PIN photodiode, 343: output signal line, 601: gate electrode layer, 602: gate insulating layer, 603: oxide semiconductor layer, 605a: source electrode layer, 605b: drain electrode layer, 607: insulating layer, 620: transistor, 627: channel protective layer, 630: transistor, 636a: source wiring layer, 636b: drain wiring layer, 637: base insulating layer, 640: transistor, 650: transistor, 700: substrate, 701: insulating film, 702: semiconductor film, 703: semiconductor film, 704: photodiode, 705: transistor, 707: gate electrode, 708: insulating film, 711: wiring, 712: insulating film, 713: gate electrode, 714: gate insulating layer, 715: oxide semiconductor layer, 716: conductive film, 717: conductive film, 718: conductive film, 719: conductive film, 720: conductive film, 721: conductive film, 722: insulating film, 724: transistor, 727: region, 728: region, 729: region, 1010: base insulating layer, 1030a: semiconductor region, 1030b: semiconductor region, 1030c: semiconductor region, 1040: gate insulating layer, 2100: substrate, 2102: base insulating layer, 2104: protective insulating film, 2106: oxide semiconductor film, 2106a: high-resistance region, 2106b: low-resistance region, 2108: gate insulating layer, 2110: gate electrode, 2112: sidewall insulating film, 2114: electrode, 2116: interlayer insulating film, 2118: wiring, 5001: housing, 5002: display portion, 5003: supporting base, 5101: housing, 5102: display portion, 5103: operation key, 5201: housing, 5202: display portion, 5203: coin slot, 5204: paper money slot, 5205: card slot, 5206: passbook slot, 5301: housing, 5302: housing, 5303: display portion, 5304: display portion, 5305: microphone, 5306: speaker, 5307: operation key, 5308: stylus, 5401: housing, 5402: display portion, 5403: audio input portion, 5404: audio output portion, 5405: operation key, 5406: light-receiving portion, 6000: substrate, 6020: base insulating layer, 6060: oxide semiconductor film, 6080: gate insulating layer, 6100: gate electrode, 6140: electrode, 6160: interlayer insulating film, 6180: wiring, 6200: protective film This application is based on Japanese Patent Application serial No. 2010-267422 and No. 2011-108164 filed with Japan Patent Office on Nov. 30, 2010 and May 13, 2011, respectively, the entire contents of which are hereby incorporated by reference.

The invention claimed is:

1. A method for driving a semiconductor device, the semiconductor device comprising:
    a photosensor comprising:
        a light-receiving element;
        a first transistor serving as a switching element; and
        a second transistor,
    wherein one of a source and a drain of the first transistor is electrically connected to one electrode of the light-receiving element,
    wherein the other of the source and the drain of the first transistor is electrically connected to a gate of the second transistor,
    the method comprising the steps of:
    turning on the first transistor at a time t1,
    switching a potential of the other electrode of the light-receiving element from a first potential to a second potential that is higher than the first potential at a time t2 that is later than the time t1,
    switching a potential of the other electrode of the light-receiving element from the second potential to a third potential that is lower than the second potential at a time t3 that is later than the time t2, and
    turning off the first transistor during a fall time of an input waveform of a driving pulse supplied to the first transistor to turn off the first transistor wherein the fall time is later than the time t3,
    wherein the fall time of the input waveform of the driving pulse supplied to the first transistor to turn off the first transistor is longer than or equal to 1 ns and shorter than 200 ns.

2. The method for driving a semiconductor device according to claim 1, wherein a level of the first potential and a level of the third potential are the same.

3. The method for driving a semiconductor device according to claim 1,
    wherein the semiconductor device further comprises a third transistor,
    wherein one of a source and a drain of the second transistor is electrically connected to one of a source and a drain of the third transistor, and
    wherein the method further comprises the steps of:
    turning on the third transistor at a time t4 that is later than the fall time, and
    turning off the third transistor at a time t5 that is later than the time t4.

4. The method for driving a semiconductor device according to claim 1, wherein a size of the first transistor is substantially the same as a size of the second transistor.

5. The method for driving a semiconductor device according to claim 1,
    wherein the light-receiving element comprises a first semiconductor over a substrate,
    wherein the first transistor is over the substrate,
    wherein the second transistor is over the substrate,
    wherein the photosensor comprises a charge retention node electrically connected to the light-receiving element through the first transistor,
    wherein the semiconductor device comprises a capacitor,
    wherein a gate of the first transistor is electrically connected to one electrode of the capacitor without being intervened by a switching element, and wherein the other electrode of the capacitor is electrically connected to a ground terminal without being intervened by a switching element.

6. The method for driving a semiconductor device, according to claim 5, wherein the first semiconductor comprises silicon.

7. A method for driving a semiconductor device, the semiconductor device comprising:
a photosensor comprising:
a light-receiving element comprising a first semiconductor over a substrate;
a first transistor serving as a switching element over the substrate;
a second transistor over the substrate; and
a charge retention node electrically connected to the light-receiving element through the first transistor; and
a capacitor,
wherein one of a source and a drain of the first transistor is electrically connected to one electrode of the light-receiving element,
wherein the other of the source and the drain of the first transistor is electrically connected to a gate of the second transistor,
wherein a gate of the first transistor is electrically connected to one electrode of the capacitor without being intervened by a switching element,
wherein the other electrode of the capacitor is electrically connected to a ground terminal without being intervened by a switching element,
the method comprising the steps of:
turning on the first transistor at a time t1,
switching a potential of the other electrode of the light-receiving element from a first potential to a second potential that is higher than the first potential at a time t2 that is later than the time t1,
switching a potential of the other electrode of the light-receiving element from the second potential to a third potential that is lower than the second potential at a time t3 that is later than the time t2, and
turning off the first transistor during a fall time of an input waveform of a driving pulse supplied to the first transistor to turn off the first transistor wherein the fall time is later than the time t3,
wherein the fall time of the input waveform of the driving pulse supplied to the first transistor to turn off the first transistor is longer than or equal to 1 ns and shorter than 200 ns,
wherein a channel formation region of the first transistor comprises a second semiconductor comprising an oxide semiconductor, and
wherein a carrier concentration of the oxide semiconductor is lower than $1\times10^{12}/cm^3$.

8. The method for driving a semiconductor device according to claim 7, wherein a level of the first potential and a level of the third potential are the same.

9. The method for driving a semiconductor device according to claim 7,
wherein the semiconductor device further comprises a third transistor,
wherein one of a source and a drain of the second transistor is electrically connected to one of a source and a drain of the third transistor, and
wherein the method further comprises the steps of:
turning on the third transistor at a time t4 that is later than the fall time, and
turning off the third transistor at a time t5 that is later than the time t4.

10. The method for driving a semiconductor device according to claim 7, wherein a size of the first transistor is substantially the same as a size of the second transistor.

11. The method for driving a semiconductor device, according to claim 7, wherein the first semiconductor comprises silicon.

12. A method for driving a semiconductor device, the semiconductor device comprising:
a photosensor comprising:
a light-receiving element;
a first transistor serving as a switching element;
a second transistor; and
a third transistor,
wherein one of a source and a drain of the first transistor is electrically connected to one electrode of the light-receiving element,
wherein the other of the source and the drain of the first transistor is electrically connected to a gate of the second transistor,
wherein one of a source and a drain of the third transistor is electrically connected to the gate of the second transistor,
the method comprising the steps of:
turning on the first transistor at a time t1,
turning on the third transistor at a time t2 that is later than the time t1,
turning off the third transistor at a time t3 that is later than the time t2, and
turning off the first transistor during a fall time of an input waveform of a driving pulse supplied to the first transistor to turn off the first transistor wherein the fall time is later than the time t3,
wherein the fall time of the input waveform of the driving pulse supplied to the first transistor to turn off the first transistor is longer than or equal to 1 ns and shorter than 200 ns.

13. The method for driving a semiconductor device according to claim 12,
wherein the semiconductor device further comprises a fourth transistor,
wherein one of a source and a drain of the second transistor is electrically connected to one of a source and a drain of the fourth transistor, and
wherein the method further comprises the steps of:
turning on the fourth transistor at a time t4 that is later than the fall time, and
turning off the fourth transistor at a time t5 that is later than the time t4.

14. The method for driving a semiconductor device according to claim 12, wherein a size of the first transistor is substantially the same as a size of the second transistor.

15. The method for driving a semiconductor device, according to claim 12,
wherein a channel formation region of the first transistor comprises a second semiconductor comprising an oxide semiconductor, and
wherein a carrier concentration of the oxide semiconductor is lower than $1\times10^{12}/cm^3$.

16. The method for driving a semiconductor device according to claim 12,
wherein the light-receiving element comprises a first semiconductor over a substrate,
wherein the first transistor is over the substrate,
wherein the second transistor is over the substrate,
wherein the third transistor is over the substrate, wherein the photosensor comprises a charge retention node electrically connected to the light-receiving element through the first transistor, wherein the semiconductor device comprises a capacitor, wherein a gate of the first transistor is electrically connected to one electrode of the capacitor without being intervened by a switching element, and wherein the other electrode of the capacitor is electrically connected to a ground terminal without being intervened by a switching element.

17. The method for driving a semiconductor device, according to claim 16, wherein the first semiconductor comprises silicon.

* * * * *